(12) United States Patent
D'Evelyn et al.

(10) Patent No.: US 9,650,723 B1
(45) Date of Patent: May 16, 2017

(54) LARGE AREA SEED CRYSTAL FOR AMMONOTHERMAL CRYSTAL GROWTH AND METHOD OF MAKING

(71) Applicant: SORAA, INC., Fremont, CA (US)

(72) Inventors: Mark P. D'Evelyn, Santa Barbara, CA (US); Wenkan Jiang, Santa Barbara, CA (US); Derrick S. Kamber, Goleta, CA (US); Rajeev T. Pakalapati, Santa Barbara, CA (US); Michael R. Krames, Mountain View, CA (US)

(73) Assignee: Soraa, Inc., Fremont, CA (US)

( * ) Notice: Subject to any disclaimer, the term of this patent is extended or adjusted under 35 U.S.C. 154(b) by 513 days.

(21) Appl. No.: 14/249,708

(22) Filed: Apr. 10, 2014

Related U.S. Application Data

(60) Provisional application No. 61/810,888, filed on Apr. 11, 2013.

(51) Int. Cl.
*C30B 7/10* (2006.01)
*C30B 9/00* (2006.01)
*C30B 29/40* (2006.01)
*C30B 25/02* (2006.01)
*H01L 21/02* (2006.01)

(52) U.S. Cl.
CPC .............. *C30B 7/105* (2013.01); *C30B 7/10* (2013.01); *C30B 9/00* (2013.01); *C30B 25/02* (2013.01); *C30B 29/403* (2013.01); *C30B 29/406* (2013.01); *H01L 21/0254* (2013.01); *H01L 21/02389* (2013.01)

(58) Field of Classification Search
CPC combination set(s) only.
See application file for complete search history.

(56) References Cited

U.S. PATENT DOCUMENTS

| 5,098,673 A | 3/1992 | Engel et al. |
| 5,474,021 A | 12/1995 | Tsuno et al. |
| 6,129,900 A | 10/2000 | Satoh et al. |
| 6,273,948 B1 | 8/2001 | Porowski et al. |

(Continued)

FOREIGN PATENT DOCUMENTS

| JP | 2005-289797 | 10/2005 |
| WO | WO 2004/030061 | 4/2004 |

(Continued)

OTHER PUBLICATIONS

USPTO Office Action for U.S. Appl. No. 12/484,095 dated Aug. 29, 2014 (10 pages).

(Continued)

*Primary Examiner* — Duy Deo
*Assistant Examiner* — Erin Bergner
(74) *Attorney, Agent, or Firm* — Saul Ewing LLP

(57) ABSTRACT

Large area seed crystals for ammonothermal GaN growth are fabricated by deposition or layer transfer of a GaN layer on a CTE-matched handle substrate. The sides and back of the handle substrate are protected from the ammonothermal growth environment by a coating comprising an adhesion layer, a diffusion barrier layer, and an inert layer. A patterned mask, also comprising an adhesion layer, a diffusion barrier layer, and an inert layer, may be provided over the GaN layer to allow for reduction of the dislocation density by lateral epitaxial growth.

20 Claims, 19 Drawing Sheets

(56) References Cited

U.S. PATENT DOCUMENTS

| | | |
|---|---|---|
| 6,398,867 B1 | 6/2002 | D'Evelyn et al. |
| 6,406,540 B1 | 6/2002 | Harris et al. |
| 6,528,427 B2 | 3/2003 | Chebi et al. |
| 6,596,079 B1 | 7/2003 | Vaudo et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,887,144 B2 | 5/2005 | D'Evelyn et al. |
| 7,001,577 B2 | 2/2006 | Zimmerman et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,132,730 B2 | 11/2006 | Dwilinski et al. |
| 7,160,531 B1 | 1/2007 | Jacques et al. |
| 7,170,095 B2 | 1/2007 | Vaudo et al. |
| 7,198,671 B2 | 4/2007 | Ueda |
| 7,252,712 B2 | 8/2007 | Dwilinski et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,625,446 B2 | 12/2009 | D'Evelyn et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,976,630 B2 | 7/2011 | Poblenz et al. |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,278,656 B2 | 10/2012 | Mattmann et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,435,347 B2 | 5/2013 | D'Evelyn et al. |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 2001/0011935 A1 | 8/2001 | Lee et al. |
| 2002/189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0209191 A1 | 11/2003 | Purdy |
| 2003/0232512 A1 | 12/2003 | Dickinson et al. |
| 2004/0023427 A1 | 2/2004 | Chua et al. |
| 2004/0245535 A1 | 12/2004 | D'Evelyn et al. |
| 2005/0098095 A1 | 5/2005 | D'Evelyn et al. |
| 2005/0128469 A1 | 6/2005 | Hall et al. |
| 2005/0152820 A1 | 7/2005 | D'Evelyn et al. |
| 2005/0205215 A1 | 9/2005 | Giddings et al. |
| 2006/0021582 A1 | 2/2006 | Saito et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0255341 A1* | 11/2006 | Pinnington ............ B82Y 20/00 257/79 |
| 2007/0057337 A1 | 3/2007 | Kano et al. |
| 2007/0105351 A1 | 5/2007 | Motoki et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0252164 A1 | 11/2007 | Zhong et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0156254 A1 | 7/2008 | Dwilinski et al. |
| 2008/0193363 A1 | 8/2008 | Tsuji |
| 2008/0272462 A1 | 11/2008 | Shimamoto et al. |
| 2009/0092536 A1 | 4/2009 | Kawabata et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031873 A1 | 2/2010 | D'Evelyn |
| 2010/0031874 A1 | 2/2010 | D'Evelyn |
| 2010/0031875 A1* | 2/2010 | D'Evelyn ............... B01J 3/008 117/71 |
| 2010/0075175 A1* | 3/2010 | Poblenz ................. C30B 7/105 428/697 |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0189981 A1* | 7/2010 | Poblenz ................. C30B 23/025 428/220 |
| 2011/0062415 A1 | 3/2011 | Ohta et al. |
| 2011/0064103 A1 | 3/2011 | Ohta et al. |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1* | 7/2012 | D'Evelyn ............... H01L 29/02 257/76 |
| 2013/0119401 A1 | 5/2013 | D'Evelyn et al. |
| 2013/0251615 A1 | 9/2013 | D'Evelyn et al. |
| 2013/0323490 A1* | 12/2013 | D'Evelyn ............... C30B 7/105 428/220 |

FOREIGN PATENT DOCUMENTS

| | | |
|---|---|---|
| WO | WO 2006/038467 | 4/2006 |
| WO | WO 2007/004495 | 1/2007 |
| WO | WO 2010/068916 | 6/2010 |
| WO | WO 2012/016033 | 2/2012 |

OTHER PUBLICATIONS

USPTO Notice of Allowance for U.S. Appl. No. 13/013,697 dated Aug. 27, 2014 (5 pages).

USPTO Notice of Allowance for U.S. Appl. No. 13/041,199 dated Sep. 9, 2014 (9 pages).

USPTO Office Action for U.S. Appl. No. 13/160,307 dated Jun. 26, 2014 (19 pages).

USPTO Office Action for U.S. Appl. No. 13/894,220 dated Jul. 31, 2014 (9 pages).

Altoukhov et al., 'High reflectivity airgap distributed Bragg reflectors realized by wet etching of AlInN sacrificial layers', Applied Physics Letters, vol. 95, 2009, p. 191102-1-3.

(56) References Cited

OTHER PUBLICATIONS

Callahan et al., 'Synthesis and Growth of Gallium Nitride by the Chemical Vapor Reaction Process (CVRP)', MRS Internet Journal Nitride Semiconductor Research, vol. 4, No. 10, 1999, p. 1-6.

Choi et al., '2.5λ microcavity InGaN light-emitting diodes fabricated by a selective dry-etch thinning process', Applied Physics Letters, 2007, 91(6), 061120.

Copel et al., 'Surfactants in Epitaxial Growth', Physical Review Letters, Aug. 7, 1989, vol. 63, No. 6, p. 632-635.

D'Evelyn et al., 'Bulk GaN Crystal Growth by the High-Pressure Ammonothermal Method', Journal of Crystal Growth, vol. 300, 2007, p. 11-16.

Dorsaz et al., 'Selective oxidation of AlInN Layers for current confinement III-nitride devices', Applied Physics Letters, vol. 87, 2005, p. 072102.

Ehrentraut et al., 'The ammonothermal crystal growth of gallium nitride-A technique on the up rise', Proceedings IEEE, 2010, 98(7), p. 1316-1323.

Fang., 'Deep centers in semi-insulating Fe-doped native GaN substrates grown by hydride vapour phase epitaxy', Physica Status Solidi, vol. 5, No. 6, 2008, p. 1508-1511.

Fujito et al., 'Development of Bulk GaN Crystals and Nonpolar/Semipolar Substrates by HVPE', MRS Bulletin, May 2009, vol. 34, No. 5, p. 313-317.

Fukuda et al., 'Prospects for the Ammonothermal Growth of Large GaN Crystal', Journal of Crystal Growth, vol. 305, 2007, p. 304-310.

Gladkov et al., 'Effect of Fe doping on optical properties of freestanding semi-insulating HVPE GaN:Fe', Journal of Crystal Growth, 312, 2010, p. 1205-1209.

Grzegory, 'High pressure growth of bulk GaN from Solutions in gallium', Journal of Physics Condensed Matter, vol. 13, 2001, p. 6875-6892.

Lide et al., 'Thermal Conductivity of Ceramics and Other Insulating Materials', CRC Handbook of Chemistry and Physics, 91st Edition, 2010-2011, p. 12-203 and 12-204.

Lu et al., 'Structure of the Cl-passivated GaAs(111) surface', Physical Review B, Nov. 15, 1998, vol. 58, No. 20, p. 13820-13823.

Massies et al., 'Surfactant mediated epitaxial growth of InxGa1-xAs on GaAs (001)', Applied Physics Letters, vol. 61, No. 1, Jul. 6, 1992, p. 99-101.

http://www.matbase.com/material/non-ferrous-metals/other/molybdenum/properties, Data Table for: Non-Ferrous Metals: Other Metals: Molybdenum, Mar. 28, 2011, p. 1.

Moutanabbir, 'Bulk GaN Ion Cleaving', Journal of Electronic Materials, vol. 39, 2010, p. 482-488.

Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, p. 103509-1-103509-4.

Pattison et al., 'Gallium Nitride Based Microcavity Light Emitting Diodes With 2λ Effective Cavity Thickness', Applied Physics Letters, vol. 90, Issue 3, 031111, 2007, 3 pages.

International Search Report & Written Opinion of PCT Application No. PCT/US2009/067745, dated Feb. 5, 2010, 9 pages total.

Porowski, 'High Resistivity GaN Single Crystalline Substrates', Acta Physica Polonica A, vol. 92, No. 2, 1997, p. 958-962.

Porowski, 'Near Defect Free GaN Substrates', Journal of Nitride Semiconductor, 1999, p. 1-11.

Roder et al., 'Temperature dependence of the thermal expansion of GaN', Physics Review B, vol. 72., No. 085218, Aug. 24, 2005, p. 085218.

Sarva et al., 'Dynamic Compressive Strength of Silicon Carbide Under Uniaxial Compression', Material Sciences and Engineering, vol. A317, 2001, p. 140-144.

Sharma et al., 'Vertically oriented GaN-based air-gap distributed Bragg reflector structure fabricated using band-gap-selective photoelectrochemical etching', Applied Physics Letters, vol. 87, 2005, p. 051107.

Sumiya et al., 'High-pressure synthesis of high-purity diamond crystal', Diamond and Related Materials, 1996, vol. 5, p. 1359-1365.

Tyagi et al., 'Partial Strain relaxation via misfit dislocation generation at heterointerfaces in (Al,In)GaN epitaxial layers grown on semipolar (1122) GaN free standing substrates', Applied Physics Letters 95, 2009, p. 251905.

Wang et al , 'Ammonothermal Growth of GaN Crystals in Alkaline Solutions', Journal of Crystal Growth, vol. 287, 2006, p. 376-380.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, 2004, p. 1-19.

USPTO Office Action for U.S. Appl. No. 12/133,364 dated Nov. 26, 2010 (5 pages).

USPTO Office Action for U.S. Appl. No. 12/133,364 dated Jun. 1, 2011 (7 pages).

USPTO Notice of Allowance for U.S. Appl. No. 12/133,364 dated Oct. 11, 2011 (5 pages).

USPTO Office Action for U.S. Appl. No. 12/133,365 dated Jun. 9, 2011 (16 pages).

USPTO Office Action for U.S. Appl. No. 12/133,365 dated Oct. 18, 2011 (21 pages).

USPTO Office Action for U.S. Appl. No. 12/133,365 dated May 13, 2013 (22 pages).

USPTO Office Action for U.S. Appl. No. 12/133,365 dated Aug. 21, 2013 (28 pages).

USPTO Office Action for U.S. Appl. No. 12/133,365 dated Feb. 20, 2014 (32 pages).

USPTO Office Action for U.S. Appl. No. 12/334,418 dated Apr. 5, 2011 (19 pages).

USPTO Office Action for U.S. Appl. No. 12/334,418 dated Oct. 19, 2011 (23 pages).

USPTO Office Action for U.S. Appl. No. 12/334,418 dated Sep. 17, 2013 (26 pages).

USPTO Office Action for U.S. Appl. No. 12/478,736 dated Sep. 27, 2011 (10 pages).

USPTO Office Action for U.S. Appl. No. 12/478,736 dated Feb. 7, 2012 (6 pages).

USPTO Notice of Allowance for U.S. Appl. No. 12/478,736 dated Apr. 23, 2012 (7 pages).

USPTO Notice of Allowance for U.S. Appl. No. 12/478,736 dated Oct. 9, 2012 (4 pages).

USPTO Office Action for U.S. Appl. No. 12/484,095 dated Nov. 10, 2010 (8 pages).

USPTO Office Action for U.S. Appl. No. 12/484,095 dated Jul. 8, 2011 (11 pages).

USPTO Office Action for U.S. Appl. No. 12/497,969 dated Feb. 2, 2012 (19 pages).

USPTO Office Action for U.S. Appl. No. 12/497,969 dated Jul. 5, 2012 (17 pages).

USPTO Office Action for U.S. Appl. No. 12/497,969 dated May 16, 2013 (21 pages).

USPTO Office Action for U.S. Appl. No. 12/497,969 dated Sep. 6, 2013 (20 pages).

USPTO Notice of Allowance for U.S. Appl. No. 12/534,843 dated Jan. 24, 2013 (8 pages).

USPTO Notice of Allowance for U.S. Appl. No. 12/534,849 dated Jul. 31, 2012 (11 pages).

USPTO Office Action for U.S. Appl. No. 12/546,458 dated Jul. 20, 2011 (4 pages).

USPTO Notice of Allowance for U.S. Appl. No. 12/546,458 dated Nov. 28, 2011 (5 pages).

USPTO Office Action for U.S. Appl. No. 12/556,558 dated Sep. 16, 2010 (8 pages).

USPTO Notice of Allowance for U.S. Appl. No. 12/556,558 dated Mar. 22, 2011 (5 pages).

USPTO Office Action for U.S. Appl. No. 12/556,562 dated Sep. 15, 2010 (7 pages).

USPTO Office Action for U.S. Appl. No. 12/556,562 dated Mar. 21, 2011 (5 pages).

USPTO Notice of Allowance for U.S. Appl. No. 12/556,562 dated Jul. 27, 2011 (5 pages).

(56) References Cited

OTHER PUBLICATIONS

USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/636,683 dated Aug. 16, 2013 (16 pages).
USPTO Office Action for U.S. Appl. No. 12/636,683 dated Feb. 24, 2014 (16 pages).
USPTO Office Action for U.S. Appl. No. 12/724,983 dated Mar. 5, 2012 (20 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 13/013,697 dated Jun. 9, 2014 (5 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/041,199 dated Apr. 29, 2014 (12 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/272,981 dated Aug. 15, 2013 (13 pages).
USPTO Notice of Allowance for U.S. Appl. No. 13/272,981 dated Mar. 13, 2014 (10 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).
USPTO Notice of Allowance for U.S. Appl. No. 13/425,304 dated Aug. 22, 2012 (7 pages).
USPTO Notice of Allowance for U.S. Appl. No. 13/548,931 dated Jun. 3, 2013 (10 pages).

\* cited by examiner

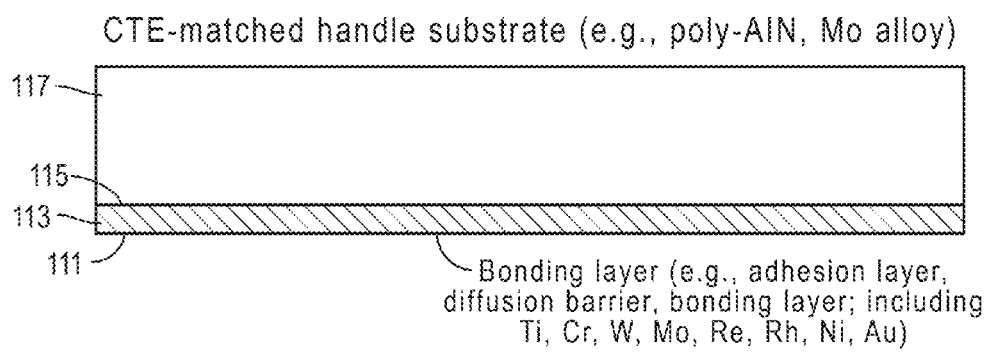
FIG. 1A1
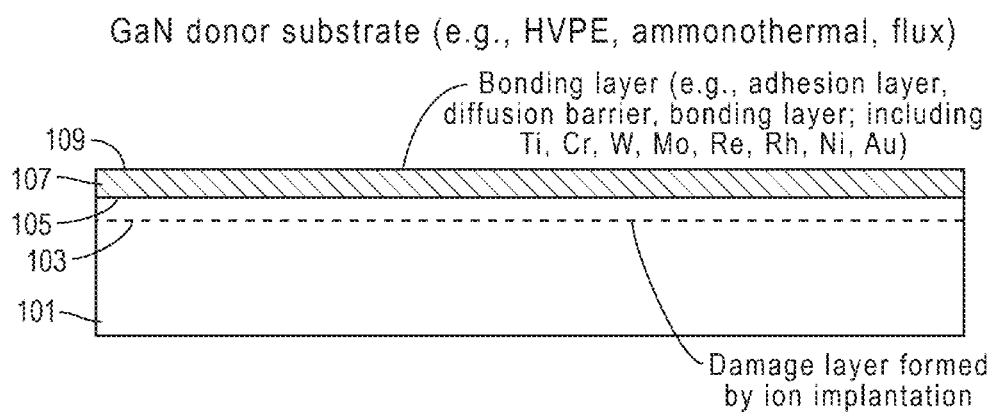
FIG. 1A2

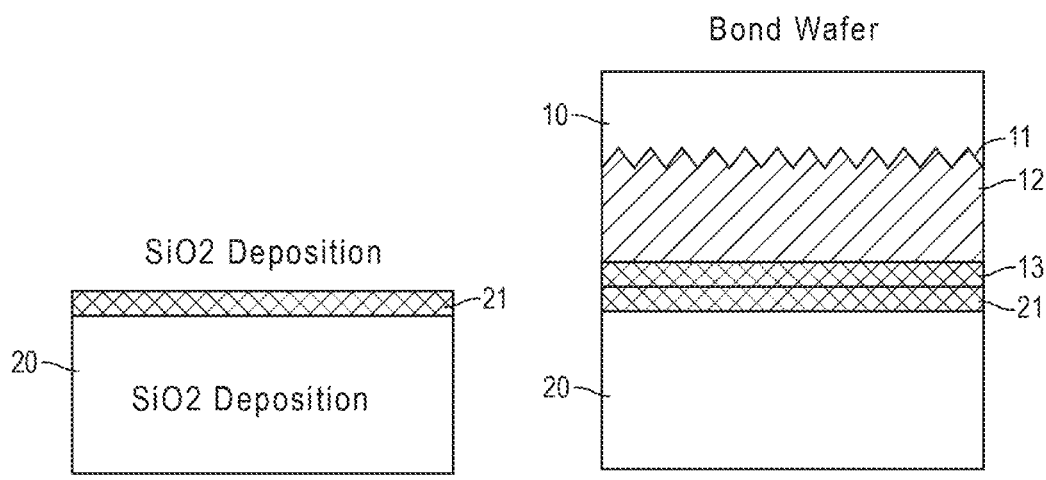
FIG. 2E
FIG. 2F
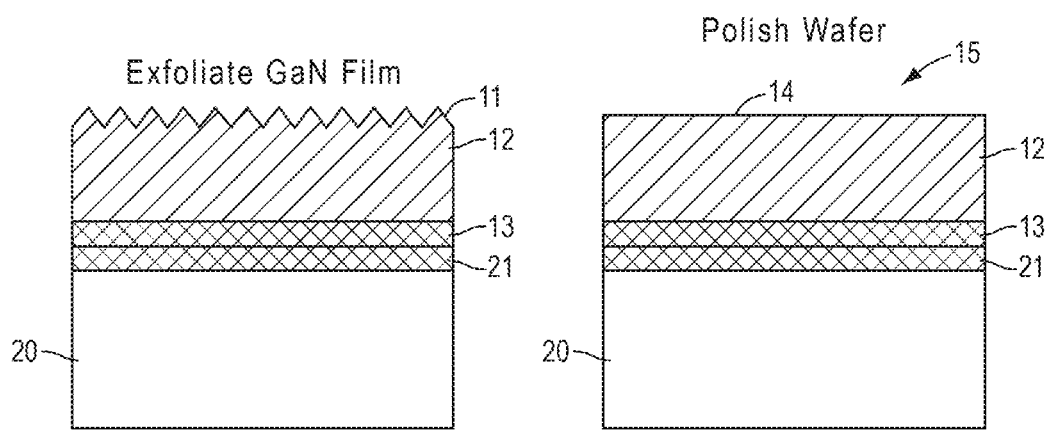
FIG. 2G
FIG. 2H

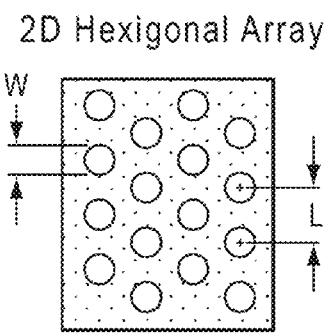
FIG. 6C1
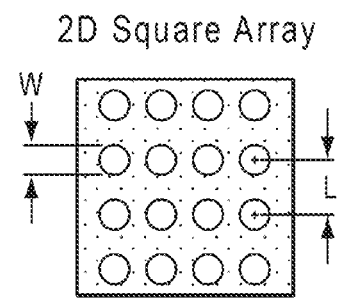
FIG. 6C2
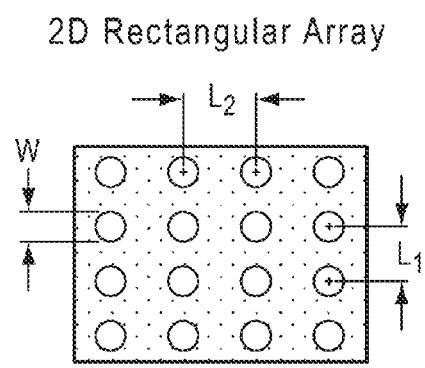
FIG. 6C3

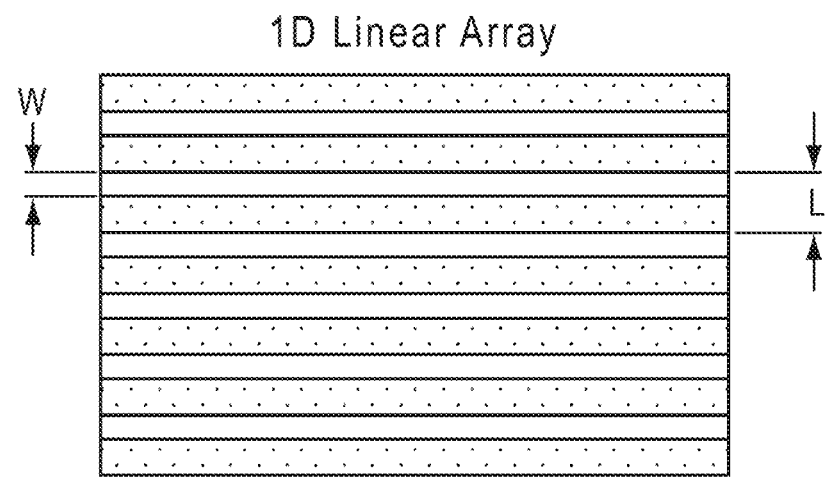
FIG. 6C4
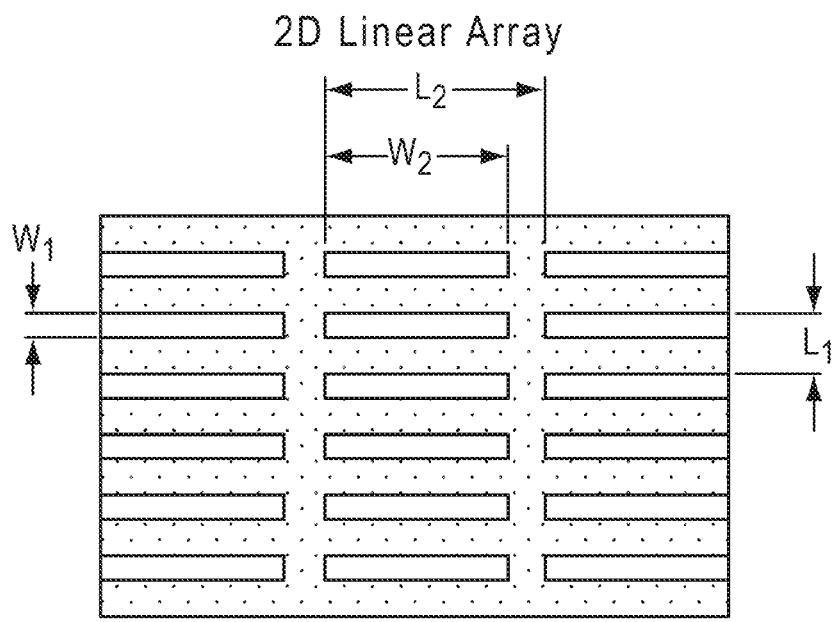
FIG. 6C5

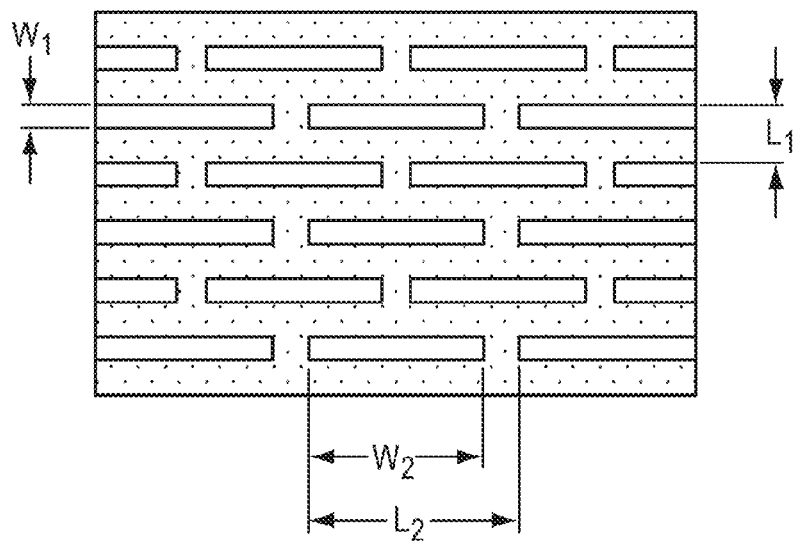
FIG. 6D1
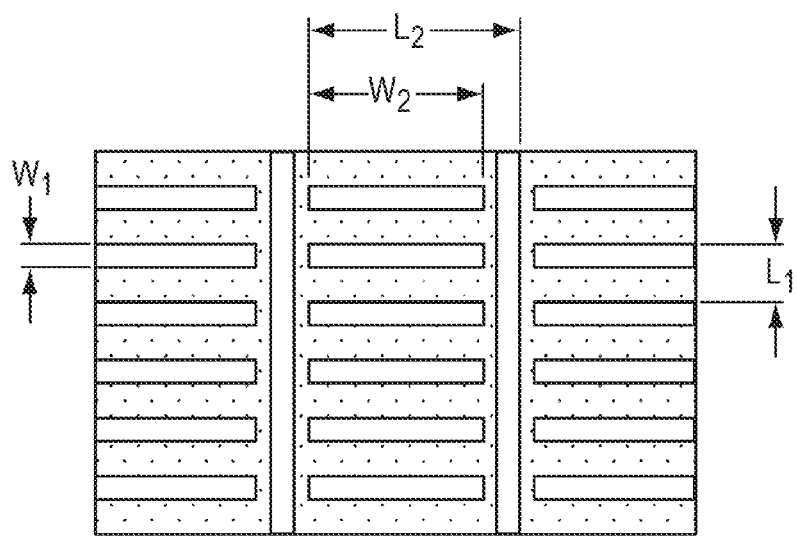
FIG. 6D2

LARGE AREA SEED CRYSTAL FOR AMMONOTHERMAL CRYSTAL GROWTH AND METHOD OF MAKING

This application claims benefit under 35 U.S.C. §119(e) of U.S. Provisional Application No. 61/810,888 filed on Apr. 11, 2013, which is incorporated by reference in its entirety.

BACKGROUND OF THE DISCLOSURE

This disclosure relates generally to techniques for processing materials for manufacture of gallium-containing nitride substrates. More specifically, embodiments of the disclosure include techniques for growing large area substrates using a combination of processing techniques. The disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo detectors, integrated circuits, and transistors, and others.

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate such as sapphire or GaAs. This approach generally gives rise to threading dislocations at average concentrations of $10^5$-$10^7$ cm$^{-2}$ over the surface of thick boules, as well as significant bow, stress, and strain. Reduced concentrations of threading dislocations are desirable for a number of applications. Bow, stress, and strain can cause low yields when slicing the boules into wafers, make the wafers susceptible to cracking during down-stream processing, and may also negatively impact device reliability and lifetime. Capability to manufacture substrates larger than 2 inches is currently very limited. Most large area substrates are manufactured by vapor-phase methods, such as hydride vapor phase epitaxy (HVPE), which are relatively expensive. A less-expensive method is desired, while also achieving large area and low threading dislocation densities as quickly as possible.

Ammonothermal crystal growth has a number of advantages over HVPE as a means for manufacturing GaN boules. However, the performance of ammonothermal GaN crystal growth processing may be significantly dependent on the size and quality of seed crystals. Seed crystals fabricated by HVPE may suffer from many of the limitations described above, and large area ammonothermally-grown crystals are not widely available. Large area seed crystals are needed for ammonothermal bulk GaN growth, for example, at least 2", at least 4", at least 6", at least 8", at least 10", or at least 12" in diameter. Various methods have been disclosed for forming such seed crystals but they suffer from various limitations. Pinnington et al. (U.S. Pat. No. 8,101,498) disclose fabrication of GaN layers on CTE-matched handle substrates by ion implantation, exfoliation, and layer transfer. However, Pinnington et al. do not disclose passivating layers for exposed surfaces of the handle substrate that are suitable for withstanding an ammonothermal bulk GaN crystal growth environment, nor do they teach methods for reducing the dislocation density.

Lateral epitaxial overgrowth is a method that has been widely applied to improvement in the crystallographic quality of films grown by vapor-phase methods. However, no one has yet been able to apply such methods to ammonothermal GaN growth.

From the above, it is seen that techniques for improving crystal growth are highly desirable.

SUMMARY OF THE DISCLOSURE

Disclosed herein are methods for forming free-standing ammonothermal group III metal nitride crystals. In some embodiments the method commences by providing a non-gallium-nitride substrate having a coefficient of thermal expansion approximately equal to that of gallium nitride (e.g., with a value in a range of 4-8×10$^{-6}$/K, averaged between room temperature and 700 degrees Celsius) and then layering a crystalline gallium-containing nitride layer overlying the substrate. Next steps include depositing an inert layer overlying at least the side surfaces of the substrate, the inert layer comprising at least one of Au, Ag, Pt, Pd, Rh, Ru, Ir, Re, Ni, Cr, V, Ti, or Ta, and placing the substrate within a sealable container along with a group III metal source, at least one mineralizer composition, and a nitrogen containing solvent. An ammonothermal group III metal nitride layer is formed on the substrate by heating the sealable container to a temperature of at least about 400 degrees Celsius.

Also disclosed herein are techniques for processing materials for manufacture of gallium containing substrates to form a seed crystals for ammonothermal growth of bulk free-standing group III metal nitride crystals. The crystal comprises a group III metal, including at least one of gallium, aluminum, and indium, and nitrogen and has a wurtzite crystal structure. The formed crystal comprises a first large area surface having a maximum dimension greater than about 10 millimeters where the first large-area surface is characterized by a symmetric x-ray rocking curve full width at half maximum less than about 200 arc sec, by an impurity concentration of H greater than about $10^{17}$ cm$^{-3}$, and by an impurity concentration greater than about $10^{15}$ cm$^{-3}$ of at least one of Li, Na, K, F, Cl, Br, and I, as quantified by calibrated secondary ion mass spectrometry. Using the disclosed techniques for lateral epitaxial overgrowth, the aforementioned first large-area surface comprises a pattern of locally-approximately-linear arrays of threading dislocations having a concentration between about 5 cm$^{-1}$ and about $10^5$ cm$^{-1}$, the pattern being characterized by at least one pitch dimension between about 5 micrometers and about 20 millimeters, the regions between the locally-approximately-linear arrays of threading dislocations being characterized by a threading dislocation density below about $10^5$ cm$^{-2}$ and a stacking-fault concentration below about $10^3$ cm$^{-1}$.

According to the present disclosure, further techniques related to techniques for processing materials for manufacture of gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

In a first aspect, methods for forming a free-standing ammonothermal group III metal nitride crystal are provided, comprising providing a non-gallium-nitride substrate having a coefficient of thermal expansion approximately equal to that of gallium nitride, with a value in a range of 4-8× $10^{-6}$/K, averaged between room temperature and 700 degrees Celsius; providing a crystalline gallium-containing nitride layer overlying the substrate; depositing an inert layer overlying at least some side surfaces of the substrate, the inert layer comprising at least one of Au, Ag, Pt, Pd, Rh, Ru, Ir, Re, Ni, Cr, V, Ti, and Ta; placing the substrate, a group III metal source, at least one mineralizer composition, and a nitrogen containing solvent within a sealable container; and forming an ammonothermal group III metal nitride crystal on the crystalline gallium-containing nitride layer by heating the sealable container to a temperature of at least about 400 degrees Celsius.

In a second aspect, methods for forming a free-standing ammonothermal group III metal nitride crystal are provided, comprising providing a non-gallium-nitride substrate characterized by a coefficient of thermal expansion approximately equal to that of gallium nitride, with a value in a range of 5.5-6.5×$10^{-6}$/K, averaged between room temperature and 700 degrees Celsius; providing a crystalline gallium-containing nitride layer overlying the substrate; depositing at least one patterned mask layer on the crystalline gallium-containing nitride layer to form a patterned substrate, wherein the patterned mask layer: comprises one or more of an adhesion layer, a diffusion-barrier layer, and an inert layer; comprises one or more of Au, Ag, Pt, Pd, Rh, Ru, Ir, Ni, Cr, V, Ti, or Ta; is characterized by a thickness between about 10 nanometers and about 100 micrometers; and comprises a one-dimensional or two-dimensional array of openings, wherein the openings are characterized by an opening dimension between about 1 micrometer and about 5 millimeters and a pitch dimension between about 5 micrometers and about 20 millimeters; depositing an inert layer overlying at least some side surfaces of the substrate, wherein the inert layer comprises at least one of Au, Ag, Pt, Pd, Rh, Ru, Ir, Re, Ni, Cr, V, Ti, and Ta; placing the substrate, a group III metal source, at least one mineralizer composition, and a nitrogen containing solvent within a sealable container; forming an ammonothermal group III metal nitride crystal characterized by a thickness of at least 500 micrometers by heating the sealable container to a temperature of at least about 400 degrees Celsius; and removing an ammonothermally-grown group III metal nitride crystal from the substrate and processing ammonothermally-grown group III metal nitride crystal to form a free-standing, ammonothermally-grown group III metal nitride crystal.

In a third aspect, methods for forming a free-standing ammonothermal group III metal nitride crystal are provided, comprising providing a non-gallium-nitride substrate characterized by a coefficient of thermal expansion approximately equal to that of gallium nitride, with a value in a range of 5.5-6.5×$10^{-6}$/K, averaged between room temperature and 700 degrees Celsius, wherein the non-gallium-nitride substrate comprises a composite layer structure comprising a first large-area surface and a second large-area surface on an opposite side of the substrate from the first large-area surface; providing a crystalline gallium-containing nitride layer overlying each of the first large-area surface and the second large-area surface; depositing at least one patterned mask layer on each of the crystalline gallium-containing nitride layers to form a patterned substrate, wherein the patterned mask layer: comprises one or more of an adhesion layer, a diffusion-barrier layer, and an inert layer; comprises one or more of Au, Ag, Pt, Pd, Rh, Ru, Ir, Ni, Cr, V, Ti, or Ta; is characterized by a thickness between about 10 nanometers and about 100 micrometers; and comprises a one-dimensional or two-dimensional array of openings, wherein the openings are characterized by an opening dimension between about 1 micrometer and about 5 millimeters and a pitch dimension between about 5 micrometers and about 20 millimeters; depositing an inert layer overlying at least some side surfaces of the substrate, wherein the inert layer comprises at least one of Au, Ag, Pt, Pd, Rh, Ru, Ir, Re, Ni, Cr, V, Ti, and Ta; placing the substrate, a group III metal source, at least one mineralizer composition, and a nitrogen containing solvent within a sealable container; forming an ammonothermal group III metal nitride crystal characterized by a thickness of at least 500 micrometers by heating the sealable container to a temperature of at least about 400 degrees Celsius; and removing the ammonothermally-grown group III metal nitride crystal from the substrate and processing the ammonothermally-grown group III metal nitride crystal to form a free-standing, ammonothermally-grown group III metal nitride crystal.

A further understanding of the nature and advantages of the present disclosure may be realized by reference to the specification and attached drawings.

BRIEF DESCRIPTION OF THE DRAWINGS

FIGS. 2A to 2I are side cross-sectional views of a method of making an engineered substrate according to embodiments of the present invention.

FIGS. 6C1 to 6C5 are simplified diagrams illustrating mask patterns on a seed crystal or substrate according to an embodiment of the present disclosure;

FIGS. 6D1 to 6D2 are simplified diagrams illustrating mask patterns on a seed crystal or substrate according to an embodiment of the present disclosure;

DETAILED DESCRIPTION OF THE DISCLOSURE

Figure 1B:
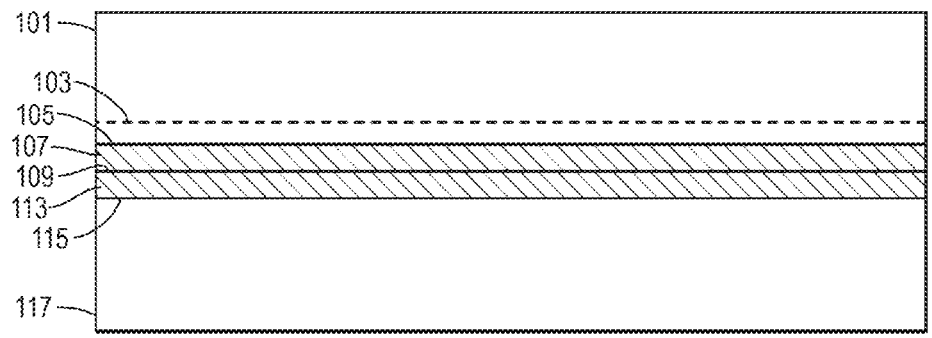
FIGS. 1A1 to 1C are simplified diagrams illustrating a method of forming an engineered substrate according to an embodiment of the present disclosure.
FIG. 1D is a simplified diagram illustrating a method of fabricating a seed crystal for ammonothermal crystal growth according to an embodiment of the present disclosure.

According to the present disclosure, techniques related to techniques for processing materials for manufacture of group-III metal nitride and gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

Threading dislocations in GaN are known to act as strong non-radiative recombination centers which can severely limit the efficiency of GaN-based LEDs and laser diodes. Non-radiative recombination generates local heating which may lead to faster device degradation (Cao, Sandvik, LeBoeuf, & Arthur, 2003). In high-power applications, GaN-based devices suffer from decreased efficiency with increasing current density, known as droop. There is evidence suggesting a correlation between dislocation density and the magnitude of droop in LEDs (Schubert et al., 2007). For GaN-based laser diodes there is a well-documented negative correlation between dislocation density and mean time to failure (MTTF) (Tomiya, Hino, Goto, Takeya, & Ikeda, 2004), which appears to be due to impurity diffusion along the dislocations (Orita et al., 2009). For electronic devices, dislocations have been shown to markedly increase the leakage current (Kaun et al., 2011) and reduce the device lifetime (Tapajna et al., 2011) in HEMT structures. One of the primary advantages of using bulk GaN as a substrate material for epitaxial thin film growth is a large reduction in the concentration of threading dislocations in the film. Therefore, the dislocation density in the bulk GaN substrate will have a significant impact on the device efficiency and the reliability.

As noted above, lateral epitaxial overgrowth (LEO) is a method that has been widely applied to improvement in the crystallographic quality of films grown by vapor-phase methods. For example, methods whereby GaN layers were nucleated on a sapphire substrate, a $SiO_2$ mask with a periodic array of openings was deposited on the GaN layer, and then GaN was grown by metalorganic chemical vapor deposition (MOCVD) through the openings in the $SiO_2$ mask layer, grew laterally over the mask, and coalesced. The dislocation density in the areas above the openings in the mask were very high, similar to the layer below the mask, but the dislocation density in the laterally-overgrown regions was orders of magnitude less. This method is attractive because it can be applied to large area substrates, significantly reducing their dislocation density. Similar methods, with variations, have been applied by a number of groups to vapor-phase growth of GaN layers. These methods are variously referred to as LEO, epitaxial lateral overgrowth (ELO or ELOG), selective area growth (SAG), dislocation elimination by epitaxial growth with inverse pyramidal pits (DEEP), or the like. In the case of essentially all variations of this method of which we are aware, a thin heteroepitaxial GaN layer is grown on a non-GaN substrate, a patterned mask is deposited on the GaN layer, and growth is re-initiated in a one- or two-dimensional array of openings in the mask. The period or pitch of the growth locations defined by the openings in the mask is typically between 2 and 100 micrometers, typically between about 5 and 20 micrometers. The individual GaN crystallites or regions grow and then coalesce. Epitaxial growth may then be continued on top of the coalesced GaN material to produce a thick film or "ingot." A relatively thick GaN layer may be deposited on the coalesced GaN material by HVPE. The LEO process is capable of large reductions in the concentration of dislocations, particularly in the regions above the mask, typically to levels of about $10^5$-$10^7$ cm$^{-2}$. However, very often the laterally-grown wings are crystallographically tilted from the underlying substrate ("wing tilt"), by as much as several degrees, which may be acceptable for a thin-film process but may not be acceptable for a bulk crystal growth process, as it may give rise to stresses and cracking as well as unacceptable variation in surface crystallographic orientation.

Several factors make the LEO method difficult to apply to non-vapor-phase growth methods, and therefore non-obvious, and we are not aware of any teaching of the application of such methods to ammonothermal GaN growth. Typically, the masking layer in LEO-type processes comprises $SiO_2$ or $SiN_x$. In a typical ammonothermal growth environment, which is extremely corrosive, both materials are etched and therefore incapable of performing the function of a mask. Finding a material that has good adhesion to GaN, is stable and substantially chemically inert under ammonothermal growth conditions for a growth cycle that may last from several days to about eight weeks, and does not perturb the lateral growth of GaN layers above it, is non-trivial. By contrast, the cycle time of typical MOCVD-based LEO methods are typically at most a few hours, and typical HVPE-based LEO methods have a cycle time less than about a day. In addition, as noted above, these vapor-phase LEO methods have generally used a non-nitride substrate. Unexpected benefits accrue to the herein-disclosed ammonothermal lateral epitaxial overgrowth method, particularly when used together with a gallium-containing nitride substrate.

High quality seed crystals are critical to most true bulk crystal growth processes, and large area seed crystals are particularly useful for a method such as ammonothermal growth. However, most large-area gallium nitride crystals are currently grown by HVPE, as noted above. In addition to the undesirably concentration of threading dislocations typically present in this material, there appears to be a small lattice mismatch between bulk GaN grown by HVPE versus by other, true bulk methods (Darakchieva, Monemar, Usui, Saenger, & Schubert, 2008), on the order of 0.001 Å, corresponding to a strain on the order of $2.5 \times 10^{-4}$. The lattice mismatch between HVPE GaN and ammonothermal GaN may be larger, for example, approximately 0.003 Å, corresponding to a strain on the order of $8 \times 10^{-4}$. While these strain levels may sound small, even the smaller value nonetheless corresponds to a Matthews-Blakeslee critical thickness of only about 0.8 micrometer. Above this thickness a bulk-on-HVPE GaN layer structure may reduce its energy by formation of dislocations, if an energetically-accessible mechanism for doing so exists. If energy relaxation by dislocation generation is not possible, in thicker layers relaxation may occur by formation of cracks. Using the Matthews-Klokholm formulation, the critical thickness upon which cracking may occur is 3-10 micrometers for an ammonothermal film grown on HVPE GaN at 550° C., depending on the actual strain. For example, ammonothermal GaN layers on HVPE GaN seed crystals may form cracks for layers thicker than about 0.1 millimeter, about 0.2 millimeter, thicker than about 0.5 millimeter, thicker than about 1 millimeter, thicker than about 2 millimeters, or thicker than about 5 millimeters.

The use of engineered substrates rather than bulk gallium nitride substrates as seeds for ammonothermal growth offers, in principle, access to larger areas and reduced costs. Stresses during the ammonothermal crystal growth process may be minimized by matching the coefficient of thermal expansion (CTE) of the engineered substrate to that of bulk gallium nitride. The CTE of bulk GaN have been reported by a number of authors, including C. Roder, S. Einfeldt, S. Figge, and D. Hommel in Physical Review B, Vol. 72, article 085218 (2005), who reported that the linear thermal expansion coefficients in the "a" and "c" lattice directions at room temperature were $4.30 \times 10^{-6}$/K and $3.84 \times 10^{-6}$/K, respectively. Over the temperature range of 25 to 700° C., the average values in the a and c directions were $6.05 \times 10^{-6}$/K and $5.24 \times 10^{-6}$/K, respectively.

Figure 1C:
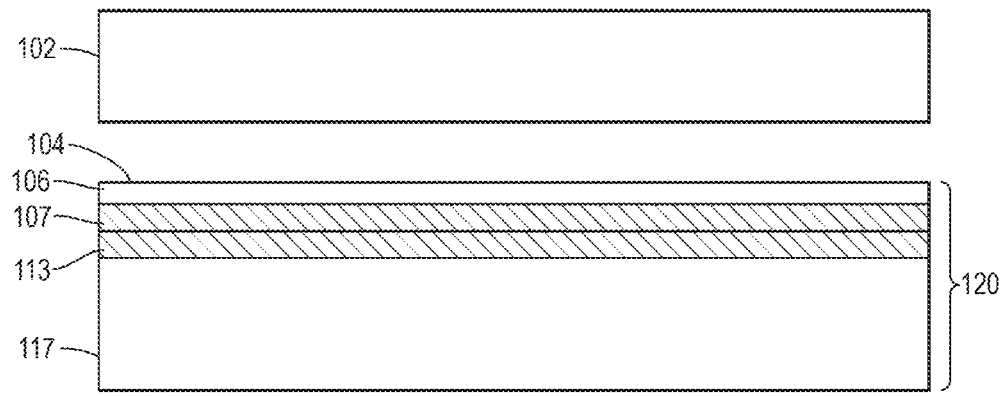
Figure 1D:
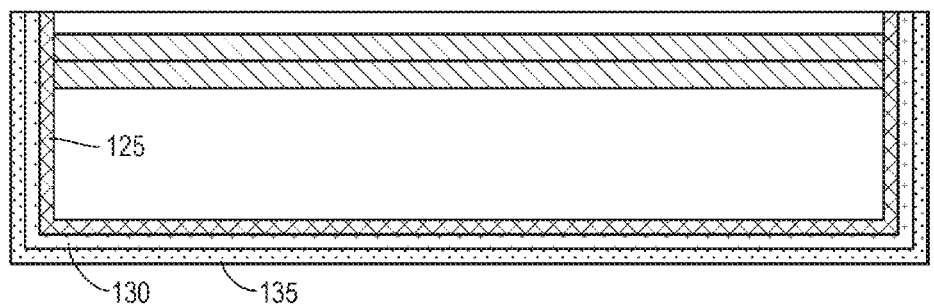

A first set of embodiments is described in FIGS. 1A1-1D. Referring to FIG. 1A1, a GaN donor substrate 101 is implanted with energetic ions to form damaged layer 103. A bonding layer 107 is deposited on surface 105 of GaN donor substrate 101, which may comprise sub-layers, for example, one or more of an adhesion layer, a diffusion barrier layer, and a bonding sub-layer. The bonding layer or sub-layer may comprise gold (Au). A similar bonding layer 113 may be deposited on surface 115 of handle substrate 117. Handle substrate 117 may have a thermal expansion coefficient that is accurately matched to that of GaN over a desired temperature range, for example, between room temperature and a temperature chosen between about 500 degrees Celsius and about 800 degrees Celsius. Handle substrate 117 may be selected from a composition comprising aluminum nitride or molybdenum.

Referring to FIG. 1B, the mating bonding layers on handle substrate 117 and GaN donor substrate may be placed into contact with one another and wafer-bonded together. Referring to FIG. 1C, a thermal treatment may be applied to the wafer-bonded composite, causing rearrangements within damage layer 103, exfoliation, and separation of the bonded composite 120 from the remainder of GaN donor substrate 101.

Referring to FIG. 1D, an adhesion layer 125, a diffusion barrier layer 130, and an inert layer 135 may be deposited on the exposed surface of the handle substrate and of the bonding layers, so as to protect them from an ammonothermal crystal growth environment. Adhesion layer 125 may comprise at least one of Ti and Cr. Diffusion barrier layer 130 may comprise at least one of W, TiW, Ta, Mo, and Re. Inert layer 135 may comprise at least one of Ag, Au, Ru, Rh, Pd, Pt, and Ir. The exposed surface of the GaN layer may be patterned as described below.

In certain embodiments, a seed crystal is fabricated from an intermediate formed by wafer bonding. The wafer-bonded intermediate substrate is comprised of a handle substrate and a thin layer of semiconductor or ceramic material that has been transferred from another semiconductor or ceramic substrate. Preferably, the coefficient of thermal expansion of the handle material is closely matched to the coefficient of thermal expansion (CTE) of the gallium nitride layers over a temperature range. Preferably, the thin layer comprises a single-crystalline semiconductor or ceramic material exfoliated from a high-quality low-defect-density freestanding single-crystalline semiconductor or ceramic substrate. The wafer-bonded intermediate substrate enables the use of larger diameter substrates for the growth of gallium nitride films than is possible with other approaches in cases where the CTE of the material upon which devices will be formed is significantly different from the CTE of the device layer, for example, in the case where III-nitride films are grown on sapphire. Layers grown on the intermediate substrate are integrated with a final substrate, preferably by wafer bonding. The intermediate substrate may be removed by a process such as etching while the gallium nitride structure remains bonded to the final substrate without damaging the device layer. Furthermore, the intermediate substrate for epitaxial growth of III-nitride and other compound semiconductor or ceramic layers of the embodiments of the invention can be made larger than the commercially available substrates, thus decreasing the cost of device manufacturing.

Figure 2A:
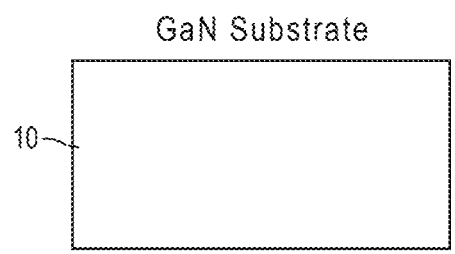

Detailed processing techniques and structures in accordance with embodiments of the present invention are illustrated in FIGS. 2A-2N. In FIG. 2A, a source (also known as "donor") semiconductor substrate or wafer 10 is preferably high-quality low-defect-density freestanding commercial GaN substrate, where dislocation-defect density is less than $10^8$/cm$^2$. Other preferred candidates for source wafer 10 comprise one or more layers of GaN or Al$_z$Ga$_{1-z}$N materials grown homo-epitaxially on high-quality low-defect-density freestanding commercial GaN or AlN substrates, where z is in the range of 0 to 1. Other possible candidates for source wafer 10 comprise one or more layers of GaN or Al$_z$Ga$_{1-z}$N materials grown heteroepitaxially on sapphire or SiC substrates. These hetero-epitaxially grown materials have higher dislocation-defect density, typically higher than $10^8$/cm$^2$.

Alternatively, as will be described with respect to the second, third and fourth embodiments, any material suitable for use as an epitaxial template for the III-nitride semiconductor system may be applied as source wafer 10 for transfer of a thin layer to a handle substrate 20. This includes the transfer of a thin layer of sapphire from a sapphire substrate to a handle substrate by ion-implantation, preferably by wafer bonding of the sapphire substrate to the handle substrate and exfoliation of the thin sapphire layer to leave the thin sapphire layer bonded to the handle substrate. Additional suitable materials for transfer to a handle substrate and for subsequent use as III-nitride semiconductor epitaxial template comprise SiC, Si(111), ZnO, GaAs substrates, or any other crystalline material that can be used as a growth surface for GaN and its related compounds.

Figure 2B:
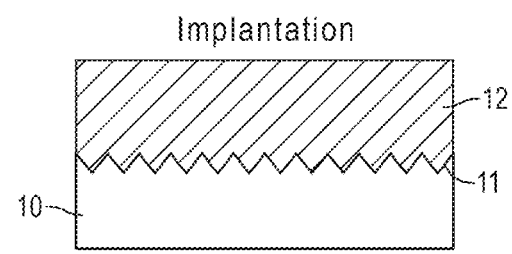

In FIG. 2B, the source wafer 10 is treated to produce a thin layer 12 with a weak interface 11 to enable transfer of the thin layer 12. Preferably the thin layer 12 with the weak interface 11 is produced by ion implantation or ionic bombardment with hydrogen, helium, nitrogen, fluorine, oxygen, boron and/or other ions. More preferably, the thin layer 12 with weak interface 11 is produced by co-implantation of hydrogen and other heavier ions as known in the art, including, but not limited to helium, nitrogen, and/or boron. Preferably, helium, or more generally, a light gas ion, can be implanted in the GaN source wafer 10 prior to implantation of hydrogen. However, implantation with $H^+$ as the first ion can also be used. The ion energies of the helium and hydrogen are selected to ensure that the concentration peaks of the helium and hydrogen are at similar depths. In this process, implantation profile peak positions varying by 10% or less can be expected to behave similarly. As-exfoliated thin layer 12 produced by ion implantation or ionic bombardment have thickness variation much less than 20% of the total thickness of thin layer 12, usually less than 10%. Thickness uniformity of thin layer 12 ensures uniformity of thermal conduction and growth temperature during epitaxial growth and produces epitaxial layers with exemplary uniformity of composition and thickness, critical for the economic production of high-performance devices with higher yield and lower costs.

Other possible processing techniques to exfoliate and transfer a thin layer 12 comprise using a sacrificial layer as the weak interface 11 that can be laterally selectively etched to allow what is commonly referred to as epitaxial lift-off (ELO). The selectively-removable weak interface used in ELO 11 can be fabricated by epitaxial growth of a thin film or ion implantation with a heavy ion to amorphize the sacrificial layer 11.

Thus, the thin layer 12 can be made of any material which supports epitaxial growth of a desired compound semiconductor material, such as a III-nitride compound semiconductor material, including GaN. Preferably, the thin layer 12 is a single crystalline layer or a layer with a highly oriented columnar structure which has a surface lattice structure which is similar to the lattice structure of the desired compound semiconductor material, such as the III-nitride compound semiconductor material, to allow epitaxial growth of a single crystal layer of the desired compound semiconductor material, such as the III-nitride compound semiconductor material, on the thin layer 12.

When freestanding GaN substrates are used, devices are typically grown on the Ga-terminated face of the GaN substrate leaving the much less chemically stable N-terminated face of the GaN substrate exposed. The relatively low chemical stability of the N-terminated GaN face makes devising a selective etch extremely difficult.

If the source substrate 10 is comprised of freestanding GaN or any other freestanding III-nitride material and the device to be fabricated on the wafer-bonded intermediate substrate comprises a LED or LD structure, it is preferable for subsequent processing that the N-face be treated to generate the weak interface 11. By treating the N-face of the source wafer 10, upon bonding and layer transfer described below, the Ga-face in GaN and the cation face in any other III-nitride freestanding material is presented for the epitaxial growth of the device structure. Although most freestanding GaN substrates available now comprise flat surfaces of the (0001) Ga-face or (000-1) N-face, other freestanding GaN substrates are also possible comprising flat surfaces of (11-20) or (10-10) planes, more commonly known as non-polar faces of GaN. Semi-polar faces of GaN may also be used. When applied as source substrate 10, these freestanding GaN substrates comprising non-polar or semi-polar faces do not require the special distinction necessary for the Ga-face and N-face and greatly simplify the treatment of the source substrate 10.

It is known in the art that metal-organic chemical vapor deposition (MOCVD), the dominant device growth technique for III-nitride-based light-emitting devices, produces superior epitaxial layers on the Ga- or cation-face, as shown in "GaN homoepitaxy for device applications" by M. Kamp, et. al., MRS Internet J. Nitride Semicond. Res. 4S1, G10.2 (1999). Because the HVPE growth of the freestanding III-nitride source wafer 10 results typically in a Ga-face top surface, the N-face of the resulting freestanding GaN substrate is closer to the initial growth substrate comprising sapphire or other substrates suitable for GaN growth used to fabricate the freestanding GaN, and has a higher dislocation density than the Ga-face of the freestanding GaN, as shown in "Wide Energy Bandgap Electronics" by F. Ren and J. C. Zolper, pg. 59. For this reason, it may be desirable to fabricate source wafer 10 specifically designed for the subsequent transfer of thin GaN layers 12 to produce wafer-bonded intermediate substrates intended for use as high-quality growth templates for III-nitride semiconductor. Such a freestanding GaN substrate specifically designed for the fabrication of a wafer-bonded intermediate substrate by implantation and exfoliation of thin GaN layers 12 from the N-face would be distinguished from a standard freestanding GaN substrate by being grown to a greater thickness than typical HVPE freestanding GaN substrates. The increased thickness would be used to polish an increased quantity of the material from the N-face and to move the N-face of the freestanding GaN substrate farther from the highly defective nucleation region present at the original sapphire-GaN interface in the HVPE fabrication of freestanding GaN. Specifically, greater than 50 µm, such as 50 to 200 microns of GaN should be removed from the N-face by polishing or other removal means.

Further improvement of the freestanding GaN substrate for fabrication of wafer-bonded intermediate substrates could be achieved by using a wafer-bonded intermediate substrate comprising a thin GaN film bonded to a removable handle substrate as the initial growth substrate for the HVPE growth of thick GaN. In this way the N-face of the resulting substrate would effectively be moved further from the surface of the sapphire initial growth substrate. Such a process could be repeated several times to reduce the dislocation density in the GaN film in a wafer-bonded intermediate substrate to a desired level. Additionally, a freestanding GaN substrate specifically designed for the fabrication of a wafer-bonded intermediate substrate preferably has a better polished N-face surface than what is typically specified or available in conventional HVPE freestanding GaN prepared for subsequent growth on the Ga-face. Specifically, the N-face polish preferably results in a N-face surface with less than 1 nm, preferably between 0.3 and 0.5 nm, of micro-roughness. In the case that the device to be fabricated on the wafer-bonded intermediate substrate is a HEMT or other high-power or high-frequency device, it is possible and sometimes desirable to fabricate such structures by growth with MBE on the N-face of the III-nitride material, typically GaN. For this reason, implantation of the Ga-face of the freestanding GaN substrate would be desired and can be used to transfer thin GaN layers from a freestanding GaN substrate.

Through the co-implantation of helium and hydrogen, the exfoliation process is improved relative to implantation with hydrogen alone. The improvement of the exfoliation kinetics relative to a hydrogen implantation process can be exhibited in multiple ways. The total dose of hydrogen plus helium necessary to achieve an exfoliation process that occurs at the same temperature and rate as a hydrogen-only exfoliation process is reduced. As a result, by using a total dose at the same level as a functioning hydrogen-only exfoliation process, the rate at which exfoliation occurs at a given temperature is accelerated. This can enable the reduction of the required temperature in the exfoliation process.

The use of a He/H co-implantation process introduces less total hydrogen in the transferred GaN film, reducing the amount of hydrogen available to diffuse into the device structure during high temperature epitaxial growth. By reducing the background concentration of hydrogen in the device structure, problems associated with dopant passivation—particularly Mg in p-type GaN—can be reduced relative to devices fabricated on GaN films exfoliated with a higher dose of hydrogen used in a hydrogen-only exfoliation process.

Additionally, the use of a He/H co-implantation process leads to a mechanistically different exfoliation process. The co-implantation exfoliation process improves upon the hydrogen-only exfoliation process because of the differing interactions of helium and hydrogen with the GaN crystal lattice both as energetic ions and neutral atomic species. By virtue of their larger mass and associated momentum, energetic helium ions cause an order of magnitude more damage in the crystal lattice during the implantation process than hydrogen ions of comparable energy. Furthermore, after coming to rest in the crystal lattice, helium atoms have a lower diffusivity than hydrogen atoms, and are thus less mobile under low-temperature (<500° C.) dynamic annealing that occurs during implantation. However, in contrast to hydrogen, helium atoms in the gallium nitride lattice do not bind to the defect structures formed by ion implantation. Thus, the temperature dependence of helium diffusion is dictated by the temperature dependence of helium diffusivity in the GaN crystal structure irrespective of damage, while the temperature dependence of hydrogen diffusion for hydrogen atoms bound to defect structures is a function of both the energy required to release the hydrogen from the structure, which can be quite high for nitrogen-hydrogen bonds, and the temperature dependent diffusivity of hydrogen in the GaN lattice. Thus, the hydrogen passivates and stabilizes defect structures. These defect structures lead to the formation of micro-cracks and the eventual exfoliation of the GaN film upon the diffusion of helium to the micro-crack structures at elevated temperatures (>300° C.). The net effect of the mechanistic difference is that the impact of implant temperature is minimized from a diffusion perspective making the implantation process more robust.

It has been observed that implantation of GaN at an elevated temperature leads to an improved exfoliation process when He/H co-implantation is used. The proposed mechanism for this observation is that the elevated substrate temperature during implant causes dynamic annealing to limit the buildup of lattice damage during the high dose implant necessary to exfoliate GaN. To maintain a high substrate temperature, such as a temperature above room temperature, preferably a temperature greater than 150 degrees Celsius, and more preferably 300 to 500 degrees Celsius, during implantation, several methods can be employed, comprising the following methods. The energetic ion beam delivers power to the implanted substrates that is predominantly dissipated as heat. Thus, by thermally isolating the substrates from the implanter end station, by securing the substrate with limited points of thermal contact so as to make the predominant cooling mechanism be a radiation process or by placing a thermally insulating material between the substrate and end station during implantation, the substrate temperature naturally rises during the implantation process until the substrate cooling mechanism becomes dominated by radiation rather than thermal conduction. Alternatively, directly heating the substrate during implantation by a resistive heater and a feedback control system can be used to more precisely control the temperature at the substrate surface during implantation. Thus, the substrate may be heated passively and/or actively during the implantation.

A substantial blistering and exfoliation of a GaN layer from a GaN-on-sapphire substrate and/or a freestanding GaN substrates can occur when the substrate is co-implanted with $He^+$ at an energy of 80 to 160 keV to a dose of $1.5 \times 10^{17}$ to $4.0 \times 10^{17}$ $cm^{-2}$ and $H^+$ at an energy of 60 to 100 keV to a dose of $1.0 \times 10^{17}$ to $2.0 \times 10^{17}$ $cm^{-2}$. Alternatively, $H_2^+$ ions can be used instead of $H^+$ ions by doubling the energy and halving the dose of the desired $H^+$ implant process. The desired dose for exfoliation is consistent for a wide range of implantation temperatures from passively cooled implantation resulting in a wafer temperature between room temperature and 150 degrees Celsius and actively heated resulting in wafer temperatures in excess of 300 degrees Celsius during implantation. Generally, the required dose for exfoliation is reduced by implantation at an elevated temperature. In all cases, the He fraction of the implant is preferably more than 50% of the total dose, up to a He-only exfoliation process that has been found to be possible for implantation doses above $3.5 \times 10^{17}$ $cm^{-2}$. Thus, the low $H^+$ doses and implant conditions described above are not sufficient to cause exfoliation in the absence of the $He^+$ implant. The substrate is annealed for >10 seconds at a temperature between 300° C. and 900° C. to exfoliate the layer, depending on the dose of the implant. Preferably, the GaN substrate is annealed to a temperature from 350 to 600 degrees Celsius to induce exfoliation. In cases where a co-implantation process is used, an anneal between the first and second implantation may be used to improve the kinetics of the exfoliation process.

In brittle semiconductors, such as Si, it is generally accepted that H-induced exfoliation proceeds by the formation of damage and the super-saturation of the lattice with H during implantation that after bonding and annealing leads to laterally extended micro-cracks that coalesce to induce exfoliation. The exfoliation process in sapphire is mechanistically different than that for brittle semiconductors. For reasons related to the relatively rigid elastic properties of sapphire and its resistance to implantation damage and diffusion of implanted species, full spontaneous exfoliation of free sapphire surfaces has not been reported in the literature. Instead, subsurface blisters may not fully coalesce. Thus, the implantation and thermal cycling commonly used in implantation-induced exfoliation processes may not by themselves be sufficient for full layer exfoliation. In this case, the presence of a rigid handle substrate with a CTE that is different from that of the implanted sapphire can serve to improve the exfoliation process by inducing thermo-mechanical stresses that drive fracture and exfoliation of the material in the areas weakened by the un-coalesced subsurface blisters. This could lead to several important differences when exfoliating sapphire and developing a suitable implant process for wafer bonding and layer transfer. First, it may be important to provide either an internal thermo-mechanical stress or an external stress to serve as a driving force to induce exfoliation along the weakened interface. Additionally, adequate implantation processes to lead to exfoliation of a sapphire thin film during wafer bonding and layer transfer can be indicated by uniform blistering of a free surface upon annealing rather than the spontaneous exfoliation of the implanted film from the surface.

Sapphire blistering that leads to exfoliation and layer transfer is caused by the implantation of $He^+$ and/or $H^+$ or $H_2^+$ and has been investigated. $He^+$ ions have been implanted at energies of 80, 150, 180, and 285 keV. $H^+$ ions have been implanted at energies of 50, 80, 95, 100, 150, and 180 keV, and $H_2^+$ ions have been tested at an energy of 300 keV. For He-only exfoliation doses of $1.0 \times 10^{17}$, $1.15 \times 10^{17}$, and $1.5 \times 10^{17}$ cm$^{-2}$ were tested. For H-only exfoliation doses of $1.0 \times 10^{17}$, $1.5 \times 10^{17}$, $1.8 \times 10^{17}$, and $2.0 \times 10^{17}$ cm$^{-2}$ were tested. For co-implantation of $He^+$ and $H^+$ ions a wider range of implantation ranges and combinations was attempted with the $He^+$ dose ranging from $7.5 \times 10^{16}$ to $2.0 \times 10^{17}$ cm$^{-2}$ and $H^+$ dose ranging from $5.0 \times 10^{16}$ to $2.0 \times 10^{17}$ cm$^{-2}$.

Based upon this data, a generalized He/H co-implantation process is defined. Broadly, the blistering process is functional for $He^+$ implantation at an energy from 80 to >285 keV at a dose of $7.5 \times 10^{16}$ to $2.0 \times 10^{17}$ cm$^{-2}$ with a corresponding energy and dose for $H^+$ in the range of 50 to >150 keV and 0 to $1.25 \times 10^{17}$ cm$^{-2}$ dose. In other words, $He^+$ ions may be implanted alone or in combination with hydrogen ions. Implantation of $H^+$ at 80 keV to a dose in excess of $1.25 \times 10^{17}$ cm$^{-2}$ leads to exfoliation even in the absence of He species, and thus cannot be considered a sub-critical $H^+$ dose. Appropriate implantation conditions for 150 keV $He^+$ and 80 keV $H^+$ can be expressed as a total dose, D, and the fractional component of that dose that is made up of $He^+$, $x_{He}$. Using this notation, the $H^+$ dose restriction for a sub-critical $H^+$ dose preferably leads to the following constraint for a 150 keV $He^+$ implantation process.

$$(1-x_{He})D \leq 1.25 \times 10^{17} \text{ cm}^{-2} \tag{1}$$

Figure 3:
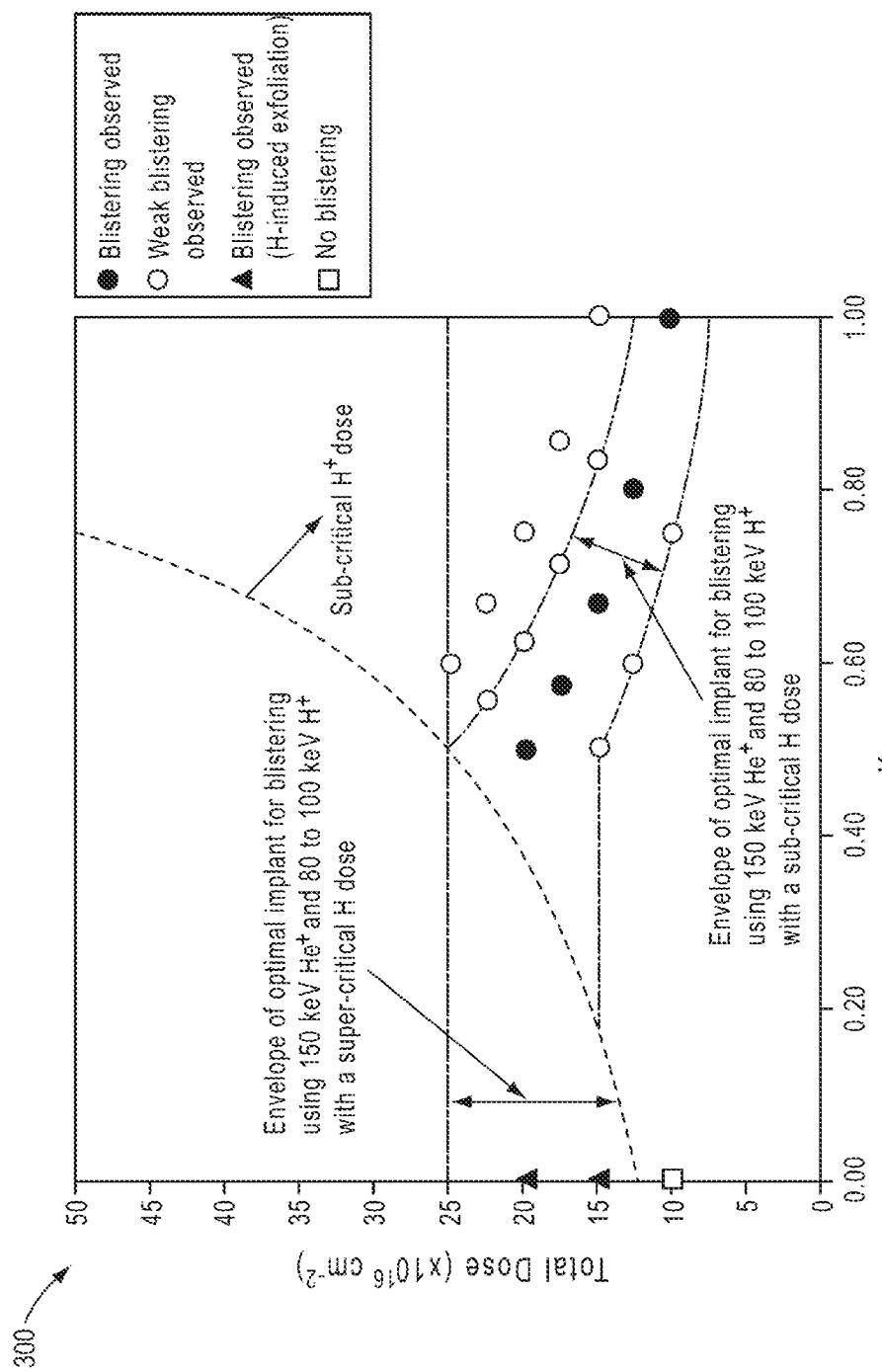
FIG. 3 is an implantation phase diagram for the He/H co-implantation-induced exfoliation of sapphire. The Figure shows a preferred envelope of dose combinations for He/H co-implantation.

However, operation with a sub-critical dose of $H^+$ is not essential to drive the exfoliation process. This is illustrated in FIG. 3. While weak blistering is observed for a wide range of implant conditions with 150 keV $He^+$, blistering was preferably achieved for doses defined by the following range, subject to the restriction defined in equation 1.

$$5.0 \times 10^{16} \text{ cm}^{-2} \leq x_{He}D < 1.5 \times 10^{17} \text{ cm}^{-2} \tag{2}$$

A summary of the data used to derive these relationships is reproduced in FIG. 3. As was noted in the previous paragraph the prescribed dose may be insufficient to cause exfoliation of a full thin film without bonding to a handle substrate with a CTE that differs from sapphire.

FIG. 3 also illustrates a window for implantation that consists of a super-critical H range where the fraction of hydrogen in the implant could produce exfoliation in the absence of the co-implanted He. In fact, this condition ranges all the way down to a H-only exfoliation process. The window for implantation ranges up to $2.5 \times 10^{17}$ cm$^{-2}$ and down to the limit defined by equation 1, with the modification that the dose window is defined for the range of the product $(1-x_{He})D$ being greater than $1.25 \times 10^{17}$ cm$^{-2}$.

A high energy implant is preferably used for transfer of sapphire onto molybdenum, aluminum nitride, or other lower CTE materials as compared to sapphire, in order to create a thin transferred layer that is sufficiently mechanically robust that it does not buckle once the high pressure bond step is complete. In sapphire layer transfer, this buckling can be driven by a number of factors as described next.

First, as a result of using a high implantation dose for sapphire for layer transfer, the damaged region in the upper part of the thin transferred layer following layer transfer but prior to damage removal is under a high degree of compressive stress relative to the lower undamaged portions of the thin transferred layer. As a result, there is a significant stress gradient from the top surface of the thin transferred layer to the bottom bonded region. This stress gradient results in an energy potential that can drive buckling in the thin transferred layer.

Second, sapphire's high modulus can result in non-uniformities in the bond strength between the sapphire thin layer and the handle substrate. These non-uniformities are caused by failure of the sapphire source substrate to flex and match the shape of the underlying handle substrate.

Preferably, the transferred sapphire layer thickness is about 800 nm or greater, such as 800 nm to 1200 nm. Other thicknesses can also be used. An 800 nm thin transferred layer is sufficiently thick to prevent buckling. This 800 nm thin layer is approximately 200 nm thicker than what would be required to generate a film of target thickness 300 nm with a 300 nm buffer for damage removal.

Figure 4:
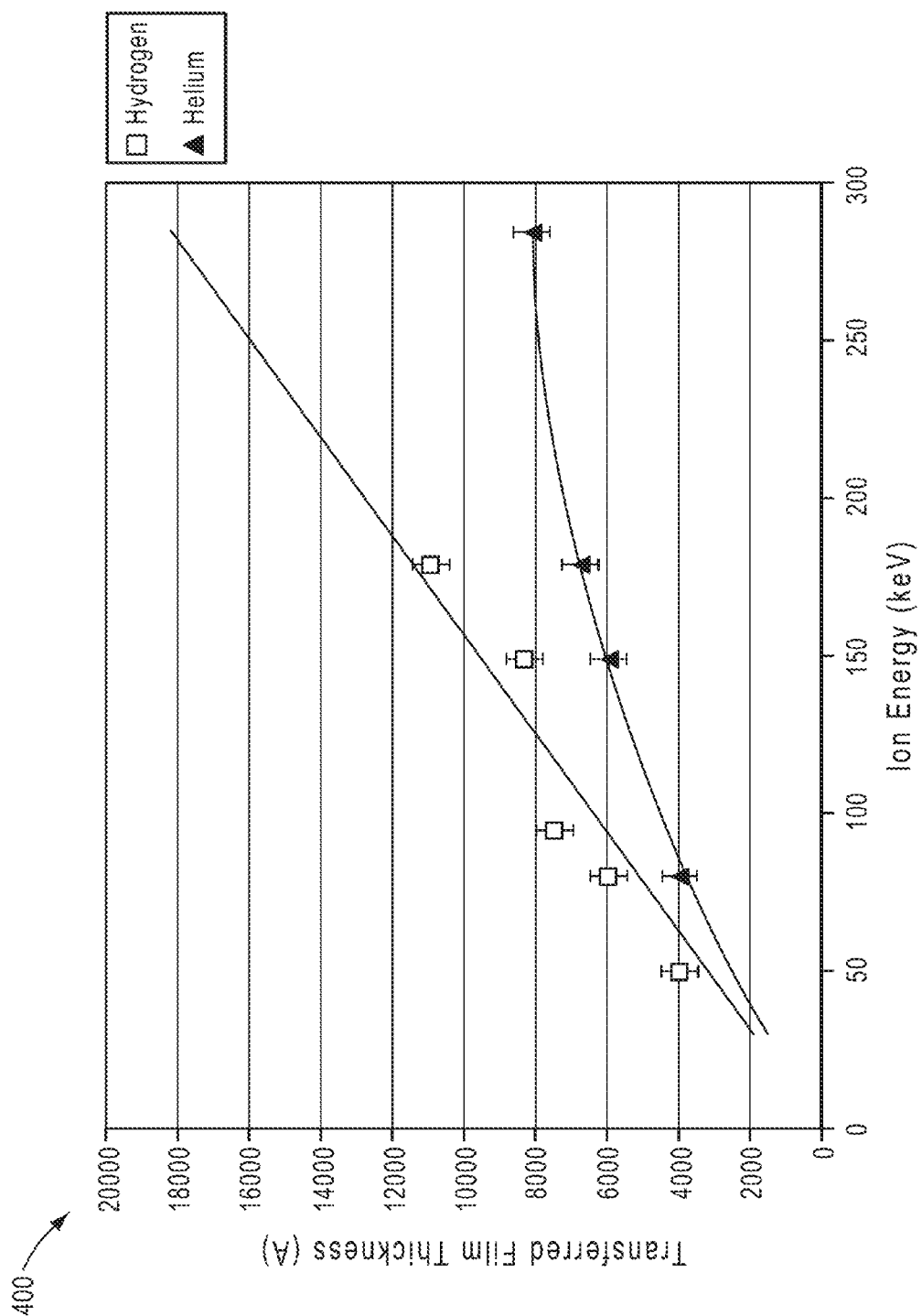
FIG. 4 is a diagram that shows the transferred layer thickness as a function of energy for H$^+$ and He$^+$ implantation.

Thin transferred layers of thickness 800 nm or greater can be achieved by implanting $H^+$ at an energy of at least 140 keV and $He^+$ at an energy of at least 280 keV. The relationship between ion energy and peak depth is illustrated in FIG. 4. When adjusting the thickness of the thin transferred layer by adjusting the ion energy of the implant, the dose is also adjusted so that the peak concentration is sufficiently high to lead to exfoliation. This can be done by taking a known functional dose at an established energy and using a TRIM simulation (the Transport of Ion in Matter, a software simulation program by James F. Ziegler) at the established energy to generate a predicted peak concentration of the implanted species at the end of range for the known functional dose. A second TRIM simulation at the new energy gives an estimate of the peak concentration per dose unit. Dividing the predicted peak concentration for the functional dose by the TRIM estimated concentration per unit dose at the new energy gives the required dose at the new energy.

The effect of other ions on the properties of sapphire have been studied in the literature, including light ions such as $N^+$, $O^+$, and $Ar^+$. Also, heavier ions such as $Br^+$ as well as transition metal ions have been studied. At a sufficiently high dose, all of these ions have been shown to induce blistering of the implanted sapphire, and thus offer potential paths to exfoliation process improvement. Of particular interest are $O^+$ and $F^+$. By implanting sapphire with $O^+$ the local stoichiometry at the end of the implanted range will be altered leading to a high density of interstitial and bond centered oxygen species. To ensure that the end of range is deep enough to enable the transfer of a layer that is sufficiently thick to be prepared for subsequent growth, the ion energy for both $O^+$ and $F^+$ should preferably be at least 160 keV resulting in a TRIM-predicted implant depth of approximately 200 nm. The upper limit of implantation energy is governed by the availability of implanters with sufficiently high current with implantation energies exceeding 400 keV being desirable. Because of the relative decrease in the diffusivity of oxygen and fluorine in the sapphire lattice and the increased damage per ion caused by $O^+$ and $F^+$ ions relative to $H^+$ and $He^+$, implantation at an elevated substrate temperature is desirable to facilitate dynamic damage annealing during the implant to prevent excessive buildup of vacancies and interstitial atoms and ultimately amorphization in the implanted sapphire. Preferably, the implantation of $O^+$ and/or $F^+$ should be conducted at a sapphire temperature of at least 250 degrees Celsius. $O^+$ and/or $F^+$ implantation at high dose ($>1 \times 10^{17}$ cm$^{-2}$) should provide sufficient internal pressure and implanted gas atoms to induce exfoliation in the absence of H or He. At lower doses ($1\times10^{16}$ to $1\times10^{17}$ cm$^{-2}$) O$^+$ and/or F$^+$ implantation should modify the mechanical and chemical properties at the end of the implanted range in such a way the subsequent implantation with H$^+$ and/or He$^+$ to a dose sufficient to induce exfoliation ($>1\times10^{17}$ cm$^{-2}$) will result in an exfoliation process with improved exfoliation kinetics. Thus, by implanting with O$^+$ and/or F$^+$ followed by implantation with H$^+$ and/or He$^+$ it is anticipated that the degree of exfoliation at a given temperature will be increased and that the temperature at which the onset of exfoliation begins will be reduced relative to implantation of H$^+$ and/or He$^+$ alone.

Optionally, the sapphire substrate temperature can be increased during ion implantation by thermally isolating the substrate as described in the previous section. In general, the transferred layer may be 200 nm to 2000 nm thick, such as 800 nm to 1200 nm thick. After the transferred layer is planarized by polishing and/or etching to form the thin layer 12 shown in FIG. 2H, the thickness of the thin layer 12 in the intermediate substrate is reduced to about 50 nm to about 1000 nm, such as about 200 nm to about 800 nm. However, the thin layer 12 may have greater or lesser thickness than described above, depending on the desired application and other process parameters.

It should be noted that the crystalline structure of the source wafer and corresponding transferred thin layer may be off-axis from the conventional (0001) axis. In particular, a small angular deviation from (0001) axis between 0 and 3 degrees, such as 0.5 to 3 degrees, may be favorable for two-dimensional layer-by-layer growth of InGaN, AlGaN and GaN by MOCVD. The layer-by-layer growth would result in smoother growth morphology and reduced defect generation from lattice-mismatch strain in heterostructure growths such as Al-rich AlGaN on GaN.

The source wafer may be treated in a variety of ways to improve the efficacy of the layer transfer process. One method that may be used is the deposition of a protective layer applied to the surface of the substrate to prevent roughening or contamination of the surface during the implantation process. SiO$_2$ is one material that may be used. The protective layer may comprise the same layer as the bonding layer 13 described herein. Alternatively, the protective layer may comprise a sacrificial protective layer which is deposited on the source wafer before the implantation step and is then removed after the implantation is conducted through this layer. The bonding layer is then deposited on the source wafer after the removal of the sacrificial protective layer.

Another method that may be used is the deposition of an optically reflective layer on the front, back, or both sides of the source wafer. In the case of implantation into a sapphire source substrate or layer, a deposited Al layer of about 50 nm thickness reduces the dose required to achieve blistering. It is thought that by placing a film that is reflective on either or both surfaces of the substrate, the optical transparency of the substrate can be used to trap energy radiatively emitted from the defects formed at the end of the implant range. This in turn traps energy in the substrate by making radiative emission of the implant power less efficient. Thus, the substrate temperature rises to allow radiation and conduction from the outer surface of the substrate. While a thin Al films successfully improves the blistering behavior of the sapphire, the modified process should work with any thin film that is significantly reflective at the wavelength of emission from the subsurface defects. Thus, other reflective materials having a different thickness than 50 nm, such as 30 to 100 nm, may also be used. The reflective film should be sufficiently thick to be optically reflective but not so thick that it contributes significant stopping power against the impinging beam. The thin reflective film should also be conveniently removable following implantation. As is known in the art, such removal can be accomplished for example by a selective wet chemical etch or dry etching technique such as reactive ion etching. It should also be noted that while this technique improves the exfoliation behavior of sapphire, it may also improve the exfoliation of a variety of other semiconductor materials that have a wide bandgap, such as freestanding GaN, GaN on sapphire, SiC, diamond, and any III-nitride on sapphire or in freestanding form. The reflective layer may be a sacrificial layer which is removed after the implantation step or it may be retained during the bonding step.

Another method that may be used to improve the efficacy of the layer transfer process is to deposit a film of material to the source wafer that will decrease the likelihood of the thin layer developing cracks during the exfoliation process (i.e., an anti-cracking layer). Such a layer reduces the likelihood of cracks developing in the thin layer that would prevent transfer of large contiguous films. Suppression of cracks is particularly important in cases where CTE differences between the source wafer material and handle substrate material are driving the exfoliation. Furthermore, in source wafers such as freestanding GaN that may have defects present in their structure as provided, the use of an anti-cracking layer to stiffen the source wafer is of particular importance. The anti-cracking layer used to stabilize the source wafer can either be a thick, low stress material deposited by standard processing techniques such as CVD or sputtering or the film can actually be a flat, rigid substrate integrated with the substrate by wafer bonding with bonding layers or an adhesive. The material of the anti-cracking layer may comprise silicon oxide, silicon nitride, polycrystalline aluminum nitride or other suitable materials. In the case that the freestanding GaN has a large number of nucleation sites for substrate fracture as grown, completely inhibiting fracture in the GaN during bonding may be impossible. However, if the GaN is bonded to a stabilizing film or substrate, these fractures may be inhibited from entering that film or substrate. Thus, the freestanding GaN would retain its usefulness as a source wafer for the repeated transfer of many thin layers. The anti-cracking layer may be a sacrificial layer which is removed after the implantation step or it may be retained during the bonding step.

In another method, a layer of material may be deposited onto the source wafer and treated to improve the strength of the bond between the source wafer and handle substrate. This method may be performed before or after the implantation of the source wafer. In one preferred implementation, the deposited material is SiO$_2$ (i.e., the bonding layer 13) and the treatment is chemical-mechanical polishing. Each of the methods described above may be used alone or in combination with the other methods.

Figure 2C:
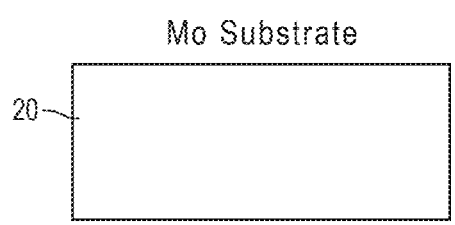

In FIG. 2C, thermally conductive materials with high melting point and similar or slightly higher or slightly lower thermal expansion coefficient as the thin layer 12 and/or source wafer 10 are preferably used as handle (also known as "support") substrate 20. The handle substrate 20 is also preferably compatible with the growth ambient encountered in the subsequent epitaxial growth, though this compatibility may be brought about by surface treatments following the transfer of the thin layer 12 from the source wafer 10. Furthermore, the handle substrate 20 should not decompose or produce contaminants that would have a substantial deleterious effect on subsequent epitaxial growth. For nitride semiconductors, the CTE of the handle substrate 20 is preferably in the range of $4$-$8 \times 10^{-6}$/K (averaged between room temperature and the temperature at which epitaxial growth of the GaN layer occurs) for compatibility with transferred thin layer 12 and source wafer 10. In certain embodiments, the CTE of non-gallium-nitride handle substrate 20 is in the range of $4$-$8 \times 10^{-6}$/K, averaged between room temperature and 1000 degrees Celsius. In certain embodiments, the CTE of non-gallium-nitride handle substrate 20 is in the range of $4$-$8 \times 10^{-6}$/K, averaged between room temperature and 700 degrees Celsius. In certain embodiments, the CTE of non-gallium-nitride handle substrate 20 is in the the range of $5$-$7 \times 10^{-6}$/K, averaged between room temperature and 700 degrees Celsius. In certain embodiments, the CTE of non-gallium-nitride handle substrate 20 is in the range of $5.5$-$6.5 \times 10^{-6}$/K, averaged between room temperature and 700 degrees Celsius. Setting the coefficient of linear thermal expansion of the handle substrate 20 in the above range can prevent stress-induced bowing or cracking of the semiconductor light-emitting device structure or the source wafer 10, and increase the production yield and long-term reliability of the semiconductor light-emitting device. More preferably the CTE of the handle substrate 20, averaged over the temperature range between room temperature and the temperature at which epitaxial growth of the device structure occurs, is engineered to be between 0% and 25% higher than that of GaN, averaged over the same temperature range. If the growth temperature is 1000 degrees Celsius, this corresponds approximately to a range of $5.2$-$6.3 \times 10^{-6}$/K, based on current measurements of the GaN temperature-dependent CTE available in the literature. Setting the CTE of the handle substrate 20 in this range can reduce or prevent the formation of cracks in the GaN device layers, which are known to form upon cooling after growth when the device layers are grown on substrates having a CTE that is significantly lower than GaN.

The material of the handle substrate 20 should be chosen such that the handle substrate 20 can be readily removed, as by chemical etching, without affecting the light-emitting device structure or the final substrate 50. For the thin layer 12 and source wafer 10 comprising $Al_zGa_{1-z}N$ or GaN, a handle substrate 20 preferably comprises the element molybdenum (Mo) or alloys of Mo. Mo is known to have a CTE of approximately $5.8 \times 10^{-6}$/K, when averaged over the temperature range of 20 degrees Celsius and 1000 degrees Celsius. More preferably the alloy of Mo is chosen such that its recrystallization temperature exceeds the maximum temperature of the wafer during the growth process. If the recrystallization temperature is exceeded during processing, grain growth can occur in the Mo substrate resulting in changes in the stress state of the material, and embrittlement of the material after it is subsequently cooled. Doping of Mo with Titanium and Zirconium to produce what is commercially referred to as TZM, is known to increase the recrystallization temperature relative to Mo to the range of 1200 degrees Celsius to 1400 degrees Celsius, which is 200 degrees Celsius to 300 degrees Celsius higher than the recrystallization temperature of elemental Mo and 100 degrees Celsius to 600 degrees Celsius higher than the epitaxial growth temperature. TZM is a dilute alloy of Mo (greater than 98% and preferably at least 99%), Ti (between 0.2% and 1.0%), Zr (between 0% and 0.3%), and C (between 0% and 0.1%). Optionally, doping of Mo with small amounts (approximately 1%) of lanthanum oxide is known to increase the recrystallization temperature to the range of 1300 degrees Celsius to 1500 degrees Celsius. Preferably the material for the handle substrate 20 is TZM.

The values of CTE reported for GaN in the literature are imprecise at room temperature and through the range of temperatures used for processing the wafer-bonded structures described herein. Additionally, the CTE of Mo and other candidate substrate materials is not precisely known either. Because of the imprecision in the known values of CTE, the handle substrate can be further optimized through experimental iteration by the modification of the CTE of the substrate material. To accomplish this, an alloy of Mo and tungsten (W) can be engineered to minimize the CTE-mismatch stress and associated risk of fracture or delamination in the bonded GaN/MoW substrate pair in thermal cycling prior to and during the exfoliation process. Similarly the MoW composition can be selected to minimize the stress-induced bow in the GaN/MoW substrates and associated temperature non-uniformities during growth, and to minimize cracking in the device layers after growth. Preferably a composition of MoW is selected which optimizes the yield of the exfoliation step and also optimizes the film growth quality and device performance through minimization or elimination of growth temperature non-uniformities and post-growth cracking W is known to have a CTE of approximately $4.9 \times 10^{-6}$/K, when averaged from 20 degrees Celsius to 1000 degrees Celsius. The CTE of alloys of MoW, averaged over this temperature range, can therefore be engineered to fall in the range of $4.9 \times 10^{-6}$/K and $5.8 \times 10^{-6}$/K. Such alloys containing 0-50 atomic percent W are commercially available. In particular, Mo alloy 366 as defined in ASTM Designation B-386-03 comprises a Mo-30% W alloy. Because the recrystallization temperature of W falls in the range of 1150 degrees Celsius to 1350 degrees Celsius, MoW alloys are expected to have higher recrystallization temperatures than pure Mo. Furthermore, as was described above, the recrystallization temperature of these CTE-optimized MoW substrates can be increased further by the inclusion of dopants such as Ti or lanthanum oxide. In general, the handle substrate material may be selected to be closely CTE matched to the epitaxial III-nitride layer to be grown on the intermediate substrate. For example, the difference in CTE of the handle substrate and the III-nitride layer may be less than 20%, such 0 to 10%.

Handle substrates 20 comprising Mo or alloys of Mo can be produced in any number of ways from various forms of raw material. Generally the raw material is formed from fine powders of the constituent elements. These powders can be made into simple forms such as plate or rod, using powder metallurgy techniques such as press-and-sinter, hot isostatic pressing (HIP), or metal injection molding (MIM). Vacuum arc casting is another commonly used technique which can produce material having a lower porosity and lower concentration of inclusions and impurities, than material formed using powder metallurgy techniques. Alternative techniques such as plasma activated sintering, microwave sintering, and plasma pressure consolidation may also be used. Thin sheet material is obtained using rolling techniques as are known in the art, which may include annealing steps to remove stress induced by the rolling process. Preferably the material is cross-rolled to obtain superior machining characteristics. The raw material can be formed into the final substrate shape, using any number of techniques know in the art, including electrical discharge machining (EDM) wire cutting, water jet cutting, electrochemical etching, laser cutting, die-stamping, and conventional machining techniques such as milling, sawing and facing. Generally high-speed machining tools such as tungsten-carbide tools are required for conventional machining of Mo and its alloys.

Each material form and machining technique has specific cost and performance considerations. For example, rolled sheet of powder metallurgy Mo or TZM is readily available, inexpensive, and easily cut to shape, whereas vacuum arc cast material is known to be amenable to polishing to a mirror surface finish, owing to its low porosity and low inclusion concentration. High temperature cutting techniques such as EDM wire cutting and laser cutting must be employed with care, because the cut surfaces will be left in a brittle and stressed state due to the recrystallization that occurs during the cutting process. To avoid problems associated with recrystallization, low temperature cutting techniques such as electrochemical etching, water jet cutting, die-stamping, or conventional machining techniques can be used. Preferably, the substrates are cut from rolled sheet using electrochemical etching, milling, EDM wire cutting, die-stamping or water jet. In the case of EDM wire cutting, care must be taken to remove surface contamination if brass EDM wire is used, or optionally Mo EDM wire may be used. Owing to its batch-processing nature, it is expected that electrochemical etching can offer considerable cost advantages in mass-production. In this case a chemically-resistant mask can be applied to the sheet material. The mask can be a blanket film that is subsequently patterned using photolithographic or other patterning techniques, or the desired pattern can be preformed into the mask as it is applied. The rolled sheet preferably has a thickness of between 250 microns and 2 mm, and the substrate shape is preferably a disc with a diameter selected to be between 25 mm and 150 mm. Larger diameter discs may also be used. Preferably the rolled sheet is between 20% and 200% thicker than the final handle substrate, to allow for material removal during the grinding and lapping steps described below. Optionally the substrates can be fabricated by cutting discs from a rod, wherein said rod has been formed by powder metallurgy or preferably by vacuum arc casting, and wherein said rod has a diameter substantially equal to the desired diameter of the final substrate. EDM wire cutting, water jet cutting or conventional sawing and facing techniques can be used. Preferably water jet cutting or conventional sawing and facing techniques are used, because the EDM wire cutting is expected to leave a brittle surface which is not amenable to polishing to a low roughness finish. Optionally the discs can be tumbled after cutting to round the edges and remove any burrs from the discs.

The flatness of the handle substrates is such that the amount of warp across the handle substrate should not exceed 0.1% of the handle substrate diameter, and preferably should not exceed 0.02%. Warp is herein defined as the sum of the maximum positive and maximum negative deviation of the substrate top surface from an imaginary flat plane, where the imaginary flat plane is selected to be that plane which intersects the substrate top surface and minimizes the magnitude of the warp. In the case of discs cut from rod, this flatness can be obtained using conventional machining and/or EDM wire cutting techniques. Optionally, in the case of discs cut from rod, and preferably in the case of discs cut from rolled sheet, conventional mechanical and/or chemical-mechanical lapping and grinding techniques known in the art may be used to obtain the desired flatness. Preferably both sides of the handle substrate are ground and/or lapped in order to minimize stress-induced bowing of the handle substrate. Optionally, a fixed abrasive grinding and/or lapping technique are used in order to minimize the production of pits in the surfaces. Additionally, the top surface and optionally the bottom surface of the handle substrate can be polished in order to obtain a smooth surface finish. Polishing of the bottom surface may be required in order to minimize bowing of the handle substrate. Preferably to minimize stress asymmetries and optimize the flatness of the handle substrates, double-disk processes as are known in the art are used throughout the grinding, lapping and polishing steps. Double-disk processes are those which simultaneously grind, lap, or polish the top and bottom surfaces of the substrate. Optionally for the case of handle substrates made from rolled sheet, the sheet material can be stress-relieved prior to grinding and/or prior to lapping and/or prior to polishing, in order to remove stresses in the material associated with the cold working. For the case of handle substrates comprising TZM, the stress relieving can be achieved by heating the material to a temperature between 1050 degrees Celsius and 1250 degrees Celsius for a time between 30 minutes and 120 minutes. Preferably the stress relieving procedure is performed in vacuum, hydrogen-assisted vacuum, or in an inert gas or reducing environment to prevent oxidation of the exposed TZM surface. Optionally the sheet material can be flattened by performing a stress relieving anneal while the sheet material is sandwiched between two flat surfaces and a pressure is supplied by means of a weight, clamp or other methods. This flattening procedure can be performed after any of the grinding, lapping and/or polishing steps, or it can be performed on the rolled sheet material before it is cut into discs. Preferably the edges of the top surface and optionally the bottom surface of the handle substrate are chamfered or rounded to facilitate handling and to minimize polishing scratches associated with fragmentation of the handle substrate edges during polishing. A chamfer or edge-round can be provided using conventional machining, tumbling, or edge-grinding techniques as are known in the art. Preferably the top surface after polishing has a peak-to-valley roughness of less than one micron.

Optionally, additional layers of material may be deposited directly on the top surface either after lapping or after polishing, and this additional layer can be further polished. This film can be deposited using techniques known in the art such as electron-beam evaporation, magnetron sputtering, and chemical vapor deposition techniques. As is known in the art, such vacuum-deposited films can be polished to a low micro-roughness surface finish. The additional layer material is selected for its polishing and adhesion properties, its CTE match with the substrate, and/or other performance characteristics such as its high-temperature stability and its reflectivity, and is preferably comprised of an amorphous film—or a film with a much finer polycrystalline grain size relative to the Mo substrate—of Mo, W, Rh, or TZM. More preferably, the film is comprised of TZM or Mo and is deposited using magnetron sputtering. The film thickness is preferably selected to be in the range of 2 to 5 times the peak-to-valley roughness of the top surface. Preferably, the film thickness is in the range of 0.5 microns to 5 microns. If high-purity materials are used in the deposition process, the deposited film can also serve as a diffusion barrier to Cu and other metallic impurities in the bulk Mo or Mo alloy substrate. This is both because the high-purity deposited film acts as a reservoir for metallic impurities from the bulk, and because the dense, preferably amorphous film does not feature crystalline grain boundaries that can act as diffusion paths for efficient migration of impurities to the outer surface of the Mo substrate.

Alternatively the handle substrate material comprises polycrystalline AlN (Poly-AlN). Poly-AlN can be formed using techniques known in the art such as tape-casting, hot-pressing, and press-and-sinter techniques. The material may also comprise a sintering aid such as yttria and/or calcium compounds which may be present at a concentration between 0.1% and 5% by weight and is used to promote adhesion of the AlN grains and increase the density and thermal conductivity of the sintered material. Optionally the sintering aid can be reduced or eliminated to minimize the possibility of contamination of the growth chamber and/or epitaxial device layers during the growth process as discussed below. In particular the level of calcium is preferably less than 25 ppm and more preferably less than 10 ppm. The average CTE of Poly-AlN over the temperature range 20 degrees Celsius-1000 degrees Celsius is approximately 5.6 ppm/K, and the thermal conductivity at room temperature is typically between 100 W/cm/K and 200 W/cm/K. Poly-AlN is commercially available in sheet form, and can be readily cut into disks using laser cutting or other techniques known in the art. Preferably the sheet thickness is between 0.25 mm and 2 mm and the disk diameter is between 50 mm and 150 mm. Larger diameter discs may also be used. Conventional grinding, lapping and polishing techniques as described previously can be used to obtain a substrate bow of less than 0.1% of the substrate diameter, and a RMS surface roughness of less than 50 nm. Optionally an edge chamfer or edge round is provided to the top surface or to both the top and bottom surface, in order to facilitate handling and polishing.

For the case that a molybdenum alloy or Poly-AlN handle substrate is used to form an intermediate substrate for HVPE growth of a III-nitride film, an encapsulating layer can be provided to protect the handle substrate material from the highly reactive halide compounds such as HCl and GaCl that are present in the HVPE growth process. The encapsulating layer comprises a film that covers at least exposed surfaces of the handle substrate. Candidate encapsulating layer materials comprise silicon dioxide, silicon nitride, silicon oxi-nitride, amorphous silicon carbide, aluminum oxi-nitride and alumina, and can be deposited by sputtering, plasma-enhanced CVD, low-pressure CVD, e-beam evaporation, or other techniques known in the art. Preferably the thickness of the encapsulating layer is between 50 nm and 2000 nm.

Other handle substrate materials comprise single-crystal semiconductor wafers that are commercially available and encapsulated single-crystal semiconductor wafers. Such semiconductor materials are chosen to have melting temperatures above the processing temperatures associated with the growth and fabrication of GaN-based devices. Preferably the melting temperature of the semiconductor substrate material is greater than 600 degrees Celsius and 1000 degrees Celsius for the case of GaN-based devices grown by MBE and MOCVD, respectively. The semiconductor materials are preferably chosen to have a CTE in the range of 5 ppm/K to 8 ppm/K when averaged over the temperature range of 20 degrees Celsius to 1000 degrees Celsius. Suitable semiconductor substrate materials comprise single-crystal wafers of GaAs, single-crystal wafers of GaP, and single-crystal wafers of InP, for which the melting temperatures are approximately 1240 degrees Celsius, 1460 degrees Celsius, and 1060 degrees Celsius, respectively. Preferably the single-crystal wafers are provided with an encapsulating layer to prevent decomposition of the crystal surface when the substrates are heated during the growth of the GaN device layers. Suitable encapsulating layers comprise PECVD or sputter deposited films of silicon dioxide, silicon nitride, silicon oxy-nitride, aluminum nitride, aluminum oxy-nitride, alumina, and silicon carbide. Preferably the thickness of the encapsulating film is between 50 nm and 2000 nm.

The handle substrates are engineered to be structurally stable in the growth environment at the growth temperature of the epitaxial device layers. Preferably, a structurally stable handle substrate is one for which the change in shape during heating to the growth temperature in the growth environment is such that the warp of the substrate at the growth temperature prior to epitaxial growth does not exceed 0.15% and more preferably does not exceed 0.05% of the handle substrate diameter. The handle substrates can be engineered to be structurally stable by selecting handle substrate materials that do not undergo bulk recrystallization, melting, or other phase changes at or below the growth temperature, and/or do not decompose in the growth environment at the growth temperature. In cases where the thickness or material properties of the handle substrate material are not adequate to maintain an acceptable level of warp during the growth process, a backside layer can be provided to the handle substrate such that a stress-thickness product in the backside layer at the growth temperature substantially balances the stress-thickness product in the epitaxial device layers and/or in the transfer layer. Suitable backside layers can comprise amorphous or poly-crystal films of silicon nitride, silicon dioxide, silicon oxy-nitride, aluminum nitride, aluminum oxy-nitride, alumina, silicon carbide or other materials selected for their CTE, thermal conductivity, ease of removal, cost, and/or chemical stability in the growth environment and at the growth temperature. These backside layers can be deposited by sputtering, CVD, PECVD, evaporation, or other methods as are known in the art.

The CTE of other handle substrate materials may be specifically engineered to match the CTE of GaN or other materials by altering the composition of the substrate material.

Figure 2D:
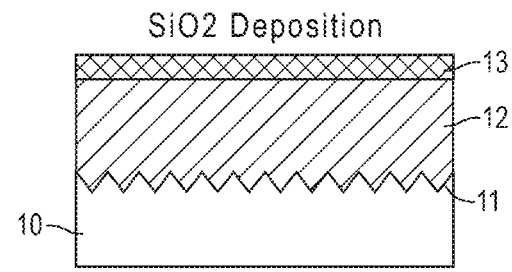

In FIGS. 2D and 2E, at least one surface of the thin layer 12 and/or handle substrate 20 is optionally provided with bonding layers 13, 21 in a manner known in the art. Such bonding layers may comprise $SiO_2$, $Si_3N_4$, $Al_2O_3$, AlN, Al-doped ZnO, or other materials known in the art. Optionally, the stoichiometry of the bonding layer can be modified to adjust the stability and chemical nature of the deposited layer. For example, by increasing the Si to N ratio in silicon nitride from the 3:4 ratio (i.e., by forming a silicon rich silicon nitride in which the Si:N ratio is greater than 3:4), the stress of the deposited layer is reduced and the resulting layer is better able to getter gas species outgassed from the bonded interface during thermal processing. Suitable bonding layer materials are subject to the requirements that they can be deposited with sufficient purity so as not to degrade the electrical performance of the finished device structure, are thermally stable to the growth temperature of the epitaxially grown device structure (for example, >1000 degrees Celsius), and can be polished to a low local micro-roughness (preferably <1.0 nm root-mean-square roughness between larger defects). These layers can be deposited by conventional techniques comprising electron-beam evaporation, sputter deposition, ion-assisted sputter deposition, chemical vapor deposition, plasma-enhanced chemical vapor deposition, and other techniques. The layers may also be alloyed with other materials or implanted to improve their thermal conductivity, electrical conductivity, or both.

The Mo or Mo-alloy may, optionally, be annealed prior to deposition of an adhesion layer or bonding layer and eventual bonding. In the case of Mo or a related handle substrate, this anneal step serves several purposes. First, it removes volatile surface oxides, organics, and other sources of contamination that may impact the adhesion of a deposited bonding layer. Additionally, depending upon the fabrication technique used to make the Mo or Mo-alloy substrates, the substrates may exhibit some slight porosity that leads to out-gassing at high temperatures. By performing a high temperature anneal above 800 degrees Celsius prior to further processing, the magnitude of out-gassing during subsequent high temperature processes such as epitaxial growth can be minimized. In this and all other high temperature thermal processing involving a Mo or Mo-alloy substrate subsequently described herein, the annealing ambient should be a non-oxidizing ambient, such as ultra-dry nitrogen, a hydrogen/nitrogen mixture, a vacuum, or another reducing environment known in the art to prevent oxidation and decomposition of the Mo substrate. This is particularly important for thermal processing at temperatures above 300 degrees Celsius. Optionally, an encapsulating layer can be provided to protect the Mo or Mo alloy handle substrate from oxidation. To increase the strength of the adhesion between the bonding layer and the handle substrate, an adhesion promoting film or adhesion layer can be deposited. For the case of a Mo or Mo alloy handle substrate, suitable adhesion layer materials comprise TiN, Ti, Cr, molybdenum silicide, any alloy of Mo, Si, C, and N, or another adhesion layer known in the art. As with the bonding layer material itself, the selection of the adhesion layer is subject to the requirements that the layer materials are thermally stable through the growth temperature of GaN, and that the constituents of the bonding layer do not diffuse into the GaN degrading the electrical properties of the active device structure. Preferably the adhesion layer comprises TiN or Ti and has a thickness of between 5 nm and 75 nm. Optionally the film comprises a multi-layer stack of TiN and Ti, such as a stack comprising between 0 nm and 30 nm TiN, 10 nm and 150 nm Ti, and 5 nm and 50 nm TiN. In order to improve the resistance of the adhesion layer to oxidation, the adhesion layer can comprise a TiAlN alloy, or a multilayer stack comprising TiN and AlN or Ti, TiN, Al, and AlN, where the total thickness of the stack is between 20 nm and 200 nm.

For the case of a handle substrate comprising Poly-AlN, impurities and/or the constituents of sintering aids such as yttrium, calcium, and aluminum, can be susceptible to diffusion and/or reaction with the bonding layer when the bonding layer is annealed above 800 degrees Celsius. In order to prevent such diffusion and/or chemical reactions from occurring, a diffusion barrier can be provided between the Poly-AlN top surface and the bonding layer. Candidate diffusion barrier materials comprise silicon nitride, amorphous silicon carbide, alumina, aluminum nitride, and titanium nitride, and can be deposited by sputtering, plasma-enhanced CVD, low-pressure CVD, e-beam evaporation, or other techniques known in the art. Preferably the thickness of the diffusion barrier layer is between 5 nm and 500 nm. Optionally an adhesion layer such as a layer of silicon dioxide or silicon carbide can be provided between the Poly-AlN handle substrate surface and the diffusion barrier. Preferably the adhesion layer is between 5 nm and 50 nm thick. It is possible that high vapor pressure elements such as calcium, and/or rapidly diffusing elements such as yttrium, can migrate from the Poly-AlN to the epitaxial device layer when the intermediate substrate is heated to the growth temperature, either by out-gassing of the elements into the growth chamber environment and subsequent deposition onto the growth surface, or by bulk diffusion into the epitaxial layers. Optionally the substrate can be fully encapsulated by the diffusion barrier material in order to prevent the migration of these elements to the growth chamber and/or to the epitaxial device layer.

During growth of III-nitride material on intermediate substrates comprising Poly-AlN, extraneous growth of the III-nitride material can occur on the exposed surfaces of the Poly-AlN handle substrate. This extraneous growth can be of poor quality and not suitable for device fabrication. In cases where the intermediate substrate comprises a thin transfer layer 12 that does not fully cover the top surface of the handle substrate, and/or where the edges of the handle substrate are exposed, an encapsulating layer can be provided to prevent extraneous growth of the III-nitride material on the exposed regions of the handle substrate. The encapsulating layer may comprise a diffusion barrier layer material, a bonding layer material, a combination of both a diffusion barrier and a bonding layer material, or a layer of another material selected for its resistance to extraneous growth, adhesion properties, stability at the growth temperature and in the growth environment, and resistance to chemical attack during pre-growth processing. Preferably the encapsulating layer material comprises silicon nitride, silicon dioxide, or silicon oxy-nitride.

Providing bonding layers 13 and 21 reduces the surface smoothness requirement of the thin layer 12 and/or handle substrate 20 due to the improved mechanical compliance of the bonding layer relative to GaN and Mo. Additionally, chemical-mechanical polishing of bonding layers 13, 21 to reduce the surface micro-roughness and thereby improve wafer bonding strengths is already known in the art and can be performed easily at low cost if needed, thus eliminating the costly polishing procedures for difficult-to-polish surfaces such as GaN or Mo.

Preferably, the deposited bonding layer can be densified prior to polishing, by annealing the film at a temperature between 200 and 1100 degrees Celsius to reduce the quantity of hydrogen and other gaseous species trapped in the bonding layer material prior to polishing the bonding layer. Additionally, by densifying the bonding layer material to a high temperature prior to polishing and subsequent bonding, the density of the deposited layer is increased, thus reducing the risk of buildup of stress in the bonding layer that may contribute to film adhesion instability during post-bonding processing. By performing this outgassing anneal prior to polishing, any stoichiometry loss at the surface of the bonding layer can be recovered by polishing away the surface material to leave a smooth (<1.0 nm rms-roughness) and homogeneous film. More preferably, the out-gassing anneal is conducted at a temperature above that necessary to ensure that out-gassing from the bonding layer during growth of the device structure at temperatures in excess of 1000 degrees Celsius do not lead to failure of the bonded interface resulting from gas accumulation. This temperature can be determined by a combination of secondary ion mass spectroscopy (SIMS) analysis and sample fabrication and stress testing. This out-gassing anneal process can be advantageously performed to reduce residual stresses in the bonding layer film, and additionally to reduce the concentration of trapped gas in the bonding layer. For the case where an adhesion layer is provided between the bonding layer and the handle substrate surface, annealing of the layer stack prior to polishing can advantageously promote the thermal stability of the adhesion layer. In particular, if a molybdenum alloy handle substrate such as TZM is used, and if an adhesion layer is provided that comprises a film of TiN, then the adhesion layer is susceptible to structural and chemical instabilities such as agglomeration and/or oxidation if it is heated to over 1000 degrees Celsius after the bonding layer has been polished. Annealing of the adhesion layer/bonding layer stack prior to polishing, at a temperature between 800 degrees Celsius and 1150 degrees Celsius for a period of between 5 minutes and 120 minutes, substantially reduces or eliminates any oxidation or agglomeration the adhesion layer during subsequent heating to over 1000 degrees Celsius after the bonding layer has been polished. In this way an adhesion layer comprising a film of TiN can be rendered thermally stable at temperatures over 1000 degrees Celsius, by performing an annealing step of the adhesion layer/bonding layer stack prior to polishing of the bonding layer.

For the case that the handle substrate comprises yttria-containing Poly-AlN and the bonding layer comprises silicon dioxide, Y—Al—O—Si compounds can form in localized regions of the bonding layer upon annealing above 1000 degrees Celsius. The presence of these compounds impacts the local polishing characteristics of the bonding layer and can result in shallow depressions in the polished bonding layer. In order to mitigate this effect, a diffusion barrier layer can be supplied as described above, or the densification temperature of the bonding layer prior to polishing can be selected to be at a temperature below which diffusion occurs. Preferably the densification temperature in this case is between 800 degrees Celsius and 1050 degrees Celsius. Optionally, the level of yttria sintering aid in the handle substrate material may be reduced in order to minimize the reaction of the sintering aid with the bonding layer. In cases where a diffusion barrier is not provided, or if the diffusion barrier is not adequate to prevent diffusion of yttrium and/or aluminum, and/or the densification temperature is not low enough to prevent the diffusion, the level of yttria in the handle substrate material is preferably less than 0.5% by weight. Optionally the Poly-AlN handle substrate can be formed by hot-pressing, which can require less sintering aid than tape-casting or press-and-sinter techniques. As noted above, a single layer can serve as a bonding layer, adhesion layer, diffusion barrier and/or encapsulating layer, depending on the material of the layer.

Not shown are other optional processes that may be incorporated to improve the quality of the bond between the thin transferred layer and the handle substrate. These processes include, but are not limited to an ion implantation that amorphizes the surface of thin transferred layer, thereby removing threading dislocations at the surface in the case of GaN material and smoothing the surface.

The surface of the bonding layer, the surface of the handle substrate, or both may also be treated, such as by etching, to increase their porosity. These pores are useful for allowing trapped gas and implanted species to diffuse away from the bonded interface.

Because of the relatively high cost of freestanding GaN substrates, minimizing potential yield losses during all processes involving the GaN substrate is desirable. To improve the mechanical integrity of the freestanding GaN substrate during bonding it may be advantageous to attach the substrate to a mechanical support substrate. Such a GaN/mechanical support structure would reduce the yield loss for stressful processing steps in the fabrication of a GaN/Mo intermediate substrate comprising ion implantation, bonding layer polishing, and reclaim of GaN substrate for producing more intermediate substrate. Perhaps most importantly a GaN/mechanical support structure will make the GaN substrate less susceptible to mechanical failure due to thermal stresses in the GaN and Mo or Mo alloy bonded pair that are induced by temperature excursions between the bond initiation temperature and the exfoliation and transfer of the thin GaN layer to the Mo or Mo alloy substrate. The risk of GaN fracture due to thermal stress induced in the bonded Mo/GaN structure can be further complicated by the possible presence of residual defects such as small cracks or polycrystalline inclusions in the freestanding GaN substrate. These defects in the freestanding GaN substrate could serve as nucleation sites for further fractures to occur. The mechanical support substrate should be selected to have a CTE very near that of GaN, for example within 0 to 20% of the CTE of GaN. Any significant deviation from the CTE of GaN should be a lower CTE, rather than a higher CTE. This will ensure that the GaN substrate is in compressive stress, making it less susceptible to cracking or fracture. Candidate materials for mechanical support substrate that meet these requirements comprise W and MoW alloys. Because these materials are metallic, they are less brittle than GaN and thereby less prone to fracture. The GaN substrate can be mounted to the mechanical support substrate using a material that is tolerant of the high temperatures experienced in the fabrication steps of the GaN/Mo intermediate substrate, in particular the exfoliation anneal. Candidate mounting materials include ceramic pastes, metallic films, and compliant oxides.

In FIG. 2F, the thin transferred layer 12 with the source wafer 10 is wafer bonded to the handle substrate 20. The wafer bonding can be achieved by direct wafer bonding, by bonding with optional bonding layers 13, 21, or by other well-known techniques as disclosed in "Semiconductor Wafer Bonding" by Q.-Y. Tong and U. Gosele.

Thermal stress, mechanical stress, or chemical etching are applied to the weak interface 11 after wafer bonding to exfoliate the thin layer 12 from the source wafer 10 as illustrated in FIG. 2G leaving the thin layer 12 bonded to the handle substrate 20. The source wafer 10 is preferably removed by thermal annealing which causes the weak interface 11 to break and results in exfoliation of the thin layer 12 from the source wafer 10.

When performing wafer bonding and layer transfer of a thin sapphire transferred layer 12 from a sapphire source wafer 10 to a handle substrate 20 that has been prepared as described in the previous section, the surfaces of both substrates are prepared by removing organic contamination with a solvent clean. Preferably, this process includes megasonic or ultra-sonic cleaning in acetone and methanol for a period of 10 seconds to 60 minutes, followed by a deionized water rinse. The surfaces are then dried by a combination of nitrogen blowing and spinning the sample. The surfaces of the substrates are then prepared for wafer bonding using a plasma surface activation with an Ar, $O_2$, $N_2$, or other plasma species. Preferably, the plasma treatment is performed with an atmospheric pressure plasma system using $O_2$ at a power of 200 to 400 W using a scanning plasma head for a total number of passes of 1 to 10 at a rate of 25 mm/s. At any point during the surface preparation, prior to loading the substrates into the bonding apparatus, a $CO_2$ particle removal technique can be applied to further clean the substrates prior to bonding. This consists of exposing the bonding surface to a jet of gas and solid phase $CO_2$ while maintaining the substrate temperature and ambient in such a way that condensation of moisture on the bonding surface is prevented. Preferably, the substrates are maintained at a temperature of at least 50° C. and are exposed to a $CO_2$ jet for longer than one second. The cleaned, prepared surfaces are then brought into contact at a controlled substrate temperature in a controlled gas ambient using a wafer bonding apparatus. Preferably, the bond initiation temperature is between room temperature and 400 degrees Celsius.

More preferably, the bond initiation temperature is between 150 and 350 degrees Celsius. Preferably, the bond ambient is a vacuum in the pressure range of $10^1$ to $10^{-6}$ torr. As is described in detail below, the insertion of a bond strengthening anneal at a temperature above the bond initiation temperature but below the exfoliation temperature can dramatically increase the bond strength prior to exfoliation. During bond initiation and thermal processing to transfer a thin sapphire film, the application of pressure normal to the bonded substrate surfaces increases the extent and stability of the transferred sapphire film. Preferably, this bonding pressure is between 0 and 20 MPa. More preferably, this bonding pressure is between 1 and 10 MPa. To complete the exfoliation of the thin sapphire film, the temperature of the wafer-bonded sapphire-handle structure is raised to a peak temperature between 450 to 600 degrees Celsius, depending on the implantation conditions of the sapphire. The duration of the exfoliation step is between 1 and 60 minutes depending on the exfoliation conditions.

When performing wafer bonding and layer transfer of a thin GaN layer 12 from a freestanding GaN source wafer 10 to a handle substrate 20 the wafer bonding and layer transfer process is similar as the process for transferring a thin film of sapphire described above with the following exceptions. The improved CTE-match between the GaN source wafer and the handle substrate allows the bond initiation temperature be lower, because the temperature excursion between bond initiation and layer exfoliation induces less strain on the wafer-bonded GaN-handle structure. Thus, bond initiation is preferably performed between room temperature and 250 degrees Celsius. More preferably, the bond is initiated at a temperature between 50 and 150 degrees Celsius. Because GaN is a more brittle material than sapphire, the pressure applied during the bonding thermal cycle is reduced. Preferably, the bond pressure is between 0 and 10 MPa. More preferably the bond pressure is between 0.5 and 5 MPa. Because the exfoliation kinetics for GaN are superior to sapphire, the exfoliation temperature can be lower, preferably ranging from 350 to 600 degrees Celsius.

The CTE-mismatch between sapphire and GaN (and hence any GaN CTE-matched handle substrate) presents challenges to wafer bonding and layer transfer. To minimize the impact of this CTE-mismatch, one of several alternative wafer bonding and layer transfer methods can be used.

The use of two wafer bonding and layer transfer steps along with first and second handle substrates can be used to fabricate the final intermediate substrate for GaN growth consisting of a transferred sapphire thin film bonded to the second handle substrate. The structure of the first handle substrate is such that the handle can be selectively removed from a sapphire thin film supported on the substrate following wafer bonding of the exposed face of the transferred sapphire thin film to a second handle substrate that is closely CTE-matched to GaN and preferably comprises TZM or Poly-AlN. This so called double-bond process would require the use of a sacrificial lateral etch layer in the first handle substrate to enable selective release of the sapphire film onto the second handle substrate. This etch layer should be selectively etched relative to the second handle substrate and the bonding layer used in the final intermediate substrate structure. Additionally, planarization and smoothing of the transferred sapphire thin film supported on the first handle substrate for wafer bonding may be performed. This can be done by deposition of a bonding layer and subsequent polishing as described above. As an alternative to the use of a sacrificial lateral etch layer, a transparent first handle substrate could be used in conjunction with a bonding layer that can be decomposed, ablated, or otherwise weakened through the use of an optical process such as laser irradiation. Preferably, the first handle substrate removal can be enabled by bonding the implanted sapphire source wafer to a material that is CTE-matched to sapphire, or has a CTE that is between GaN and sapphire. As an alternative to the lateral etch layer, the first handle substrate may be selectively etchable, grindable, or polishable relative to sapphire and the second handle substrate and bonding layer. Advantageously, by using a double-bond process the starting, epi-ready surface of the sapphire source wafer is exposed in the final intermediate substrate, easing the process of damage removal and preparation of the surface of the transferred layer for subsequent GaN growth.

An additional alternative wafer bonding approach to minimize the adverse impact of the CTE-mismatch between sapphire and GaN-CTE-matched handle substrates is to thin the sapphire source wafer to minimize the elastic strain energy during wafer bonding and layer transfer while simultaneously increasing the stress in the bonded sapphire wafer that is thought to assist in the exfoliation of the sapphire thin film. This can be done for sapphire as thin as 100 microns for R-plane oriented sapphire and 150 microns for C-plane sapphire. By supporting an even thinner sapphire source wafer of either R- or C-plane orientation on a mechanical handle substrate that is CTE-matched to the final handle substrate, the sapphire source material can be made even thinner. This could be accomplished by bonding a thinned sapphire source wafer to the same material as the final handle substrate using several strategies such as direct wafer bonding, adhesive bonding with a material known in the art comprised of BCB, spin-on glass, or other adhesive, or by eutectic bonding with a eutectic composition that is chosen to enable subsequent thermal processing without concern for debonding of the sapphire source wafer from the mechanical handle substrate. After the wafer is bonded to the mechanical handle substrate, a combination of grinding, lapping, and polishing can be used to further thin the source wafer, preferably to less than 50 microns thickness. More preferably, the source wafer would be further thinned to less than 25 microns. After thinning, the surface may require deposition of a bonding layer and subsequent polishing to prepare the surface for bonding. Preferably the final root-mean-square surface roughness is <1.0 nm.

Optionally, a sapphire transferred layer on a TZM or Poly-AlN handle substrate can be fabricated by bonding a thinned sapphire substrate to the handle. The sapphire can then be subsequently thinned by a combination of grinding, lapping, and polishing resulting in a thin film preferably thinner than 10 microns and more preferably thinner than 5 microns. Subsequent to the mechanical polishing of the sapphire, any subsurface lattice damage due to the polishing process can be removed by the use of a dry etch process to remove preferably at least 1 micron of sapphire.

Optionally, the wafer bonding and layer transfer step can include the use of pre-patterned handle substrates to allow local relaxation of the stress and strain caused by the CTE-mismatch between sapphire and the handle substrate. The patterned handle substrate would consist of a grid of etched trenches in the prepared bonding layer on the handle substrate. The depth of the trenches can be shallow, preferably greater than 5 nm deep. The width of the trenches can be selected to either leave an intact film above the trench following layer transfer and thinning or to leave an open trench with no sapphire film spanning the gap. As a general rule of thumb, if the trench width is narrower than the final thickness of the sapphire thin film (<200 nm) the sapphire will span the trench and remain intact.

Optionally, an alternative bonding and layer transfer process for transfer of sapphire thin films to a handle substrate could take advantage of the optical transparency of the sapphire substrate to selectively irradiate the bonded interface and the implantation-induced defect structures with a laser source to selectively anneal the implanted region of the bonded structure and improve the exfoliation kinetics of the sapphire while reducing the temperature excursion and associated elastic strain energy and stress that the full bonded structure undergoes. Lasers suitable for this process include CO, HF and DF operated in pulsed mode.

In the case of a mechanically rigid source wafer such as sapphire, there can be a propensity of the thin transferred layer to spontaneously peel away from the handle substrate or bonding layer, if a bonding layer has been deposited, following the layer transfer process. The rate at which the thin transferred layer peels away from the handle substrate can increase with the magnitude of the in-plane stress in the film. This stress can be introduced through damage induced during the implantation process and/or through CTE mismatch stress developed during the bonding and layer transfer process. It is also observed that the delamination of the film can be substantially accelerated if the film is exposed to a humid environment or is dipped in water. It is believed that the water acts to reduce the surface energy of the freshly exposed surfaces as the delamination proceeds, as has been reported earlier for bonded silicon wafers (see Tong, Q. Y. et. al. in Journal of the Electrochemical Society 139 (11) 1101-1102 (1992)). Thus, the thin transferred layer is preferably not exposed to a humid environment or water during processing steps immediately following layer transfer and the process preferably is conducted in a dehumidified environment.

The propensity of a transferred film to peel away from the bonding interface can be higher for layers such as sapphire whose surfaces are relatively chemically inert and stable against formation of covalent bonds with other surfaces. The inert nature of the surface can be caused for example by the presence of hydroxyl groups that chemically passivate the surface, or it can be due to the intrinsic bond strength of the covalently bonded source material. Furthermore the rigidity of the source wafer often prevents the bonding surfaces from coming into intimate contact under application of typical bonding pressures, which must be low enough to prevent fracture of the source wafer or handle substrate. In order to promote strong adhesion between such inert layers and the handle substrate, it is preferable to first deposit a bonding layer as described previously, onto the surface of the source wafer. Adhesion between the bonding layer and the source wafer surface can be enhanced by plasma activation of the wafer surface prior to deposition, as commonly occurs for example in the PECVD process for depositing $SiO_2$ or $Si_3N_4$ films. Thus, the bonding layer 13 may comprise silicon oxide, silicon nitride and/or aluminum nitride, which are deposited by a plasma-enhanced CVD process to simultaneously perform a plasma activation of the source wafer 10. Alternatively, a separate plasma activation treatment of the source wafer 10 may be performed prior to the deposition of the bonding layer 13. In this case, the bonding layer 13 may be deposited by a method other than PECVD. Optionally an adhesion layer is inserted between the bonding layer and the handle substrate. Preferably an annealing procedure is performed as described previously to densify the deposited bonding layer and further increase the adhesion strength. For the case of a bonding layer deposited on a sapphire source wafer, the annealing temperature is preferably between 600 degrees Celsius and 1000 degrees Celsius.

Additionally, by inserting a low-temperature bond-strengthening anneal step in the wafer bonding and layer transfer thermal cycle prior to the exfoliation of the transferred layer the stability and extent of the thin transferred layer on the handle substrate after bonding and exfoliation can be substantially improved. This is correlated to an increase in the bond strength during the low temperature anneal. This improves the bond strength at the time of exfoliation, improving the extent and uniformity of the exfoliation process. Furthermore, by transferring a more strongly bonded thin layer, buckling and fracture of the highly stressed thin transferred layer are less energetically favorable, leading to reduced buckling in later processing. The efficacy of the low-temperature bond-strengthening anneal is improved by increasing the temperature difference between the bond initiation temperature (that temperature at which pressure is applied to the sapphire-handle stack to initiate bonding) and the bond-strengthening anneal temperature. Preferably, bond initiation is performed at or below 150 degrees Celsius and the bond-strengthening anneal is conducted at 250 degrees Celsius or above for at least 30 minutes. Increasing the duration of the bond-strengthening anneal results in improved bond strength between the sapphire and the handle substrate with a saturation of bond strength generally being reached within 20 hours of bond initiation. However, maximizing the difference between the bond initiation temperature and the bond-strengthening anneal temperature reduces the time required to reach an acceptable bond strengthening. The bond-strengthening anneal can be conducted with or without an applied pressure. By annealing without an applied pressure, a simple batch furnace process can be used to perform the bond strengthening anneal improving process throughput, reducing capital equipment costs, and resulting in a more manufacturable process.

In some cases it will be desirable to bond the handle substrate to the bare surface of the source wafer. Optionally an adhesion layer and preferably a bonding layer are first deposited on the handle substrate surface prior to bonding. In such cases where the bare surface of the source wafer is bonded to a handle substrate, or where the bare source wafer is bonded to the surface of a bonding layer deposited on a handle substrate, annealing steps can be performed following the layer transfer process in order to increase the strength of the bond. Such annealing steps can optimize the stability of the thin transferred layer against peeling and lift-off during subsequent process steps. Preferably an external pressure is applied normal to the surface of the thin transferred layer to prevent the thin layer from peeling during the annealing procedure. This pressure is preferably between 0.5 MPa and 50 MPa and more preferably between 1 MPa and 20 MPa. The application of this pressure on the thin transferred layer enables more efficient bonding than is possible with pressure applied prior to layer transfer, owing to the decreased rigidity of the thin transferred layer relative to the thick source wafer. Optionally a sheet of material that is slightly compressible is inserted between the point at which pressure is applied and the top surface of the thin transferred layer, in order to more efficiently distribute the pressure over the thin layer and facilitate intimate contact of the bonding surfaces. Suitable materials include graphite, mica, or any other material that is compressible in a direction normal to its surface and maintain mechanical rigidity in the directions parallel to the surface. The annealing temperature is selected to be in a range where substantial covalent bonding occurs between the surface of the thin transferred layer and the surface to which it is bonded. In the case of a thin sapphire layer wafer bonded to a silicon dioxide, silicon nitride, or aluminum nitride bonding layer, this temperature preferably falls in the range of between 500 degrees Celsius and 1400 degrees Celsius and is more preferably between 600 degrees Celsius and 1000 degrees Celsius. The duration of the annealing process is preferably between 10 minutes and 10 hours.

After the exfoliation, the source wafer 10 can be reused in subsequent repetition of the process by removing the ion implantation damage and roughness of the top surface of the source wafer 10 through the use of accepted semiconductor processing techniques such as chemical etching or chemical mechanical polishing. For thin layers transferred from the Ga-face of freestanding GaN substrate as the source wafer, hot KOH at 5 to 50% dilution in deionized water at a temperature between 25 degrees Celsius and 200 degrees Celsius, preferably between 40 degrees Celsius and 110 degrees Celsius, for a duration between 10 seconds and 60 minutes, depending on the dilution ratio and total implantation dose, preferentially etches the implantation-induced damage at the exfoliated surface of the GaN source wafer leaving a smooth surface that is suitable for bonding following the deposition and polishing of a bonding layer on the GaN source wafer and subsequent implantation of the structure, as described below. Cross-sectional TEM analysis shows that the wet etch with KOH does not completely remove subsurface damage. For this reason, if it is desirable to completely remove subsurface implantation damage, a polish step or a dry etch comprising RIE may be necessary to remove subsurface damage while maintaining planarity and smoothness. When using a caustic wet etch to selectively remove damaged GaN from the Ga-face, it is important to protect the N-face using an encapsulating film that is not etched by the wet etch chosen for the Ga-face. Preferably, the encapsulating film comprises silicon dioxide, silicon nitride, amorphous silicon carbide, aluminum oxide or some other material that is conveniently deposited using chemical vapor deposition (CVD), such as plasma-enhanced or low-pressure CVD, or physical deposition techniques, such as sputter deposition or thermal evaporation.

One related application of the Ga-face GaN reclaim process described above is as a planarizing step for the growth surface of related III-nitride semiconductors. By implanting to a depth that is much greater than the spatial separation and peak-to-valley magnitude of surface features on the substrate, the exfoliation is expected to be highly planar with about 10 nm of surface roughness. Subsequently, by applying a damage-selective wet etch, the exposed surface can be highly planarized and the roughness reduced. Further processing such as RIE can then be used to remove the subsurface implantation damage. A brief wet etch would then leave a surface that is considerably improved for III-Nitride growth. Preferably, the III-Nitride freestanding semiconductor is AlN and the implantation process consists of implanting with a dose sufficient to induce exfoliation to a depth of at least 500 nm followed by a wet etch in a KOH solution and a dry etch using a Cl-based RIE or ICP RIE step. As with GaN reclaim, it is desirable to protect the N-face of the AlN using a deposited encapsulating film.

For reusing freestanding GaN source wafer in the transfer of multiple thin layers from the N-face, a polishing process can be used to reduce the fracture-induced roughness of the N-face and to remove residual subsurface lattice damage caused by ion implantation. The polish process can be a strictly mechanical process using a polish pad and a slurry comprising silica, alumina, SiC, diamond, or other slurry abrasive suspended in water as known in the art. Alternatively, the chemistry of the suspending fluid can be adjusted to enhance the polish rate and improve the polish uniformity. Such modification chemistries comprise KOH, NaOCl, or other chemicals known to controllably etch the N-face of GaN. The polish process is also applicable to the Ga-face of GaN. The polish process can be optimized to enable direct bonding of the N-face of GaN to the handle substrate. Optionally, the N-face can be planarized by reducing the roughness of the N-face of the GaN to an acceptable level with an initial polish followed by the deposition, densification, and polishing of a bonding layer material as is further described in the previous section. Such a bonding layer comprises $SiO_2$, $Si_3N_4$ or other material conveniently deposited and polished. The bonding layer should be thin following the polish process to allow subsequent ion implantation to create a damaged layer as the weak interface at a depth sufficient to allow removal of damage implantation damage and reduction of the surface roughness prior to growth. Preferably, the post-polish bonding layer has a roughness of <0.5 nm, a thickness of <200 nm, and the implantation-induced damaged layer is at a depth >500 nm from the GaN-bonding layer interface. By producing many thin transferred layers 12 from the same source wafer 10, the cost contribution of source wafer 10 per light-emitting semiconductor device can be reduced substantially. The present cost of commercially available high-quality low-defect-density freestanding GaN or AN substrates is relatively high for use in manufacturing of high-brightness (HB) nitride semiconductor LEDs.

Similarly, for reusing sapphire source wafer in the transfer of multiple thin layers, a wet etch treatment can be used to reduce the fracture-induced roughness of the weak interface after exfoliation, to remove residual subsurface lattice damage caused by ion implantation, and to remove by lift-off any small remnants of the thin layer remaining on the source wafer. The wet etch treatment preferably uses heated chemical solutions containing phosphoric acid or more preferably a heated ortho-phosphoric solution sold under the trade name of Transetch-N® The preferred temperature range of the heated chemical solution is 150 degrees Celsius to 220 degrees Celsius. The preferred treatment time ranges from 10 minutes to 2 hours. Following the chemical treatment, a high temperature anneal of the sapphire source wafer in the atmosphere is preferred. As is known in the art, for example in pages 8-12 of "Wide Energy Bandgap Electronic Devices" by F. Ren and J. C. Zolper, a high temperature anneal of the sapphire wafer surface at 1380 degrees Celsius for about 1 hour results in atomically flat surface on the sapphire wafer and readies the treated sapphire source wafer for reuse in the transfer of subsequent thin layer.

After exfoliation of the thin layer 12 from the source wafer 10, the surface at the weak interface 11 may be rough and may contain substantial lattice damage if ion implantation defined the weak interface 11. A smoothing or planarization step may be needed, comprising mechanical polishing, chemical mechanical polishing (CMP), or chemical etching of the surface of the thin transferred layer 12. High temperature thermal annealing is another option for smoothing the weak interface 11. As illustrated in FIG. 2H, the smoothing step removes surface damage and roughness and allows an improved surface 14 for subsequent epitaxial growth. Thus, an intermediate substrate 15 comprising the thin transferred layer 12 bonded to the handle substrate 20 is formed.

For thin transferred layer comprising GaN material, preferably the implantation damage on the Ga-face of the thin transferred layer in the weak interface 11 can be selectively removed after exfoliation of the thin transferred GaN layer 12 by using a wet chemical etch comprising a hot KOH:deionized water solution as disclosed in the earlier section on reusing source wafer. Using this etch, surfaces with a roughness below 1 nm are achieved. Furthermore, by using a very dilute solution, any threading dislocations present in the thin transferred layer would be preferentially etched at a slow enough rate to minimize formation of etch pits. Any etch pits formed would be very shallow with very low aspect ratio (<0.2). Preferably, the final thickness of the thin GaN layer should be 5 µm or less. More preferably, the final thickness of the thin GaN is between 50 and 1000 nm.

For thin transferred layer comprising sapphire material, preferably the implantation damage on the exposed surface at the weak interface 11 is removed after exfoliation of the thin transferred layer 12 by using inductively-coupled plasma reactive ion etching (ICP RIE) followed by wet chemical etch. With the following exemplary process parameters for an ICP RIE, a gas mixture of $BCl_3$ at 15 sccm and $Cl_2$ at 15 sccm, ICP power at 700 W, substrate power at 350 W, chamber pressure at 4 Pascal, and wafer chuck temperature at room temperature (20 degrees Celsius), the implantation damage is controllably removed at 20 to 30 nm/minute of etch time. Depending on the initial thickness of the thin transferred layer immediately after transfer and the desired final thickness, an appropriate amount of sapphire including implantation damage can be removed. Preferably the final thickness of the thin sapphire layer should be 5 microns or less to prevent cracking and of the thin sapphire layer during subsequent thermal cycling. More preferably, the final thickness of the thin sapphire layer is between 50 and 1000 nm. After etch in ICP RIE, preferably a wet chemical etch is used to remove residual subsurface lattice damage caused by ICP RIE. The wet etch treatment preferably uses heated chemical solutions containing phosphoric acid or more preferably a heated ortho-phosphoric solution sold under the trade name of Transetch-N® The preferred temperature range of the heated chemical solution is 150 degrees Celsius to 220 degrees Celsius. The preferred treatment time ranges from 10 minutes to 2 hours. After the wet etch treatment, the improved surface 14 is ready for epitaxial growth.

Figure 2I:
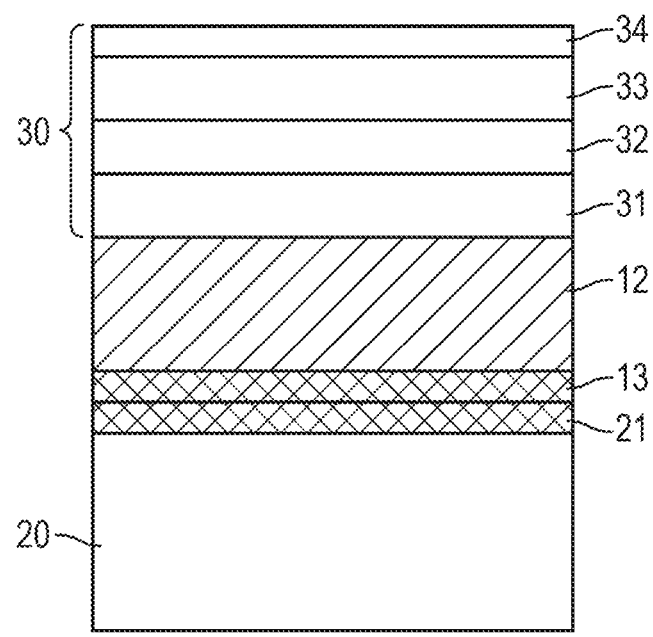

In FIG. 2I, one or more gallium-containing nitride layers 30 of the light-emitting device structure are preferably epitaxially deposited in a metal-organic chemical vapor deposition (MOCVD) reactor or a molecular beam epitaxy (MBE) chamber. Other epitaxial techniques can also be used to deposit the active layers 30, for example HVPE. One specific example of gallium-containing nitride layers 30 comprises an n-type $Al_xGa_{1-x}N$ cladding 31, an $In_yGa_{1-y}N$ active region 32, a p-type $Al_zGa_{1-z}N$ cladding 33, and a p-type GaN layer 34. Many other designs are possible and known in the art. In certain embodiments, only a single GaN epitaxial layer is deposited.

For intermediate substrate 15 comprising thin transferred sapphire layer, additional preparation steps during epitaxial growth would improve the quality of the active layers 30. Preferably, the MOCVD deposition of active layers 30 is preceded by a high temperature anneal in hydrogen (between 1000 degrees Celsius to 1200 degrees Celsius) for 5 to 20 minutes, a deposition of a thin layer of GaN at low temperature (500 degrees Celsius to 700 degrees Celsius with 10 to 100 nm nominal thickness), and a deposition of thick layer of GaN at normal growth temperature (1000 degrees Celsius to 1100 degrees Celsius with 0.5 micron to 5 micron nominal thickness). Alternatively, other preparation steps well known in the art of GaN growth on conventional bulk sapphire substrate can also be applied to the growth on the intermediate substrate comprising thin transferred sapphire layer according to the embodiments of the invention. Optionally, the growth surface of the thin transferred sapphire layer can be cleaned inside the MOCVD reactor by flowing HCl gas. Similarly, if the transferred layer comprises another non-GaN material such as silicon, a low-temperature nucleation layer and one or more stress-management layers are deposited prior to growing a high-temperature epitaxial GaN layer, according to methods that are known in the art.

The quality of gallium-containing nitride layers 30 grown on wafer-bonded intermediate substrates can be improved dramatically. The wafer-bonded intermediate substrate has the potential to improve the crystalline quality of high-temperature epitaxial growth by providing efficient thermal coupling to the wafer susceptor in the growth process. Compared to conventional substrates such as sapphire, the Mo-based substrate will offer more effective radiative coupling to the wafer susceptor and will provide significantly better temperature control and temperature uniformity over the wafer surface. The use of an optically reflective handle substrate such as a Mo-based substrate, or an encapsulated single crystal substrate comprising GaAs or InP, will enable the use of commercially available in situ monitoring techniques as are known in the art, such as emissivity-corrected pyrometry. Access to such in situ monitoring techniques will enable improved control over critical growth parameters such as wafer temperature, relative to growth on optically transparent substrates such as sapphire for which such techniques are not readily available. Thus, one aspect of the invention provides a method in which properties of the intermediate substrate and/or the active layer(s) are optically monitored before and/or during the growth of the active layer(s). The optical monitoring comprises reflectance monitoring from a reflective handle substrate, such as emissivity-corrected pyrometry, and the property monitored may comprise the intermediate substrate temperature or other suitable properties. The method may also comprise controlling or changing the active layer growth parameters, such as the growth temperature of the wafer susceptor, furnace or other heating device(s) and/or the reactant flow rate(s), such as gas flow rate(s) in a CVD process.

The better match in CTE between GaN and Mo relative to GaN and sapphire also improves crystal quality by reducing wafer bow and stress during growth. The reduced wafer stress may minimize the creation of new crystal defects resulting from stress-induced plastic deformation during temperature excursions at elevated growth temperatures and wafer cool down. The thickness of the GaN buffer layer grown on conventional substrates comprising sapphire or SiC can be reduced substantially on the intermediate substrate according to the embodiments of the invention and results in cost savings from shorter growth time and less material consumed. The reduced wafer bow would allow higher uniformity in the grown active layers 30 in terms of layer thickness, material composition, and material strain by providing more uniform thermal contact between the substrate and the wafer susceptor. The higher growth uniformity would enable higher production yields and better reliability of the light-emitting devices according to the embodiments of the invention. Reduced wafer stress also eliminates the need for additional complicated buffer or interlayer structures incorporated into the epitaxial growth to prevent cracking or defect generation in the epitaxial layers during temperature excursions, such as the example described by S. Raghavan et al. in "Effect of AlN interlayers on growth stress in GaN layers deposited on (111) Si," Appl. Phys. Lett. 87, 142101 (2005).

Figure 5:
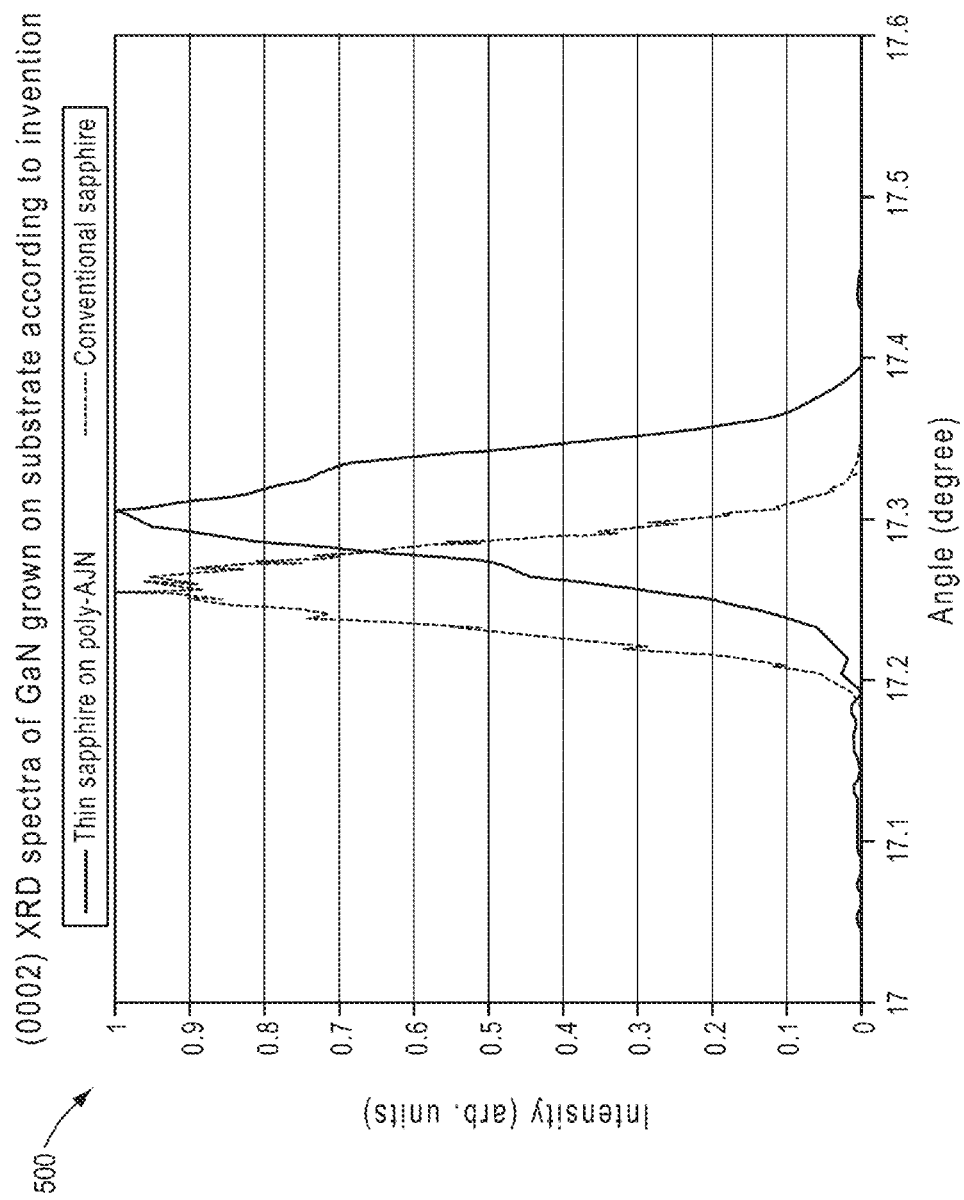
FIG. 5 is a diagram that shows the X-ray diffraction spectra of an epitaxial GaN layer grown on a thin sapphire layer on a poly-AlN handle substrate according to an embodiment of the invention.

To serve as an example, an epitaxial growth of GaN was performed on the intermediate substrate according to the embodiments of the invention comprising thin transferred sapphire layer and poly-crystalline AlN handle substrate. The epitaxial growth was performed in a horizontal-flow MOCVD reactor with radio-frequency (RF) heated wafer susceptor. The hydrogen anneal, low-temperature GaN, and thick GaN steps were performed and the resulting GaN material was analyzed. The x-ray diffraction spectrum of the GaN sample at room temperature is shown in FIG. 5 as a continuous curve. A reference GaN material grown on a conventional bulk sapphire substrate under similar growth conditions was also measured and shown as a dashed curve. The x-ray diffraction spectra demonstrate that the GaN grown on the intermediate substrate according to the embodiments of the invention is nearly stress free with calculated lattice constant very close to that of unstressed freestanding GaN material. Although the thin sapphire layer has residual defects from implantation and transfer damages, the growth of the high-quality GaN layer was not adversely affected. This result shows that growth of high-quality GaN can occur even on imperfect sapphire transferred films or sapphire surfaces with less than perfect crystallinity.

In certain embodiments, the intermediate substrates are used to produce high quality, freestanding GaN substrates. A thick (preferably thicker than 100 micron) GaN layer is grown using MOCVD and/or HVPE on the thin transferred layer of a material suitable for the growth of GaN comprising GaN, sapphire, silicon carbide, or silicon. Preferably, the handle substrate is TZM for this application. Once the GaN layer reaches the target thickness, the handle substrate may be removed by the methods described below, and a freestanding GaN substrate is created.

A thick GaN layer may be grown by HVPE. More preferably the thick GaN layer is formed by MOCVD followed by HVPE where a thin nucleation layer with low temperature buffer layer (preferably <2 microns total) is deposited by MOCVD followed by a thick layer deposited by HVPE. This preferred combination of MOCVD with HVPE allows uniform nucleation of GaN from MOCVD and much higher growth rate (generally 10-100 microns/hr and higher) from HVPE to economically produce high-quality freestanding GaN substrates. The growth conditions for MOCVD nucleation layer has been described earlier in this section. HVPE growth is typically carried out in a quartz reactor within a multi-zone furnace. The growth zone temperature is set between 1000 degrees Celsius to 1300 degrees Celsius and the Ga source boat between 700 degrees Celsius and 900 degrees Celsius. Gases of HCl and $NH_3$ flow over the Ga source to form GaCl and deposit GaN in the growth zone onto the intermediate substrate. The HVPE growth of GaN is well known in the art, see for example chapter 1 in "Wide Energy Bandgap Electronic Devices" by F. Ren and J. C. Zolper.

The freestanding GaN substrates produced with the intermediate substrate according to the embodiments of the invention offer several advantages over GaN substrates produced on conventional substrates such as sapphire. The CTE match of the intermediate substrate to GaN eliminates nearly all of the thermally-induced bowing, warping, and cracking problems that become more severe with larger diameter substrates. Necessity for high temperature laser-lift-off operation to minimize CTE-mismatch-induced cracking is also eliminated by utilizing the intermediate substrate.

Referring again to FIG. 2I, the handle substrate 20 and bonding layers 13, 21 may be removed by etching using conventional techniques such as wet chemical etching, plasma etching, reactive-ion etching, inductively-coupled plasma reactive ion etching and other techniques known in the art. For the preferred embodiment of handle substrate 20 comprising Mo or TZM, a mixture of chemical etchants comprised of $HNO_3$ and $NH_4F$ in $H_2O$, preferably $HNO_3$: $H_2O$:$NH_4F$ (126:60:5), can be applied to remove the handle substrate 20. The ratios of the three constituent chemicals of the etchant can be varied. If the handle substrate comprises polycrystalline AlN, suitable etchants include KOH, AZ400K photoresist developer, NaOH or other chemical solutions containing KOH or NaOH. Preferably, if the handle substrate is AlN, the etchant comprises KOH which is known to selectively etch AlN but does not etch W or Cu appreciably. More preferably for the case of an AlN handle substrate the etchant comprises an aqueous solution of KOH with a concentration between 20% and 70%. Optionally the etching solution for either AlN, or Mo or TZM handle substrates, can be heated to enhance the etch rate. Preferably the temperature of the etching solution is between 25 degrees Celsius and 150 degrees Celsius.

The handle substrate can be thinned prior to the chemical etch removal process, using conventional grinding methods as are known in the art, in order to reduce the amount of time required for the chemical etching of the remaining handle substrate material. Preferably for a TZM or P—AlN handle substrate, the handle substrate is ground to a thickness of between 20 microns and 150 microns. The grinding can be accomplished using a fixed abrasive diamond, diamond slurry, or alumina slurry, or any combination of these abrasives or others known to those skilled in the art.

In addition, the $SiO_2$ bonding layers 13, 21 can be removed by HF etching solutions without significantly etching the device structure or final substrate. If the bonding layer comprises AlN then KOH can be used to selectively remove the bonding layer. Optionally, the handle substrate can be ground to a smaller thickness prior to etching, in order to decrease the duration of the etching process required for complete removal of handle substrate. Preferably the final thickness of the handle substrate after grinding is between 25 microns and 150 microns. If desired, the bonding layer(s) may be removed as sacrificial release layers by selective etching to separate the handle substrate 20 from the rest of the device. This way, the handle substrate 20 can be reused if desired.

In the case where the thin transferred layer comprises sapphire, following the removal of the handle substrate 20 and bonding layer(s) 13, 21, it may be desirable to remove all or portions of the insulating thin sapphire layer 12 that was originally bonded and transferred to serve as an epitaxial template for the LED device. The selective removal of the thin sapphire layer can be accomplished in several ways comprising wet chemical etching, chemical mechanical polishing, dry etching with a halogen-containing plasma as known to those skilled in the art, or dry etch using a halogen-containing high-density plasma such as inductively-coupled plasma reactive ion etching (ICP RIE) process involving chlorine ($Cl_2$), boron trichloride ($BCl_3$), sulfur hexafluoride ($SF_6$), and/or carbon tetrafluoride ($CF_4$). It is preferable to use dry etch to selectively remove the thin transferred sapphire layer. It is more preferable to apply an etch chemistry such as $CF_4$ and/or other F-based chemistry in ICP RIE that has similar etch rates in sapphire and GaN in order to maintain surface smoothness and planarity after removal of the thin sapphire layer.

In an alternative second embodiment, rather than bonding a III-nitride semiconductor source wafer 10 to the handle substrate and then exfoliating a thin III-nitride semiconductor layer 12 from the semiconductor source wafer, a single-crystalline material which supports epitaxial growth of III-nitride semiconductor layers is bonded to the handle substrate. This single-crystal material comprises sapphire, silicon carbide, silicon, or any other suitable material which supports epitaxial growth of III-nitride semiconductor layers such as GaN, InGaN, AlGaN, etc. Thus, the GaN substrate 10 shown in FIG. 2A is substituted with a single-crystalline material comprising sapphire, SiC, silicon, or other ceramic materials.

A thin transferred layer 12 from a single-crystal material such as sapphire, may be formed on the handle substrate using an ion implantation-induced exfoliation from a bulk substrate, as shown in FIGS. 2A-2H, or using a substrate bond and etch-back process (i.e., etching and/or polishing away the single-crystalline material to leave only a thin layer of the single-crystalline material bonded to the handle substrate), or using a lateral etch of a weakened interface 11 generated by ion implantation. One or more III-nitride semiconductor layers 31-34, such as GaN, InGaN, etc., are then epitaxially grown over the thin layer 12 of single-crystalline material, such as sapphire, while this thin layer 12 is bonded to the handle substrate 20. Further processing of this alternative second embodiment is similar to the process steps already shown in the Figures and described above.

In this case, the handle substrate 20 would be comprised of a material that is better CTE matched to III-nitride semiconductors (i.e., GaN, etc.) than the single-crystalline source wafer, such as sapphire, and which may possess a higher thermal conductivity than sapphire. Because the thickness of the sapphire film would be small relative to the thickness of the handle substrate 20, the overall CTE of the completed intermediate substrate 15 would be closely matched to III-nitride semiconductor layers, such as GaN. For example, the CTE of the intermediate substrate comprising the handle substrate 20 covered with a thin layer 12 of the single-crystalline material, such as sapphire, would differ by 20% or less, such as 10% or less, from the CTE of the III-nitride semiconductor layer(s) 31-34.

In addition, assuming the handle substrate 20 could be easily removed, it will be easier to remove the remaining thin layer 12 after growth of a GaN device layer(s) 31-34 relative to the case where a bulk sapphire wafer was used. An intermediate substrate 15 comprising thin sapphire layer of the second embodiment would possess some of the advantages of the intermediate substrate comprising thin GaN layer of the first embodiment when compared to a conventional bulk sapphire substrate. Specifically, the better CTE match of the thin sapphire layer on handle substrate 20 to the III-nitride active layers as compared to a conventional bulk sapphire substrate would reduce the bowing and resultant thermal variation across the substrate during GaN growth. Optionally, silicon carbide or other ceramic materials could be used in the place of sapphire.

One additional benefit of this second embodiment relative to the first is that the source wafers for the second embodiment are available in larger sizes than the freestanding GaN of the first embodiment. Consequently, it may be possible to manufacture substrates with larger diameter according to the second embodiment than the first. In the case where the thin layer 12 is sapphire and the handle substrate 20 is an alloy of molybdenum, it is possible to manufacture 75, 100, 150 mm and larger substrates. Larger wafer sizes offer economy of scale and help device manufacturers to reduce their production costs per device.

It should be noted that the thin transferred single-crystalline layer may be mis-cut from the primary crystallographic orientation, for example (0001) for III-nitride growth. In the case where the thin transferred single-crystalline layer is sapphire, this mis-cut is typically between 0 degrees and 0.3 degrees. In the case where exfoliation or bond and etch back processes are used to transfer the thin single-crystalline layer on the handle substrate, the mis-cut in the thin transferred single-crystalline layer can be achieved by using a mis-cut source wafer. In cases where mis-cut source wafers are not readily available, it is possible to deposit a thin layer of material with a non-zero stopping power on the source wafer and then polish it so that its thickness varies across the surface of the wafer. In this case, the thickness variation is established so that the implanted ions reach planar but off axis depths in the source wafer so that a thin mis-cut layer can be transferred from the source wafer.

It is also possible to use non-standard crystallographic orientations of material as the source wafer for the thin single-crystalline layer. In the case where the material is sapphire, the source wafer may be of the R-plane variety. The resulting GaN growths on the intermediate substrate comprising thin single-crystalline layer from this substrate can produce non-polar GaN materials, according to techniques described by Li Dong-Sheng et al in 2004 Chinese Phys. Lett. 21 970-971 and other published results.

In another embodiment, the intermediate substrates are used to produce high quality, freestanding GaN substrates rather than active device layers. In one implementation of this embodiment, a thin single-crystalline layer of GaN is transferred from an existing freestanding GaN source wafer. A thick (preferably >50 micron, and more preferably >100 micron) GaN layer is then grown on the thin transferred single-crystalline layer using MOCVD or HVPE. Preferably, the handle substrate is TZM for this application. Once the GaN layer reaches the target thickness, the handle substrate is removed. By beginning the freestanding GaN growth process with a high quality, thin single-crystalline layer of GaN, it may be possible to reach higher levels of material quality than can be achieved through standard epitaxial approaches.

In another implementation of the above embodiment, a thin single-crystalline layer of a material suitable for the growth of GaN is bonded to a handle substrate. The thin single-crystalline layer comprises sapphire, silicon carbide, or silicon, but is preferably sapphire. The thin transferred single-crystalline layer then becomes the seed layer for the growth of a thick layer of GaN. In one implementation, this technique may be combined with lateral overgrowth techniques including, but not limited to, epitaxial lateral overgrowth and pendeoepitaxy, in order to generate higher quality GaN. Once a target thickness is reached, the handle substrate is easily removed by any of the processes mentioned previously. Once the handle substrate is removed, the thin single-crystalline layer is also removed through any of the associated processes mentioned previously. This approach has a number of advantages over existing techniques for producing freestanding III-nitride substrates via heteroepitaxy on sapphire substrates. In particular, in the case where the thin transferred single-crystalline layer is sapphire and the handle substrate is an alloy of molybdenum, the CTE match of the intermediate substrate to GaN is sufficiently close so as to enable the growth of thick GaN films without deleterious bowing and cracking even at large substrate sizes. As a result this technique enables the growth of larger freestanding III-nitride substrates than could be produced by heteroepitaxial growth on bulk sapphire substrates.

In another implementation, a thin single-crystalline layer of epitaxial GaN grown by heteroepitaxy is transferred onto a handle substrate. The epitaxial GaN may be grown on any substrate that is suitable for the growth of GaN, including, but not limited to, sapphire, silicon carbide, and silicon(111). The transferred single-crystalline layer then becomes the seed layer for the growth of a thick layer of GaN. Once a target thickness is reached, the handle substrate is easily removed and the thick layer of GaN becomes free standing. This approach has a number of advantages over existing techniques for producing freestanding substrates via heteroepitaxy on sapphire substrates. By transferring a thin GaN layer grown in a separate process, the nucleation and growth of a freestanding GaN substrate by HVPE or any other suitable method of thick epitaxy required in the fabrication of a freestanding GaN substrate will be improved by reducing the difficulty of nucleation and initiation of GaN growth by switching the growth from heteroepitaxy in the case of GaN on sapphire to homoepitaxy.

Figure 6A:
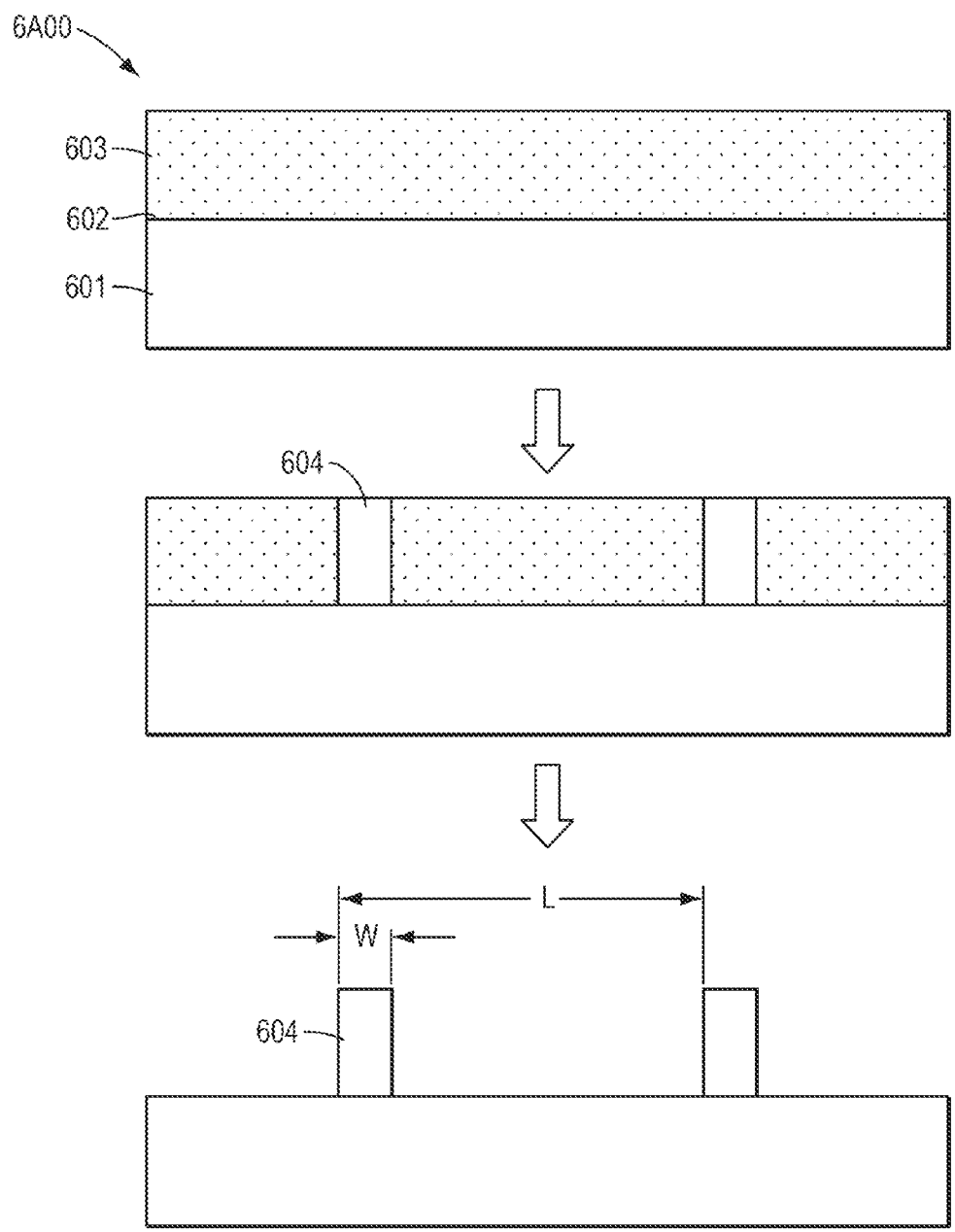
FIG. 6A is a simplified diagram illustrating a method of forming a photoresist pattern on a seed crystal or substrate according to an embodiment of the present disclosure.

In certain embodiments, the concentration of threading dislocations in a layer-transferred or MOCVD-, MBE- or HVPE-grown GaN layer is reduced considerably by lateral epitaxial overgrowth in an ammonothermal environment, which offers considerably reduced costs and improved scalability compared to other methods. FIGS. 6A, 6B, and 6C1-6C5 constitute a simplified diagram 6A00, 6B00, and 6C00 illustrating a method for forming a patterned, masked seed for ammonothermal lateral epitaxial overgrowth. Referring to FIG. 6A, a substrate 601 is provided. In certain embodiments, substrate 601 comprises an engineered or intermediate substrate as described above. Surface 602 of substrate 601 may comprise gallium nitride that has been grown by MOCVD, by MBE, by HVPE, or layer-transferred onto a substrate that is CTE-matched to GaN. A large-area surface 602 of substrate 601 may have a crystallographic orientation within 5 degrees, within 2 degrees, within 1 degree, or within 0.5 degree of (0001) +c-plane, (000-1) -c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3 ±1}, or {3 0 −3 ±4}. Surface 602 may have an (h k i l) semipolar orientation, where i=−(h+k) and l and at least one of h and k are nonzero. Surface 602 may have a maximum dimension between about 5 millimeters and about 12 inches and substrate 601 may have a thickness between about 10 micrometers and about 10 millimeters, or between about 100 micrometers and about 2 millimeters.

Surface 602 may have a surface threading dislocation density less than about $10^9$ cm$^{-2}$, less than about $10^8$ cm$^{-2}$, less than about $10^7$ cm$^{-2}$, less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. Surface 602 may have a stacking-fault concentration below about $10^6$ cm$^{-1}$, below about $10^5$ cm$^{-1}$, below about $10^4$ cm$^{-1}$, below about $10^3$ cm$^{-1}$, below about $10^2$ cm$^{-1}$, below about 10 cm$^{-1}$ or below about 1 cm$^{-1}$. Surface 602 may have a symmetric x-ray rocking curve full width at half maximum (FWHM) less than about 500 arc sec, less than about 300 arc sec, less than about 200 arc sec, less than about 100 arc sec, less than about 50 arc sec, less than about 35 arc sec, less than about 25 arc sec, or less than about 15 arc sec. Surface 602 may have a crystallographic radius of curvature greater than 0.1 meter, greater than 1 meter, greater than 10 meters, greater than 100 meters, or greater than 1000 meters, in at least one, at least two, or in three independent or orthogonal directions.

Surface 602 may comprise regions having a relatively high concentration of threading dislocations separated by regions having a relatively low concentration of threading dislocations. The concentration of threading dislocations in the relatively high concentration regions may be greater than about $10^5$ cm$^{-2}$, greater than about $10^6$ cm$^{-2}$, greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Substrate 101 may comprise regions having a relatively high electrical conductivity separated by regions having a relatively low electrical conductivity.

Surface 602 may have a crystallographic orientation within about 5 degrees of the (0001) Ga-face, c-plane orientation, may have an x-ray diffraction ω-scan rocking curve full-width-at-half-maximum (FWHM) less than about 200 arcsec less than about 100 arcsec, less than about 50 arcsec, or less than about 30 arcsec for the (002) and/or the (102) reflections and may have a dislocation density less than about $10^7$ cm$^{-2}$, less than about $10^6$ cm$^{-2}$, or less than about $10^5$ cm$^{-2}$. In some embodiments, the threading dislocations in surface 602 are approximately uniformly distributed. In other embodiments, the threading dislocations in surface 602 are arranged inhomogeneously as a one-dimensional array of rows of relatively high- and relatively low-concentration regions or as a two-dimensional array of high-dislocation-density regions within a matrix of low-dislocation-density regions. The crystallographic orientation of surface 602 may be constant to less than about 5 degrees, less than about 2 degrees, less than about 1 degree, less than about 0.5 degree, less than about 0.2 degree, less than about 0.1 degree, or less than about 0.05 degree.

Referring again to FIG. 6A, a photoresist layer 603 may be deposited on surface 602 by methods that are known in the art. For example, in a certain embodiment of a lift-off process, a liquid solution of a negative photoresist is first applied to surface 602. Substrate 601 is then spun at a high speed (for example, between 1000 to 6000 revolutions per minute for 30 to 60 seconds), resulting in a uniform photoresist layer (layer 603) on the surface of 602. Layer 603 may then be baked (for example, between about 90 and about 120 degrees Celsius) to remove excess photoresist solvent. After baking, the photoresist layer 603 may then be exposed to UV light through a photomask to form a pre-determined pattern of cross-linked photoresist. The patterned photoresist may comprise stripes or dots having characteristic width or diameter W and pitch L. Photoresist layer 603 may then be developed to remove non-cross linked material.

Figure 6B:
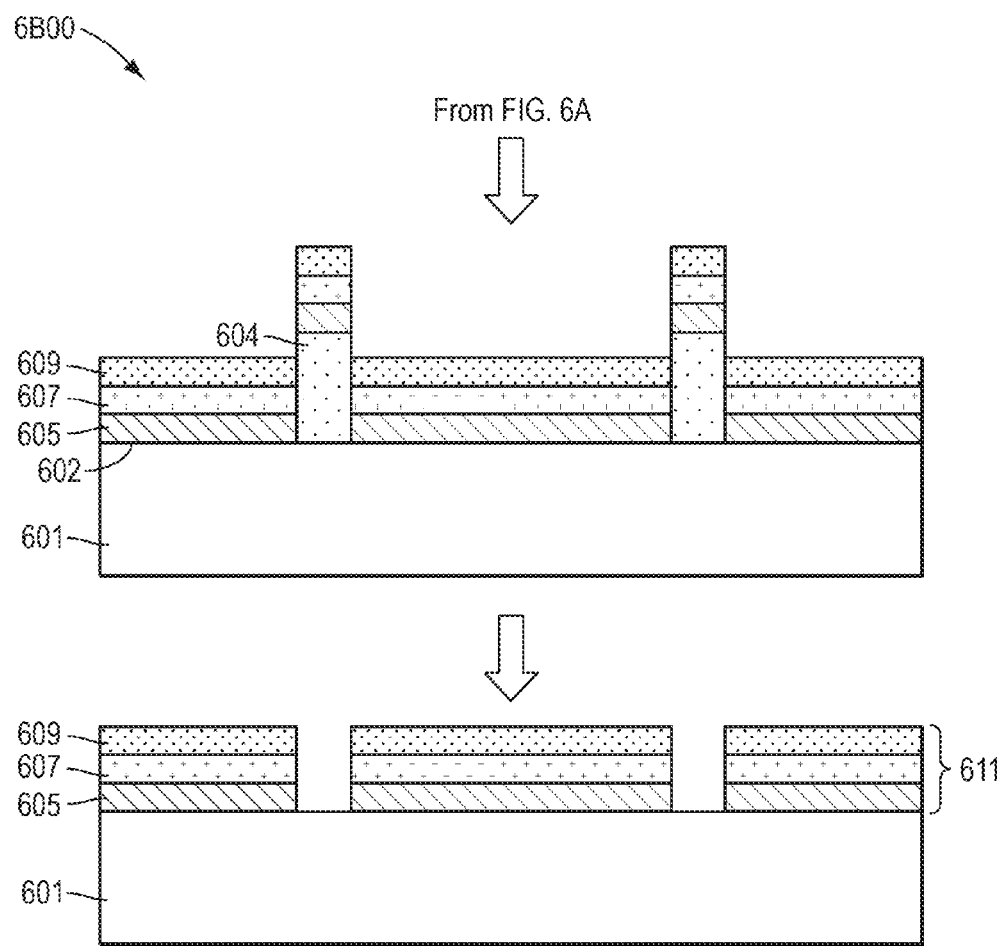
FIG. 6B is a simplified diagram illustrating a method of forming a patterned mask on a seed crystal or substrate according to an embodiment of the present disclosure.

Referring now to FIG. 6B, one or more mask layers may be deposited on surface 602 and patterned photoresist 603. An adhesion layer 605 may be deposited. Adhesion layer 605 may comprise one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$, or the like and may have a thickness between about 1 nanometer and about 1 micrometer. A diffusion-barrier layer 607 may be deposited. Diffusion-barrier layer 607 may comprise one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Mo, Nb, Re, Pd, Rh, Cr, or the like, and have a thickness between about 1 nanometer and about 10 micrometers. An inert layer 609 may be deposited. Inert layer 609 may comprise one or more of Au, Ag, Pt, Pd, Rh, Ru, Ir, Re, Ni, Cr, V, Ti, or Ta and may have a thickness between about 10 nanometers and about 100 micrometers. After deposition of the patterned masking layer(s) 611, the portion of the layer(s) residing above the patterned photoresist layer 603 (and therefore not in direct contact with the wafer) is then lifted off along with the photoresist layer 603 by methods that are known in the art.

Other methods besides the lift-off procedure described above may be used to form the pattern mask layer, including shadow masking, positive resist reactive ion etching, wet chemical etching, ion milling, and nanoimprint lithography, plus variations of the negative resist lift-off procedure described above.

In certain embodiments, patterned mask layer(s) are deposited on both the front and back surfaces of substrate 601. In certain embodiments, as shown schematically in FIG. 1D, the side and back-side surfaces of substrate 601 are coated with masking layers.

FIG. 6C1-6C5 shows a top view of some possible arrangements of the opening in patterned mask layer(s) 611. In certain embodiments, the openings in patterned mask layer(s) 611 comprise a one-dimensional (1D) array of openings. In certain embodiments, the openings in patterned mask layer(s) 611 comprise a two-dimensional (2D) array of openings. The openings may be round, square, rectangular, triangular, hexagonal, or the like, and may have an opening dimension or diameter W between about 1 micrometer and about 5 millimeters, or between about 10 micrometers and about 500 micrometers. The openings may be arranged in a hexagonal or square array with a pitch dimension L between about 5 micrometers and about 20 millimeters or between about 200 micrometers and about 5 millimeters. The openings may be arranged in a rectangular, parallelogram, hexagonal, or trapezoidal array, in which the pitch dimensions $L_1$ and $L_2$ in two orthogonal directions may be different from one another. The array of openings may also be linear or irregular. The openings in patterned mask layer(s) 611 may be placed in registry with the structure of substrate 601. For example, in certain embodiments, surface 602 is hexagonal, e.g., a (0001) or (000-1) crystallographic orientation, and the openings in patterned mask layer(s) 611 comprise a 2D hexagonal array such that the separations between nearest-neighbor openings are parallel to <11-20> or <10-10> directions in surface 602. In certain embodiments, surface 602 is nonpolar or semipolar and the openings in patterned mask layer(s) 611 comprise a 2D square or rectangular array such that the separations between nearest-neighbor openings are parallel to the projections of two of the c-axis, an m-axis, and an a-axis on surface 602. In certain embodiments, the pattern of openings is obliquely oriented with respect to the structure of substrate 601, for example, wherein the openings in patterned mask layer(s) 611 are rotated by between about 1 degree and about 44 degrees with respect to a high-symmetry axis of the substrate, such as a projection of the c-axis, an m-axis, or an a-axis on surface 602. In certain embodiments, the openings are substantially linear rather than substantially round. In certain embodiments, the openings comprise an array of slits with width W and period L that run across the entire length of substrate 601. In certain embodiments, the slits have a predetermined length $W_2$ that is less than the length of substrate 601, and may be arranged to define a length period $L_2$. Adjacent rows of slits may be offset in the lateral direction from one another rather than arranged directly adjacent, as shown in FIG. 6D1-6D2. In certain embodiments, the adjacent rows of slits may be offset in the longitudinal direction from one another. The slits may be oriented in more than one direction, as also shown in FIG. 6D1-6D2.

Substrate 601, possibly after application of a pattern as shown in FIGS. 6A-6D2, may then be suspended on a seed rack and placed in a sealable container, such as a capsule, an autoclave, or a liner within an autoclave. In certain embodiments, one or more pairs of patterned substrates are suspended back to back, with the patterned large area surfaces facing outward. A group III metal source, such as polycrystalline group III metal nitride, at least one mineralizer composition, and ammonia (or other nitrogen containing solvent) are then added to the sealable container and the sealable container is sealed. The mineralizer composition may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The sealable container may then be placed in a high pressure apparatus, such as an internally heated high pressure apparatus or an autoclave, and the high pressure apparatus sealed.

The sealable container, containing substrate 601, is then heated to a temperature above about 400 degrees Celsius and pressurized above about 50 megapascal to perform ammonothermal crystal growth. Further details are described in U.S. Patent Application Ser. No. 61/729,975, filed Nov. 26, 2012, which is hereby incorporated by reference in its entirety.

Figure 7A:
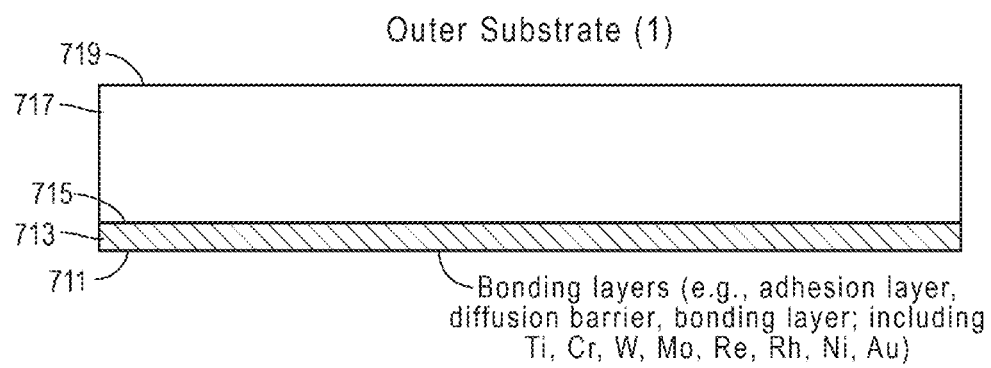
FIGS. 7A to 9 are simplified diagrams illustrating a method of forming an engineered substrate according to an embodiment of the present disclosure.
Figure 7B:
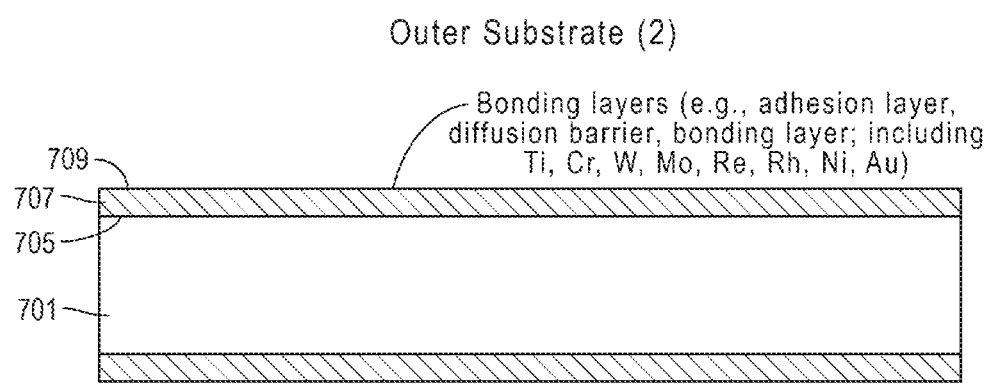

In another set of embodiments, a CTE-matched non-GaN substrate is fabricated as a composite layer structure. Referring to FIG. 7, several substrates may be coating with bonding layers on at least one surface for fabrication into a CTE-matched composite substrate. In certain embodiments, outer surface 719 of outer substrate 717 may have a GaN layer on it, and may also contain a patterned mask, as described above. A bonding layer 713 is deposited on the reverse face 715 of outer substrate 717. The bonding layer 713 can comprise at least one of Ti, Cr, W, Mo, Re, Rh, Ni, Cu, Ag, Au, $SiO_2$. In certain embodiments, the bonding layer 713 comprises a braze alloy (e.g., using a brazing process). In one specific embodiment, outer substrate 717 is chosen to be c-plane sapphire, for which recipes for formation of relatively-high quality GaN layers are well known in the art. In other embodiments, outer substrate 717 comprises Si(111), 6H—SiC(0001), 4H—SiC(0001), GaAs(111)A or GaAs(111)B. Similarly bonding layers 709 are deposited on both the front and back surfaces of inner substrate 701. In a specific embodiment, inner substrate 701 comprises c-plane 6H—SiC (silicon carbide). In another embodiment, inner substrate 701 comprises quartz glass. In still another embodiment, inner substrate 701 comprises molybdenum, a molybdenum-containing alloy, tantalum, a tantalum-containing alloy, tungsten, a tungsten-containing alloy, niobium, or a niobium-containing alloy.

Referring to the outer substrates as substrate 1 and the inner substrate as substrate 2, if the composite substrate is assumed to be under plane-strain conditions (i.e., infinite in the out-of-plane-of-paper dimension) then it will be CTE-matched to GaN if the thickness ratio is chosen to be $$\frac{h_2}{h_1} = 2\frac{E_1(1-v_2^2)}{E_2(1-v_1^2)}\frac{\alpha_{GaN}-\alpha_1}{\alpha_2-\alpha_{GaN}} \quad (1)$$

where $h_{1,2}$, $E_{1,2}$, $v_{1,2}$, and $\alpha_{1,2,GaN}$ are the thicknesses, Young's moduli, Poisson's ratios, and thermal expansion coefficients, respectively, of substrate 1, substrate 2, and GaN. However, in a real world situation where the composite is made of circular or rectangular plates then the optimum thickness ratio can be readily determined using finite-element analysis methods that are known in the art.

Figure 8:
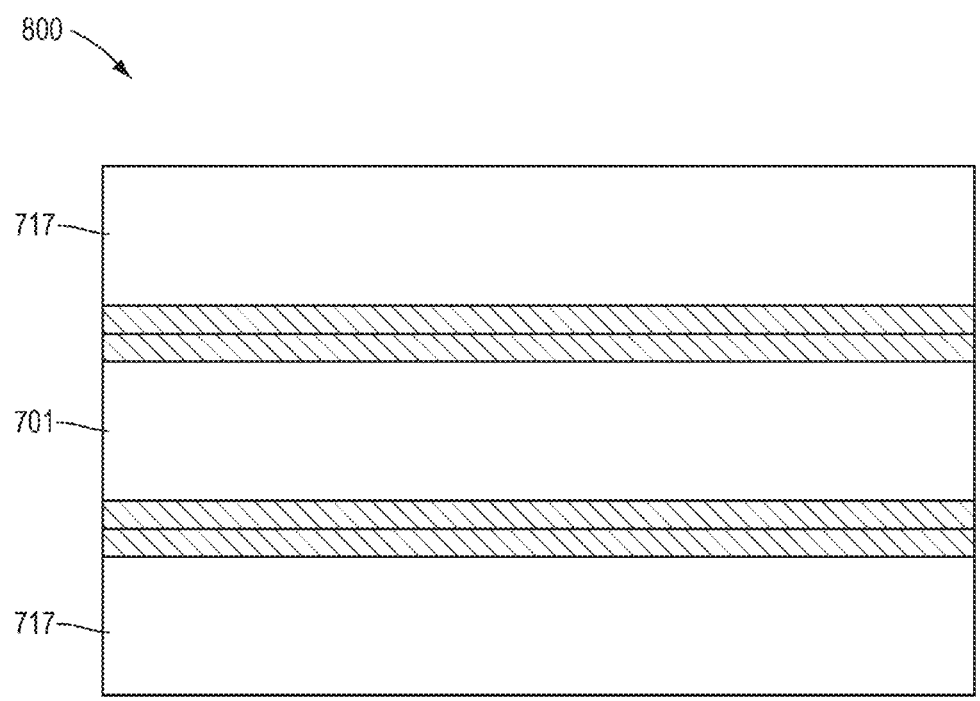

Referring to FIG. 8, the inner surfaces of two outer substrate are placed in contact with the outer surfaces of the inner substrate and wafer bonded, forming a composite substrate that is CTE-matched to GaN. In certain embodiments, a radius or chamfer is placed on the outer diameter of the composite substrate in order to reduce the stress near its periphery. A bevel, radius, or chamfer may be placed on one or more of outer substrate 717 and inner substrate 701.

Figure 9:
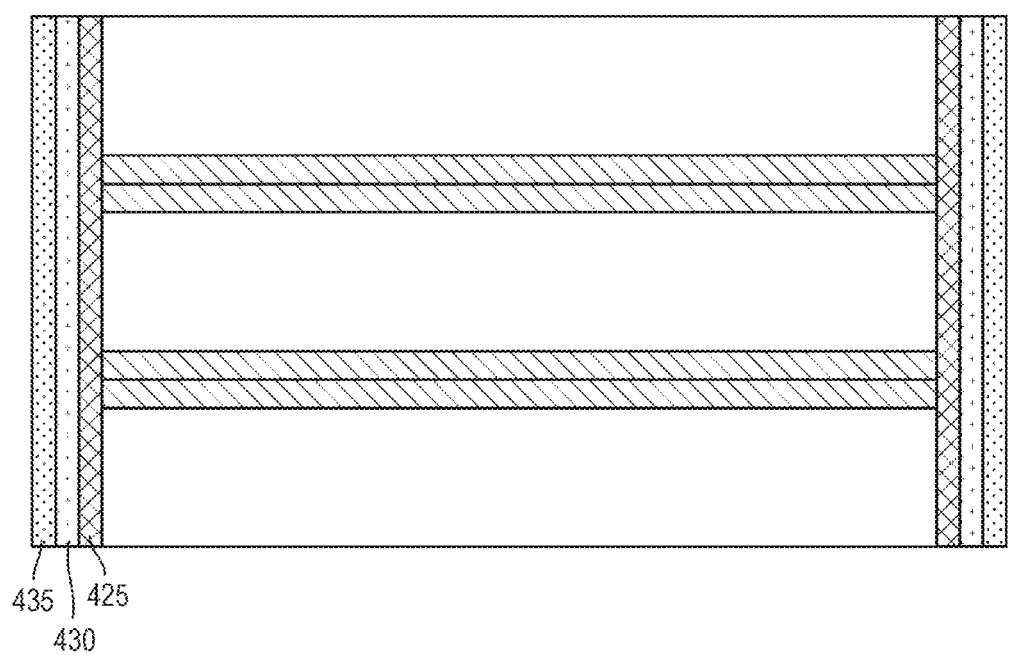

Referring to FIG. 9, an adhesion layer 425, a diffusion barrier layer 430, and an inert layer 435 may be deposited on the exposed surface of the handle substrate and of the bonding layers, so as to protect them from an ammonothermal crystal growth environment. In certain embodiments, the only materials exposed to the ammonothermal crystal growth environment are epitaxial GaN layers on each of the outward-facing surfaces of the composite substrate.

The engineered composite substrate of FIG. 9 or FIG. 1D, which may include a patterned mask on one (cf. FIG. 1D) or both (cf. FIG. 9) outward-oriented, large-area surfaces as shown in FIGS. 6B-6D2, may then be used as a seed crystal for ammonothermal crystal growth.

The engineered composite substrate may then be suspended on a seed rack and placed in a sealable container, such as a capsule, an autoclave, or a liner within an autoclave. In certain embodiments, one or more pairs of patterned substrates are suspended back to back, with the patterned large area surfaces facing outward. A group III metal source, such as polycrystalline group III metal nitride, at least one mineralizer composition, and ammonia (or other nitrogen containing solvent) are then added to the sealable container and the sealable container is sealed. The mineralizer composition may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The sealable container may then be placed in a high pressure apparatus, such as an internally heated high pressure apparatus or an autoclave, and the high pressure apparatus sealed.

After the ammonothermal reactor has been cooled and the grown crystal removed, the ammonothermal crystal comprising a non-GaN, CTE-matched substrate may be processed further to produce one or more ammonothermal GaN crystals or wafers. In certain embodiments, one or more ammonothermally-grown GaN crystals are separated from the non-GaN, CTE-matched substrate by sawing, for example, multi-wire sawing. In certain embodiments, the non-GaN, CTE-matched substrate is removed by perforating or removing one or more mask layers on the side or backside, as shown schematically in FIGS. 1D and 9, and wet-etching the non-GaN, CTE-matched substrate as described above.

After separating or removing one or more ammonothermally-grown GaN crystals from a non-GaN, CTE-matched substrate, the one or more ammonothermally-grown GaN crystals may be edge-ground, core-drilled, laser-trimmed, or the like, further sawed, lapped, polished, and/or chemical-mechanically polished, to form one or more ammonothermally-grown GaN wafers.

The large-area surfaces of the free-standing ammonothermal group III metal nitride boule or wafer may be characterized by a pattern of locally-approximately-linear arrays of threading dislocations that propagated from coalescence fronts formed during the epitaxial lateral overgrowth process. The pattern may be 2D hexagonal, square, rectangular, trapezoidal, triangular, 1D linear, or irregular. More complex patterns are also possible and may be advantageous, for example, in being more resistant to cracking or cleaving. The pattern may be elongated in one direction compared to another orthogonal direction, for example, due to the boule being sliced at an inclined angle relative to the large-area surface of a free-standing ammonothermal group III metal nitride boule. The pattern of locally-approximately-linear arrays of threading dislocations may be characterized by a pitch dimension L, or by pitch dimensions $L_1$ and $L_2$ in two orthogonal directions, between about 5 micrometers and about 20 millimeters or between about 200 micrometers and about 5 millimeters. In certain embodiments, the pattern of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of one or more of <1 0 –1 0>, <1 1 –2 0>, or [0 0 0 ±1] or their projections in the plane of the surface of the free-standing ammonothermal group III nitride boule or wafer. The linear concentration of threading dislocations in the pattern may be less than about $1 \times 10^5$ $cm^{-1}$, less than about $3 \times 10^4$ $cm^{-1}$, less than about $1 \times 10^4$ $cm^{-1}$, less than about $3 \times 10^3$ $cm^{-1}$, less than about $1 \times 10^3$ $cm^{-1}$, less than about $3 \times 10^2$ $cm^{-1}$, or less than about $1 \times 10^2$ $cm^{-1}$. The linear concentration of threading dislocations in the pattern may be greater than 5 $cm^{-1}$, greater than 10 $cm^{-1}$, greater than 20 $cm^{-1}$, greater than 50 $cm^{-1}$, greater than 100 $cm^{-1}$, greater than 200 $cm^{-1}$, or greater than 500 $cm^{-1}$.

The concentration of threading dislocations in the regions between the locally-approximately-linear arrays of threading dislocations may be below about $10^5$ $cm^{-2}$, below about $10^4$ $cm^{-2}$, below about $10^3$ $cm^{-2}$, below about $10^2$ $cm^{-1}$, or below about 10 $cm^{-2}$. The concentration of threading dislocation, averaged over a large area surface of the free-standing ammonothermal group III nitride boule or wafer, may be below about $10^7$ $cm^{-2}$, below about $10^6$ $cm^{-2}$, below about $10^5$ $cm^{-2}$, below about $10^4$ $cm^{-2}$, below about $10^3$ $cm^{-2}$, or below about $10^2$ $cm^{-1}$. The concentration of stacking faults, averaged over a large area surface of the free-standing ammonothermal group III nitride boule or wafer, may be below about $10^3$ $cm^{-1}$, below about $10^2$ $cm^{-1}$, below about 10 $cm^{-1}$, below about 1 $cm^{-1}$, or below about 0.1 $cm^{-1}$, or may be undetectable.

The free-standing ammonothermal group III metal nitride boule or wafer may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001)+c-plane, (000-1) –c-plane, {10-10} m-plane, {1 1 –2 0} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 –1 ±2}, {1

0 −1 ±3}, {2 1 −3 ±1}, or {3 0 −3 ±4}. The free-standing ammonothermal group III metal nitride boule or wafer may have an (h k i l) semipolar large-area surface orientation, where i=−(h+k) and l and at least one of h and k are nonzero.

In certain embodiments, a large-area surface of a free-standing ammonothermal group III metal nitride crystal or wafer has a crystallographic orientation that is miscut from {10-10} m-plane by between about −60 degrees and about +60 degrees toward [0001] +c-direction and by up to about 10 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about −30 degrees and about +30 degrees toward [0001] +c-direction and by up to about 5 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about −5 degrees and about +5 degrees toward [0001] +c-direction and by up to about 1 degree toward an orthogonal <1-210> a-direction. The free-standing ammonothermal group III metal nitride crystal or wafer may have a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$ on one or both of the two large area surfaces.

The free-standing ammonothermal group III metal nitride boule or wafer may have a symmetric x-ray rocking curve full width at half maximum (FWHM) less than about 200 arc sec, less than about 100 arc sec, less than about 50 arc sec, less than about 35 arc sec, less than about 25 arc sec, or less than about 15 arc sec. The free-standing ammonothermal group III metal nitride boule or wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the free-standing ammonothermal group III metal nitride boule or wafer has atomic impurity concentrations of at least one of oxygen (O), and hydrogen (H) above about $1\times10^{16}$ cm$^{-3}$, above about $1\times10^{17}$ cm$^{-3}$, or above about $1\times10^{18}$ cm$^{-3}$. In certain embodiments, a ratio of the atomic impurity concentration of H to the atomic impurity concentration of O is between about 1.1 and about 1000, or between about 5 and about 100. In certain embodiments, at least one surface of the free-standing ammonothermal group III metal nitride boule or wafer has impurity concentrations of at least one of lithium (Li), sodium (Na), potassium (K), fluorine (F), chlorine (Cl), bromine (Br), or iodine (I) above about $1\times10^{15}$ cm$^{-3}$, above about $1\times10^{16}$ cm$^{-3}$, or above about $1\times10^{17}$ cm$^{-3}$, above about $1\times10^{18}$ cm$^{-3}$. In certain embodiments, the top and bottom surfaces of the free-standing ammonothermal group III metal nitride boule or wafer may have impurity concentrations of O, H, carbon (C), Na, and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, the top and bottom surfaces of the free-standing ammonothermal group III metal nitride boule or wafer may have impurity concentrations of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, the top and bottom surfaces of the free-standing ammonothermal group III metal nitride boule or wafer may have impurity concentrations of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS). In some embodiments, the top and bottom surfaces of the free-standing ammonothermal group III metal nitride boule or wafer may have impurity concentrations of H between about $5\times10^{17}$ cm$^{-3}$ and $1\times10^{19}$ cm$^{-3}$, as quantified by calibrated secondary ion mass spectrometry (SIMS). In certain embodiments, at least one surface of the free-standing ammonothermal group III metal nitride boule or wafer has an impurity concentration of copper (Cu), manganese (Mn), and iron (Fe) between about $1\times10^{16}$ cm$^{-3}$ and $1\times10^{19}$ cm$^{-3}$. In a specific embodiment, the free-standing ammonothermal group III metal nitride boule or wafer has an infrared absorption peak at about 3175 cm$^{-1}$, with an absorbance per unit thickness of greater than about 0.01 cm$^{-1}$.

The free-standing ammonothermal group III metal nitride crystal or wafer may be characterized by a wurtzite structure substantially free from any cubic entities or other crystal structures, the other structures being less than about 0.1% in volume in reference to the substantially wurtzite structure.

A free-standing ammonothermal group III metal nitride wafer may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the free-standing ammonothermal group III metal nitride wafer may have a concentration of macro defects, with a diameter or characteristic dimension greater than about 100 micrometers, of less than about 2 cm$^{-2}$, less than about 1 cm$^{-2}$, less than about 0.5 cm$^{-2}$, less than about 0.25 cm$^{-2}$, or less than about 0.1 cm$^{-2}$. The variation in miscut angle across a large-area surface of the free-standing ammonothermal group III metal nitride wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing ammonothermal group III metal nitride wafer, as measured over an area of at least 10 μm×10 μm, may be less than about 0.5 nanometer, less than about 0.2 nanometer, less than about 0.15 nanometer, less than about 0.1 nanometer, or less than about 0.10 nanometer. The free-standing ammonothermal group III metal nitride wafer may be characterized by n-type electrical conductivity, with a carrier concentration between about $1\times10^{17}$ cm$^{-3}$ and about $3\times10^{19}$ cm$^{-3}$ and a carrier mobility greater than about 100 cm$^2$/V-s. In alternative embodiments, the free-standing ammonothermal group III metal nitride wafer is characterized by p-type electrical conductivity, with a carrier concentration between about $1\times10^{15}$ cm$^{-3}$ and about $1\times10^{19}$ cm$^{-3}$. In still other embodiments, the free-standing ammonothermal group III metal nitride wafer is characterized by semi-insulating electrical behavior, with a room-temperature resistivity greater than about $10^7$ ohm-centimeter, greater than about $10^8$ ohm-centimeter, greater than about $10^9$ ohm-centimeter, greater than about $10^{10}$ ohm-centimeter, or greater than about $10^{11}$ ohm-centimeter. In certain embodiments, the free-standing ammonothermal group III metal nitride wafer is highly transparent, with an optical absorption coefficient at a wavelength of 400 nanometers that is less than about 10 $cm^{-1}$, less than about 5 $cm^{-1}$, less than about 2 $cm^{-1}$, less than about 1 $cm^{-1}$, less than about 0.5 $cm^{-1}$, less than about 0.2 $cm^{-1}$, or less than about 0.1 $cm^{-1}$.

In some embodiments, the free-standing ammonothermal group III metal nitride crystal or wafer is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, lapped, polished, etched, and/or chemically-mechanically polished into wafers by methods that are known in the art. The surface of the wafers may be characterized by a root-mean-square surface roughness measured over a 10-micrometer by 10-micrometer area that is less than about 1 nanometer or less than about 0.2 nanometer.

The wafer may be incorporated into a semiconductor structure. The semiconductor structure may comprise at least one $Al_xIn_yGa_{(1-x-y)}N$ epitaxial layer, where $0 \leq x$, y, $x+y \leq 1$. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ $cm^{-2}$, a substantial fraction of $0.1 \times 0.1$ $mm^2$ devices could be expected to be free of dislocations. At a dislocation density of $10^2$ $cm^{-2}$, a substantial fraction of $1 \times 1$ $mm^2$ devices could be expected to be free of dislocations. The gallium-nitride-based electronic or optoelectronic device may be entirely free of stacking faults throughout its volume. For example, at a stacking fault density of 1 $cm^{-1}$, a substantial fraction of $10 \times 1$ $mm^2$ stripe-shaped devices, such as laser diodes with nonpolar or semipolar large area surfaces and c-plane facets, could be expected to be free of stacking faults.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

Example 1

Two 100 mm diameter, 400-micrometer thick 6H—SiC (0001) wafers are provided for use as outer substrates. The front (or top) surface of each of the SiC wafers is coated with an epitaxial layer of GaN approximately 0.5 micrometer thick by metalorganic chemical vapor deposition (MOCVD) methods that are known in the art. Using nLOF2020 as a photoresist, a pattern comprising linear arrays of 20-micrometer-wide by the width of the substrate, with a pitch diameter of 1020 micrometers is defined on the epitaxial GaN layers. A 100-nanometer-thick layer of TiW is deposited as an adhesion layer, followed by a 780-nanometer-thick inert layer comprising Au. A lift-off process is performed and the residual photoresist is removed to obtain a patterned substrate. The mask pattern comprises domains of m-stripes, with linear openings oriented approximately parallel to the <10-10> direction on each of the epitaxial GaN layers.

A tantalum disk, 100 mm diameter, 3.15 millimeters thick, is provided for use as an inner substrate. Coatings, comprising titanium with a thickness of about 100 nanometers, and gold, with a thickness of about 800 nanometers, are sputter-deposited on the two back-side (inner) surfaces of the SiC wafers and on both front and back-side surfaces of the Ta disk. A radius is ground onto the periphery of a stack comprising a first SiC outer substrate, the Ta inner substrate, and a second SiC outer substrate, having a radius of curvature of approximately 1.975 millimeters, where the epitaxial GaN layers are positioned on the outward-facing surfaces of the SiC outer substrates. Two braze pre-forms, comprising disks of silver-copper eutectic composition (72%-Ag/28%-Cu) 50 micrometers thick, are placed between the Ta inner substrate and the SiC outer substrates, facing the Ti/Au coatings.

The GaN/SiC/braze/Ta/braze/SiC/GaN stack is placed in a furnace and heated to a temperature of approximately 825 degrees Celsius in an atmosphere comprising 5% ammonia in argon, held at temperature for approximately 20 minutes, and cooled back to room temperature. The GaN/SiC/braze/Ta/braze/SiC/GaN stack is now a solid composite.

Figure 10A:
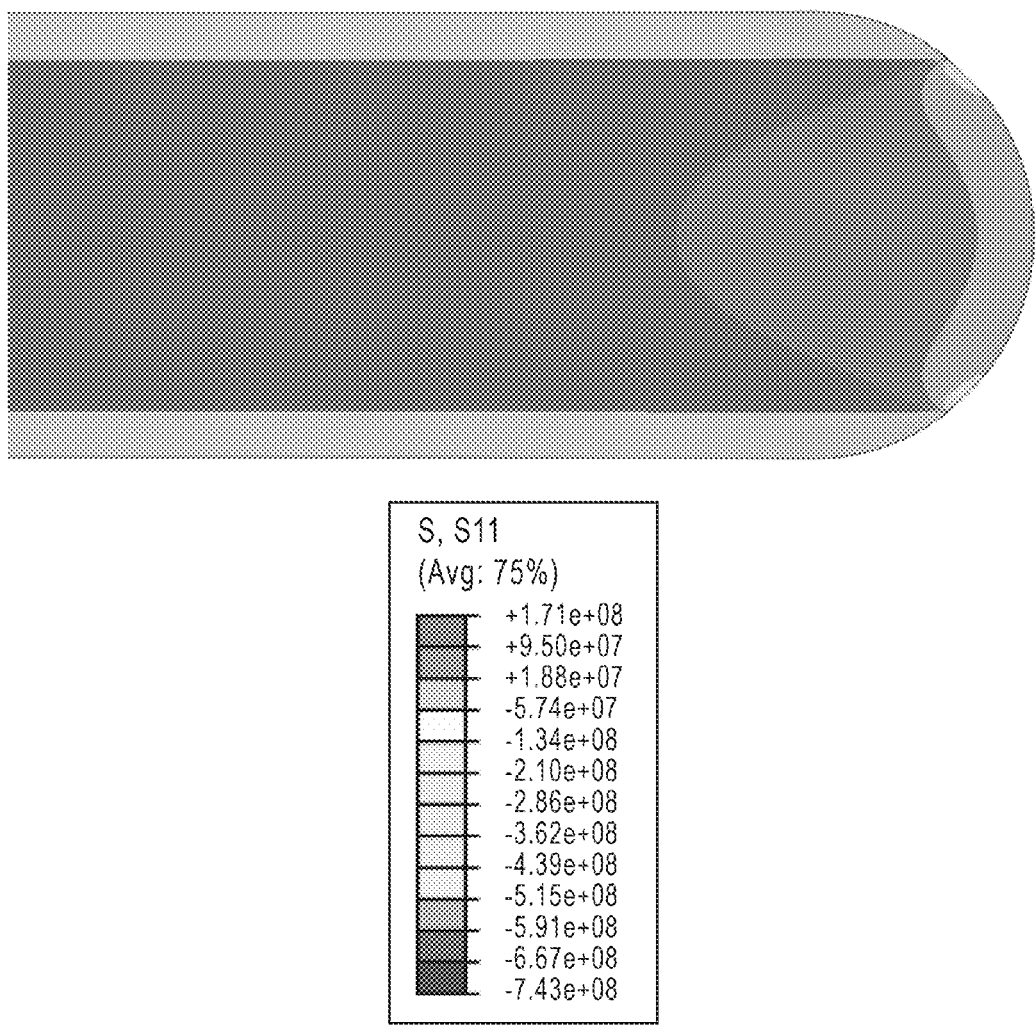
FIGS. 10A-10C show calculated stresses in an engineered substrate according to embodiments of the present disclosure.
Figure 10B:
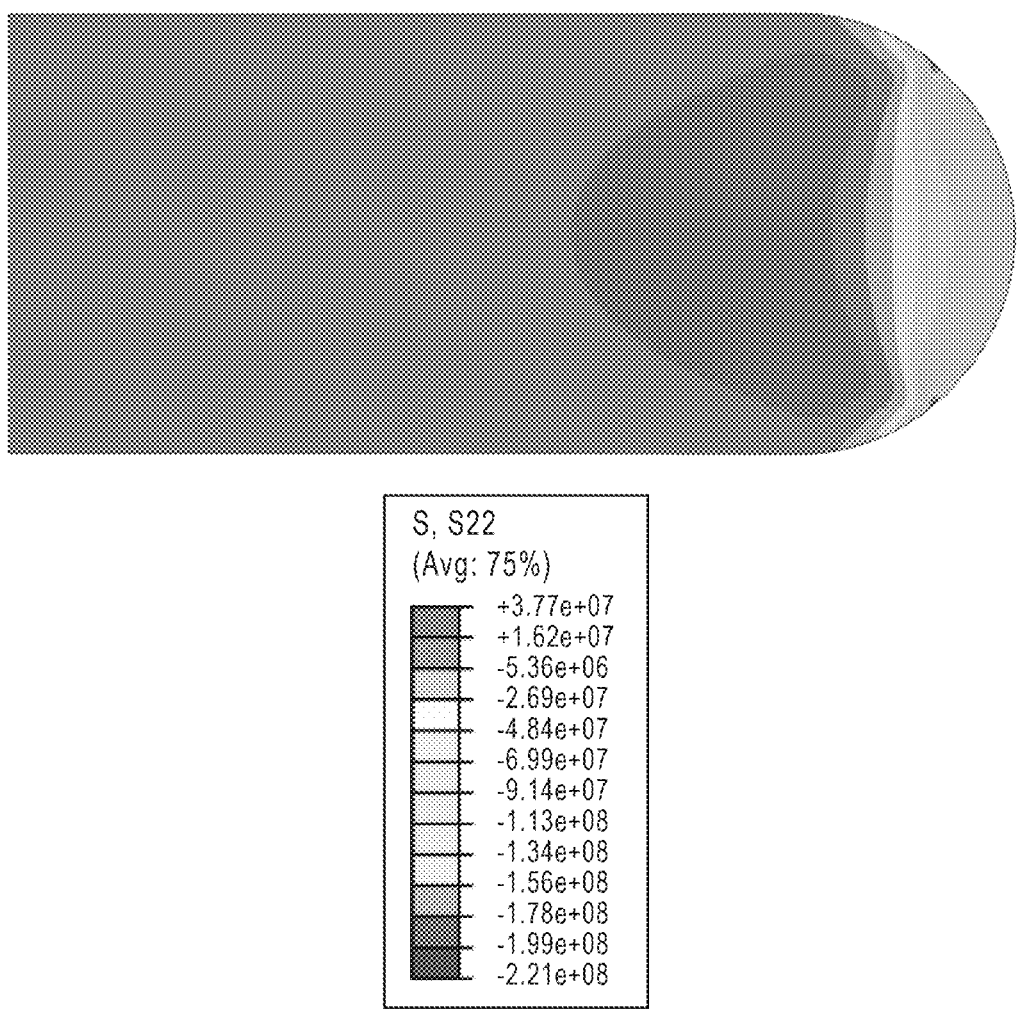
Figure 10C:
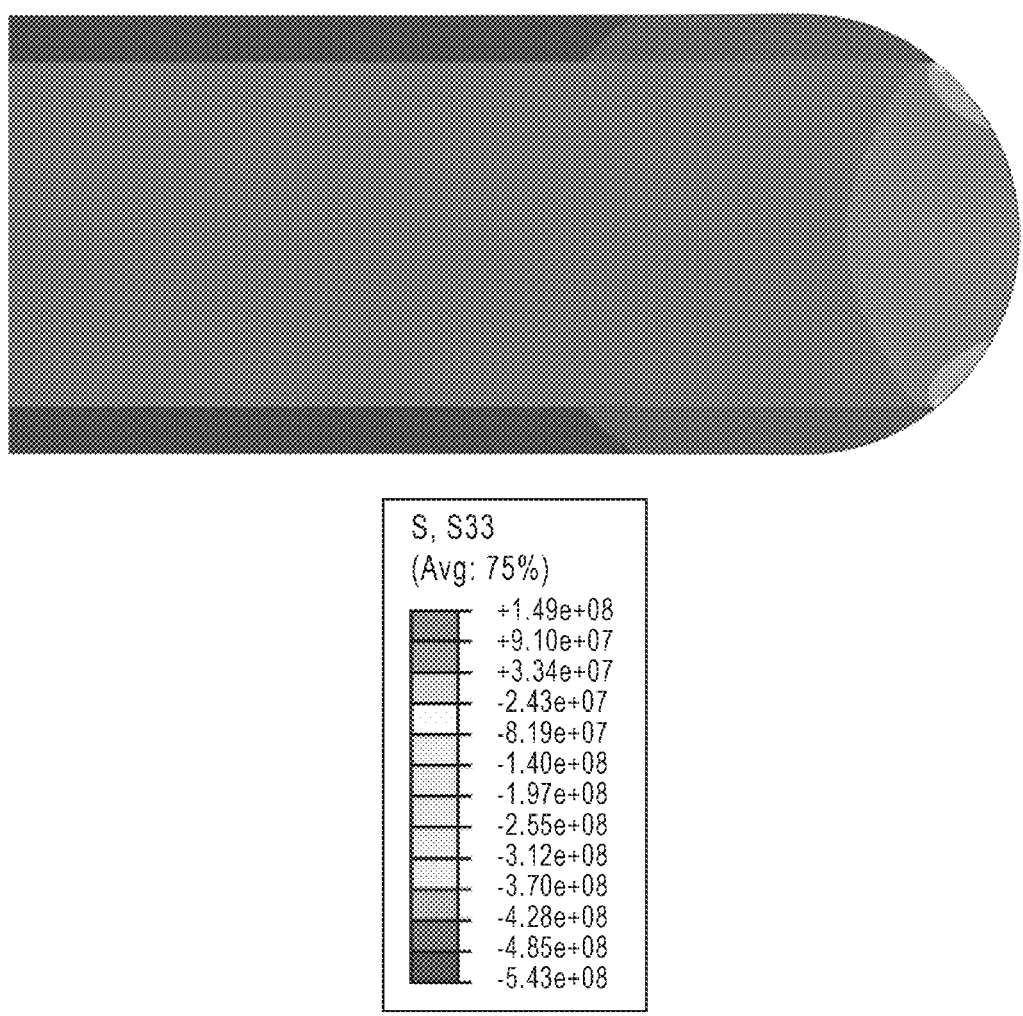

A finite element calculation is performed to assess the stress distribution the brazed composite stack. In the calculation, the stack is assumed to be unstressed while the temperature is above the Ag/Cu eutectic melting temperature of 778 degrees Celsius and the braze is assumed to plastically deform, generating no stress, upon cooling to a temperature of 725 degrees Celsius. As the stack is cooled below 725 degrees Celsius to 25 degrees Celsius the braze is assumed to be rigid, causing a buildup of stress due to the mismatch in thermal expansion coefficients of Ta and SiC (the GaN and braze layers are ignored in this calculation because they are much thinner than the SiC wafers or Ta disk). The calculated radial (S11), axial (S22), and hoop (S33) stresses are shown in FIGS. 10A-10C. Most of the Ta disk is in tension in both radial and hoop directions, with a maximum principal stress of 210 MPa, well below 250 MPa. With suitable fabrication conditions the yield strength of the Ta disk is about 270 MPa, well above the maximum principal stress, so yielding does not occur. Virtually the entire volume of the SiC wafers is in compression and neither cracking nor yielding occurs. The coefficient of thermal expansion of the composite, in the lateral, or "a" direction, is calculated to be $6.185 \times 10^{-6}$/K, that is, within about 2% of that of GaN in the a-direction, averaged over a temperature range of 25 and 700 degrees Celsius. Agreement with the CTE of bulk GaN could be made essentially exact by fine-tuning the thickness of the Ta inner substrate. Uncertainty in the precise temperature at which the braze joint between the Ta inner substrate and the SiC outer substrates provides some uncertainty in the precise stress state in the composite substrate but should not significantly affect the CTE.

The side surfaces of the GaN/SiC/braze/Ta/braze/SiC/GaN composite are then sputter-deposited with a 100 nm layer of TiW, followed by a 780 nm layer of Au, so that the only exposed non-Au surfaces are the openings in the mask layers on the epitaxial GaN layers on the outer surfaces of the SiC wafers.

The patterned composite substrate is placed in a silver capsule along with a 13.4%-open-area baffle, polycrystalline GaN nutrient, $NH_4F$ mineralizer, and ammonia, and the capsule is sealed. The ratios of GaN nutrient and $NH_4F$ mineralizer to ammonia are approximately 0.96 and 0.048, respectively, by weight. The capsule is placed in an internally-heated high pressure apparatus and heated to a temperature of approximately 650 degrees Celsius for the upper, nutrient zone and approximately 690 degrees Celsius for the lower, crystal growth zone, maintained at these temperatures for approximately 232 hours, and then cooled and removed.

Ammonothermal GaN grows through the linear openings in the patterned mask on the CTE-matched composite substrate, grows laterally, and coalesces fully, forming ammonothermal GaN layers approximately 1160 micrometers thick with a smooth top surface on each of the outward-facing surfaces. Free-standing GaN wafers are then obtained by wire-sawing the outermost 500 microns of crystalline GaN material from the CTE-matched composite substrate.

While the above is a full description of the specific embodiments, various modifications, alternative constructions and equivalents may be used. Therefore, the above description and illustrations should not be taken as limiting the scope of the present disclosure which is defined by the appended claims.

What is claimed:

1. A method for forming a free-standing ammonothermal group III metal nitride crystal, comprising:
   providing a non-gallium-nitride substrate having a coefficient of thermal expansion approximately equal to that of gallium nitride, with a value in a range of $4-8 \times 10^{-6}$/K, averaged between room temperature and 700 degrees Celsius;
   providing a crystalline gallium-containing nitride layer overlying the substrate;
   depositing a diffusion barrier layer and an inert layer overlying at least some side surfaces of the substrate and the diffusion barrier layer, the diffusion barrier layer comprising at least one of W, TiW, Ta, Mo, and Re, and the inert layer comprising at least one of Au, Ag, Pt, Pd, Rh, Ru, Ir, Re, Ni, Cr, V, Ti, and Ta;
   placing the substrate, a group III metal source, at least one mineralizer composition, and a nitrogen containing solvent within a sealable container; and
   forming an ammonothermal group III metal nitride crystal on the crystalline gallium-containing nitride layer by heating the sealable container to a temperature of at least about 400 degrees Celsius.

2. The method of claim 1, wherein providing the crystalline gallium-containing nitride layer comprises using a layer transfer process.

3. The method of claim 1, wherein providing the crystalline gallium-containing nitride layer comprises using epitaxial deposition.

4. The method of claim 1, wherein the non-gallium-nitride substrate comprises molybdenum.

5. The method of claim 1, wherein the non-gallium-nitride substrate comprises polycrystalline aluminum nitride.

6. The method of claim 1, wherein the non-gallium-nitride substrate comprises two outer substrates overlying an inner substrate and bonded by bonding layers forming a composite layer structure.

7. The method of claim 6, wherein the two outer substrates comprise silicon carbide and the at least one inner substrate comprises tantalum.

8. The method of claim 6, wherein the composite layer structure is brazed.

9. The method of claim 6, wherein a maximum principal stress in the composite layer structure is less than about 250 MPa.

10. The method of claim 1, further comprising depositing at least one patterned mask layer on the crystalline gallium-containing nitride layer to form a patterned substrate, wherein the patterned mask layer:
    comprises one or more of an adhesion layer, and an inert layer;
    comprises one or more of Au, Ag, Pt, Pd, Rh, Ru, Ir, Ni, Cr, V, Ti, or Ta;
    is characterized by a thickness between about 10 nanometers and about 100 micrometers; and
    comprises a one-dimensional or two-dimensional array of openings, wherein the openings are characterized by an opening dimension between about 1 micrometer and about 5 millimeters and a pitch dimension between about 5 micrometers and about 20 millimeters.

11. The method of claim 10, wherein the patterned mask layer comprises a one-dimensional or two-dimensional array of openings, wherein the openings are characterized by an opening dimension between about 10 micrometers and about 500 micrometers and a pitch dimension between about 200 micrometers and about 5 millimeters.

12. The method of claim 1, further comprising removing the ammonothermally-grown group III metal nitride crystal from the substrate and processing the ammonothermally-grown group III metal nitride crystal to form a free-standing, ammonothermally-grown group III metal nitride crystal.

13. The method of claim 12, further comprising incorporating the free-standing ammonothermal group III metal nitride crystal into a semiconductor structure, the semiconductor structure comprising at least one $Al_xIn_yGa_{(1-x-y)}N$ epitaxial layer, where $0 \leq x, y, x+y \leq 1$.

14. The method of claim 13, further comprising incorporating the semiconductor structure into an electronic device or an optoelectronic device selected from a light emitting diode, a laser diode, a photodetector, an avalanche photodiode, a photovoltaic, a solar cell, a cell for photoelectrochemical splitting of water, a transistor, a rectifier, a thyristor, a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and a combination of any of the foregoing.

15. The method of claim 1, wherein the non-gallium-nitride substrate his characterized by a coefficient of thermal expansion approximately equal to that of gallium nitride, with a value in a range of $5$-$7 \times 10^{-6}$/K, averaged between room temperature and 700 degrees Celsius.

16. The method of claim 1, wherein the non-gallium-nitride substrate is characterized by a coefficient of thermal expansion approximately equal to that of gallium nitride, with a value in a range of $5.5$-$6.5 \times 10^{-6}$/K, averaged between room temperature and 700 degrees Celsius.

17. The method of claim 1, further comprising depositing an adhesion layer overlying at least the side surfaces of the substrate and underlying the diffusion barrier layer, the adhesion layer comprising at least one of Ti and Cr.

18. The method of claim 1, wherein the ammonothermal group III metal nitride layer formed on the substrate is characterized by a thickness of at least 500 micrometers.

19. A method for forming a free-standing ammonothermal group III metal nitride crystal, comprising:
   providing a non-gallium-nitride substrate characterized by a coefficient of thermal expansion approximately equal to that of gallium nitride, with a value in a range of $5.5$-$6.5 \times 10^{-6}$/K, averaged between room temperature and 700 degrees Celsius;
   providing a crystalline gallium-containing nitride layer overlying the substrate;
   depositing at least one patterned mask layer on the crystalline gallium-containing nitride layer to form a patterned substrate, wherein the patterned mask layer:
      comprises one or more of an adhesion layer, a diffusion-barrier layer, and an inert layer;
      comprises one or more of Au, Ag, Pt, Pd, Rh, Ru, Ir, Ni, Cr, V, Ti, or Ta;
      is characterized by a thickness between about 10 nanometers and about 100 micrometers; and
      comprises a one-dimensional or two-dimensional array of openings, wherein the openings are characterized by an opening dimension between about 1 micrometer and about 5 millimeters and a pitch dimension between about 5 micrometers and about 20 millimeters;
   depositing an inert layer overlying at least some side surfaces of the substrate, wherein the inert layer comprises at least one of Au, Ag, Pt, Pd, Rh, Ru, Ir, Re, Ni, Cr, V, Ti, and Ta;
   placing the substrate, a group III metal source, at least one mineralizer composition, and a nitrogen containing solvent within a sealable container;
   forming an ammonothermal group III metal nitride crystal characterized by a thickness of at least 500 micrometers by heating the sealable container to a temperature of at least about 400 degrees Celsius; and
   removing an ammonothermally-grown group III metal nitride crystal from the substrate and processing ammonothermally-grown group III metal nitride crystal to form a free-standing, ammonothermally-grown group III metal nitride crystal.

20. A method for forming a free-standing ammonothermal group III metal nitride crystal, comprising:
   providing a non-gallium-nitride substrate characterized by a coefficient of thermal expansion approximately equal to that of gallium nitride, with a value in a range of $5.5$-$6.5 \times 10^{-6}$/K, averaged between room temperature and 700 degrees Celsius, wherein the non-gallium-nitride substrate comprises a composite layer structure comprising a first large-area surface and a second large-area surface on an opposite side of the substrate from the first large-area surface;
   providing a crystalline gallium-containing nitride layer overlying each of the first large-area surface and the second large-area surface;
   depositing at least one patterned mask layer on each of the crystalline gallium-containing nitride layers to form a patterned substrate, wherein the patterned mask layer:
      comprises one or more of an adhesion layer, a diffusion-barrier layer, and an inert layer;
      comprises one or more of Au, Ag, Pt, Pd, Rh, Ru, Ir, Ni, Cr, V, Ti, or Ta;
      is characterized by a thickness between about 10 nanometers and about 100 micrometers; and
      comprises a one-dimensional or two-dimensional array of openings, wherein the openings are characterized by an opening dimension between about 1 micrometer and about 5 millimeters and a pitch dimension between about 5 micrometers and about 20 millimeters;
   depositing an inert layer overlying at least some side surfaces of the substrate, wherein the inert layer comprises at least one of Au, Ag, Pt, Pd, Rh, Ru, Ir, Re, Ni, Cr, V, Ti, and Ta;
   placing the substrate, a group III metal source, at least one mineralizer composition, and a nitrogen containing solvent within a sealable container;
   forming an ammonothermal group III metal nitride crystal characterized by a thickness of at least 500 micrometers by heating the sealable container to a temperature of at least about 400 degrees Celsius; and
   removing the ammonothermally-grown group III metal nitride crystal from the substrate and processing the ammonothermally-grown group III metal nitride crystal to form a free-standing, ammonothermally-grown group III metal nitride crystal.

* * * * *